(12) United States Patent
Fujita et al.

(10) Patent No.: US 9,159,932 B2
(45) Date of Patent: *Oct. 13, 2015

(54) LIGHT EMITTING ELEMENT, LIGHT EMITTING DEVICE, AND ELECTRONIC DEVICE

(75) Inventors: Tetsuji Fujita, Chino (JP); Shunichi Seki, Suwa (JP); Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 344 days.

This patent is subject to a terminal disclaimer.

(21) Appl. No.: 13/564,384

(22) Filed: Aug. 1, 2012

(65) Prior Publication Data

US 2013/0037785 A1    Feb. 14, 2013

(30) Foreign Application Priority Data

Aug. 9, 2011   (JP) .................................. 2011-173659

(51) Int. Cl.
*H01L 51/54*    (2006.01)
*H01L 51/00*    (2006.01)
*C09K 11/06*    (2006.01)
*H01L 51/50*    (2006.01)

(52) U.S. Cl.
CPC ........ *H01L 51/0069* (2013.01); *H01L 51/0059* (2013.01); *C09K 11/06* (2013.01); *H01L 51/0058* (2013.01); *H01L 51/0087* (2013.01); *H01L 51/5012* (2013.01)

(58) Field of Classification Search
CPC ............ H01L 51/0059; H01L 51/0069; H01L 51/0058; H01L 51/5012; H01L 51/0087; C09K 11/06
See application file for complete search history.

(56) References Cited

U.S. PATENT DOCUMENTS

| | | | |
|---|---|---|---|
| 4,769,292 | A | 9/1988 | Tang et al. |
| 5,104,740 | A | 4/1992 | Shinkai et al. |
| 5,294,869 | A | 3/1994 | Tang et al. |
| 5,449,564 | A | 9/1995 | Nishio et al. |
| 5,862,434 | A | 1/1999 | Yamakawa |
| 6,004,685 | A | 12/1999 | Antoniadis et al. |
| 6,680,131 | B1 | 1/2004 | Ishibashi et al. |
| 7,632,579 | B2 | 12/2009 | Ise et al. |
| 7,714,099 | B2 * | 5/2010 | Morishita et al. ............ 528/423 |
| 7,902,542 | B2 | 3/2011 | Haase et al. |

(Continued)

FOREIGN PATENT DOCUMENTS

| | | |
|---|---|---|
| EP | 0 281 381 B1 | 7/1992 |
| JP | A-63-264692 | 11/1988 |

(Continued)

OTHER PUBLICATIONS

Chemistry of Materials, (Web Date May 22, 2012), 24(11), pp. 2178-2185.*

(Continued)

*Primary Examiner* — Dawn L. Garrett
(74) *Attorney, Agent, or Firm* — Oliff PLC

(57) ABSTRACT

A light emitting element including an anode, a cathode, a visible light emitting layer which emits visible light and an infrared light emitting layer which emits infrared light installed between the anode and the cathode is provided. Also, it is preferable that the infrared light emitting layer contain a thiadiazole-based compound as a light emitting material.

18 Claims, 12 Drawing Sheets

(56) References Cited

U.S. PATENT DOCUMENTS

| | | | |
|---|---|---|---|
| 7,919,773 B2 | 4/2011 | Kawakami et al. | |
| 7,947,992 B2 | 5/2011 | Yasukawa et al. | |
| 7,960,912 B2 | 6/2011 | Yasukawa et al. | |
| 8,039,128 B2 | 10/2011 | Watanabe et al. | |
| 8,803,138 B2 | 8/2014 | Fujita et al. | |
| 2002/0089560 A1 | 7/2002 | Katayama et al. | |
| 2003/0008172 A1 | 1/2003 | Leclerc et al. | |
| 2003/0027016 A1 | 2/2003 | Ara et al. | |
| 2004/0018382 A1* | 1/2004 | Kinlen | 428/690 |
| 2005/0079381 A1 | 4/2005 | Hamada et al. | |
| 2006/0063027 A1 | 3/2006 | Vestweber et al. | |
| 2006/0154105 A1 | 7/2006 | Yamamoto et al. | |
| 2007/0077453 A1* | 4/2007 | Sano et al. | 428/690 |
| 2007/0254432 A1 | 11/2007 | Yamazaki et al. | |
| 2007/0285005 A1* | 12/2007 | Itai | 313/504 |
| 2008/0061681 A1* | 3/2008 | Thompson et al. | 313/504 |
| 2008/0067479 A1* | 3/2008 | Kimura et al. | 252/600 |
| 2008/0125593 A1 | 5/2008 | Kim et al. | |
| 2008/0230123 A1* | 9/2008 | Mitsui et al. | 136/263 |
| 2009/0079335 A1 | 3/2009 | Mitsuya et al. | |
| 2009/0091250 A1 | 4/2009 | Yasukawa et al. | |
| 2009/0115348 A1 | 5/2009 | Yamazaki et al. | |
| 2009/0243476 A1 | 10/2009 | Nomura et al. | |
| 2009/0261360 A1 | 10/2009 | Yasukawa et al. | |
| 2010/0133434 A1* | 6/2010 | Meng et al. | 250/338.4 |
| 2010/0155694 A1 | 6/2010 | Miller et al. | |
| 2010/0194807 A1 | 8/2010 | Hirasawa et al. | |
| 2010/0237338 A1 | 9/2010 | Yamamoto et al. | |
| 2010/0237990 A1 | 9/2010 | Amano et al. | |
| 2010/0244671 A1 | 9/2010 | Nomura et al. | |
| 2010/0244679 A1 | 9/2010 | Fujita et al. | |
| 2010/0252823 A1 | 10/2010 | Kambe et al. | |
| 2010/0317858 A1 | 12/2010 | Konno | |
| 2011/0058192 A1 | 3/2011 | Hatanaka et al. | |
| 2011/0087034 A1 | 4/2011 | Miyata et al. | |
| 2011/0253988 A1 | 10/2011 | Molt et al. | |
| 2011/0279020 A1 | 11/2011 | Inoue et al. | |
| 2011/0303901 A1 | 12/2011 | Cheng et al. | |
| 2012/0056213 A1 | 3/2012 | Yamamoto et al. | |
| 2012/0091923 A1* | 4/2012 | Kastner-Jung et al. | 315/360 |
| 2012/0262057 A1* | 10/2012 | Fujita et al. | 313/504 |
| 2012/0267615 A1* | 10/2012 | Fujita et al. | 257/40 |
| 2013/0009909 A1* | 1/2013 | Yamazaki et al. | 345/174 |
| 2013/0032791 A1* | 2/2013 | Bazan et al. | 257/40 |
| 2013/0037784 A1* | 2/2013 | Yamamoto et al. | 257/40 |
| 2013/0037785 A1 | 2/2013 | Fujita et al. | |
| 2013/0099209 A1 | 4/2013 | Hartmann et al. | |
| 2013/0168654 A1* | 7/2013 | Fujita et al. | 257/40 |
| 2013/0221334 A1* | 8/2013 | Yamamoto et al. | 257/40 |

FOREIGN PATENT DOCUMENTS

| | | |
|---|---|---|
| JP | A-2-255788 | 10/1990 |
| JP | A-3-791 | 1/1991 |
| JP | A-3-792 | 1/1991 |
| JP | A-3-162481 | 7/1991 |
| JP | A-3-177486 | 8/1991 |
| JP | A-5-32966 | 2/1993 |
| JP | A-5-214334 | 8/1993 |
| JP | A-5-258859 | 10/1993 |
| JP | A-6-73374 | 3/1994 |
| JP | A-6-93257 | 4/1994 |
| JP | A-6-136359 | 5/1994 |
| JP | A-6-145146 | 5/1994 |
| JP | A-6-240246 | 8/1994 |
| JP | H07-52375 A | 2/1995 |
| JP | H09-236965 A | 9/1997 |
| JP | A-10-330295 | 12/1998 |
| JP | H11-179895 A | 7/1999 |
| JP | 11-217776 A | 8/1999 |
| JP | A-11-233261 | 8/1999 |
| JP | A-2000-91073 | 3/2000 |
| JP | 2001-097949 A | 4/2001 |
| JP | A-2001-110570 | 4/2001 |
| JP | 2001-270585 A | 10/2001 |
| JP | A-2002-097465 | 4/2002 |
| JP | A-2003-055652 | 2/2003 |
| JP | 2003-109760 A | 4/2003 |
| JP | 2004-002297 A | 1/2004 |
| JP | A-2005-063938 | 3/2005 |
| JP | 2005-531552 A | 10/2005 |
| JP | 2006-045398 A | 2/2006 |
| JP | 2006-511939 A | 4/2006 |
| JP | 2007-000769 A | 1/2007 |
| JP | A-2007-115626 | 5/2007 |
| JP | 2008-069100 A | 3/2008 |
| JP | 2008-133277 A | 6/2008 |
| JP | 2008-162921 A | 7/2008 |
| JP | 2009-016693 * | 1/2009 |
| JP | 2009-049094 A | 3/2009 |
| JP | 2009-256343 A | 11/2009 |
| JP | 2010-147179 A | 7/2010 |
| JP | 2010-179544 A | 8/2010 |
| JP | 2010-245211 A | 10/2010 |
| JP | 2010-254674 A | 11/2010 |
| JP | 2011-073432 A | 4/2011 |
| JP | 2011-134810 A | 7/2011 |
| WO | 03/095445 A1 | 11/2003 |
| WO | 2004/058911 A2 | 7/2004 |
| WO | WO 2008/069322 A1 | 6/2008 |

OTHER PUBLICATIONS

Journal of Physical Chemistry C, (2009), 113(4), pp. 1589-1595.*
Thin Solid Films, (2009), 518(2), pp. 551-554.*
Debad et al., "Dibenzotetraphenylperiflanthene: Synthesis, Photophysical Properties, and Electrogenerated Chemiluminescence," *Journal of American Chemical Society*, vol. 118, pp. 2374-2379, 1996.
Kawabe et al., "Electroluminescence of Green Light Region in Doped Anthracene," *Japanese Journal of Applied Physiscs*, vol. 10, pp. 527-528, 1971.
Aug. 21, 2014 Office Action issued in U.S. Appl. No. 13/564,376.
Jan. 10, 2014 Office Action issued in U.S. Appl. No. 13/445,523.
Jun. 18, 2014 Office Action issued in U.S. Appl. No. 13/445,523.
Sep. 5, 2014 Notice of Allowance issued in U.S. Appl. No. 13/445,523.
Oct. 3, 2014 Office Action issued in U.S. Appl. No. 14/319,410.
Mar. 26, 2014 Notice of Allowance issued in U.S. Appl. No. 13/727,339.
U.S. Appl. No. 14/693,484, filed Apr. 22, 2015 in the name of Yamamoto et al.
U.S. Appl. No. 14/700,751, filed Apr. 30, 2015 in the name of Fujita et al.
Apr. 22, 2015 Office Action issued in U.S. Appl. No. 13/773,033.
Jun. 29, 2015 Office Action issued in U.S. Appl. No. 13/444,107.
Aug. 24, 2015 Office Action issued in U.S. Appl. No. 13/773,033.

* cited by examiner

FIG. 13
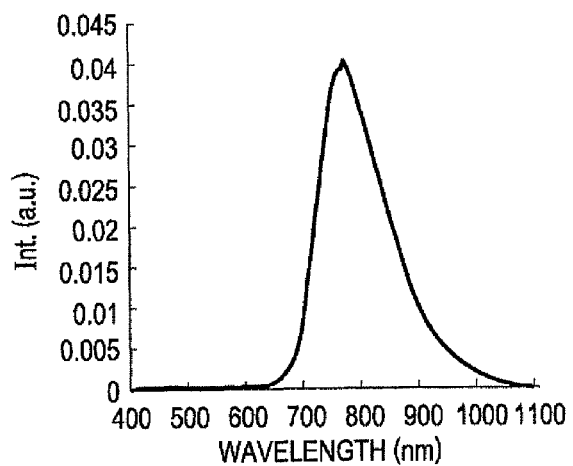
REFERENCE EXAMPLE 1
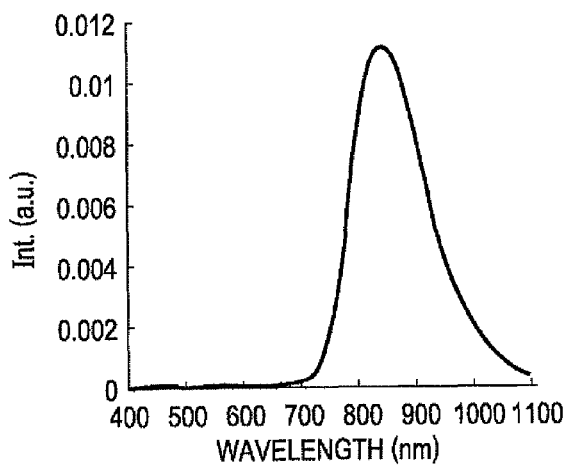
REFERENCE EXAMPLE 2

LIGHT EMITTING ELEMENT, LIGHT EMITTING DEVICE, AND ELECTRONIC DEVICE

BACKGROUND

1. Technical Field

The present invention relates to a light emitting element, a light emitting device, and an electronic device.

2. Related Art

An organic electroluminescence element (a so-called organic EL element) is a light emitting element with a structure where a light emitting organic layer with at least one layer is interposed between an anode and a cathode. In the light emitting element such as this, through the application of an electric field between the anode and the cathode, in the light emitting layer, a hole is injected from the anode at the same time as an electron is injected from the cathode, therefore an exciton is generated by the reunion of the electron and the hole in the light emitting layer and the energy is released as light when the exciton returns to the ground state.

As a light emitting element such as this, an element which emits infrared light in the near-infrared region at a long wavelength region greater than 700 nm is known (see JP-A-2000-091973 and JP-A-2001-110570, for example). For example, in a light emitting element disclosed in JP-A-2000-091973 and JP-A-2001-110570, an emission wavelength is made longer by using a material, in which, an amine as an electron donor, and a nitrile group as an electron acceptor, co-exist as functional groups in the molecule, as dopants of the light emitting layer.

However, in the related art, an element with high efficiency and a long life, which emits light in the near-infrared region has not been able to be achieved. Therefore, realization of a light emitting element including a light emitting layer which emits light in the near-infrared region and a light emitting layer which emits light in the visible region may also be considered, however, if applied to the light emitting element such as this, long-term light emission in the visible region has been able to be achieved but long-term light emission in the near-infrared region has not been able to be achieved.

SUMMARY

An advantage of some aspects of the invention is to provide a light emitting element including an infrared light emitting layer which emits infrared light with high efficiency and a long life and a visible light emitting layer which emits visible light with high efficiency and a long life, a light emitting device provided with the light emitting element, and an electronic device.

Some aspects of the invention are achieved as follows.

According to an aspect of the invention, there is provided a light emitting element, including an anode, a cathode, a visible light emitting layer which emits visible light and an infrared light emitting layer which emits infrared light installed between the anode and the cathode.

As a result, a light emitting element including an infrared light emitting layer which emits infrared light with high efficiency and a long life and a visible light emitting layer which emits visible light with high efficiency and a long life may be obtained.

It is preferable that the infrared light emitting layer contain a thiadiazole-based compound as a light emitting material.

The thiadiazole-based compound is suitable as a light emitting material of the infrared light emitting layer, in terms of being able to emit light in the near-infrared region.

It is preferable that the thiadiazole-based compound be expressed by following Formula (1A).

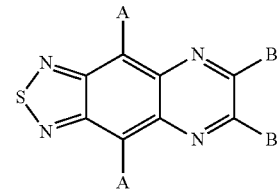

(1A)

In Formula (1A), A and B, each independently, represent a hydrogen atom, an alkyl group, an aryl group which may have a substituent, an arylamino group, or triarylamine.

The thiadiazole-based compound of such a composition is suitable as a light emitting material of the infrared light emitting layer, in terms that it may emit light in a near-infrared region.

It is preferable that the thiadiazole-based compound be expressed by following Formula (1B).

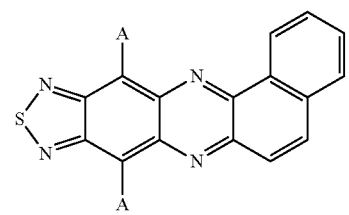

(1B)

In Formula (1B), As independently represent a hydrogen atom, an alkyl group, an aryl group which may have a substituent, an arylamino group, or triarylamine.

The thiadiazole-based compound of such a composition is suitable as a light emitting material of the infrared light emitting layer, in terms that it may emit light in a near-infrared region.

It is preferable that the thiadiazole-based compound be expressed by following Formula (1C).

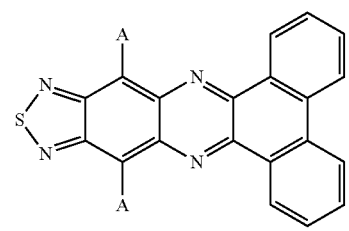

(1C)

In Formula (1C), A and B, each independently, represent a hydrogen atom, an alkyl group, an aryl group which may have a substituent, an arylamino group, or triarylamine.

The thiadiazole-based compound of such a composition is suitable as a light emitting material of the infrared light emitting layer, in terms that it may emit light in a near-infrared region.

It is preferable that the infrared light emitting layer contain a platinum complex-based compound represented by following Formula (2) as the light emitting material.

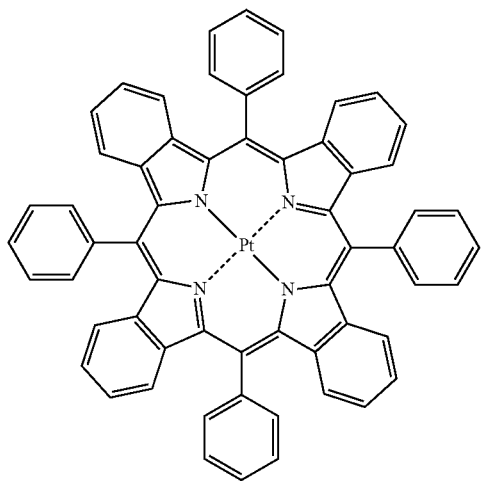

(2)

The platinum complex-based compound of such a composition is suitable as a light emitting material of the infrared light emitting layer, in terms that it may emit light in a near-infrared region.

It is preferable that the infrared light emitting layer further contain a host material which supports the light emitting material.

The host material, along with generating excitons from the reunion of the holes and the electrons, has a function to transport the energy of the excitons to the light emitting material (a Foerster transport or a Dexter transport), and to excite the light emitting material. This makes it possible to increase the light emitting efficiency of the light emitting element.

It is preferable that white light be emitted as the visible light.

As a result, the light emitting element of such a composition may be applied to a light source for illumination or a light source of a skin diagnostic device.

It is preferable that green light be emitted as the visible light.

As a result, the light emitting element of such a composition may be applied to a light source of a pulse measuring device and an authentication device.

According to another aspect of the invention, there is provided a light emitting device including the light emitting element according to the aspect of the invention.

As a result, a light emitting device with excellent reliability may be obtained.

According to still another aspect of the invention, there is provided an electronic device including the light emitting device according to the aspect of the invention.

As a result, an electronic device with excellent reliability may be obtained.

BRIEF DESCRIPTION OF THE DRAWINGS

The invention will be described with reference to the accompanying drawings, wherein like numbers reference like elements.

FIG. 13 are diagrams which show light emission spectra of a light emitting element in Reference Examples 1 and 2.

DESCRIPTION OF EXEMPLARY EMBODIMENTS

Hereinafter, a light emitting element, a light emitting device, and an electronic device according to the aspects of the invention will be described with reference to the preferred embodiments shown in the accompanying drawings.

First Embodiment

First, a light emitting element according to a first embodiment of the invention is described.

Figure 1:
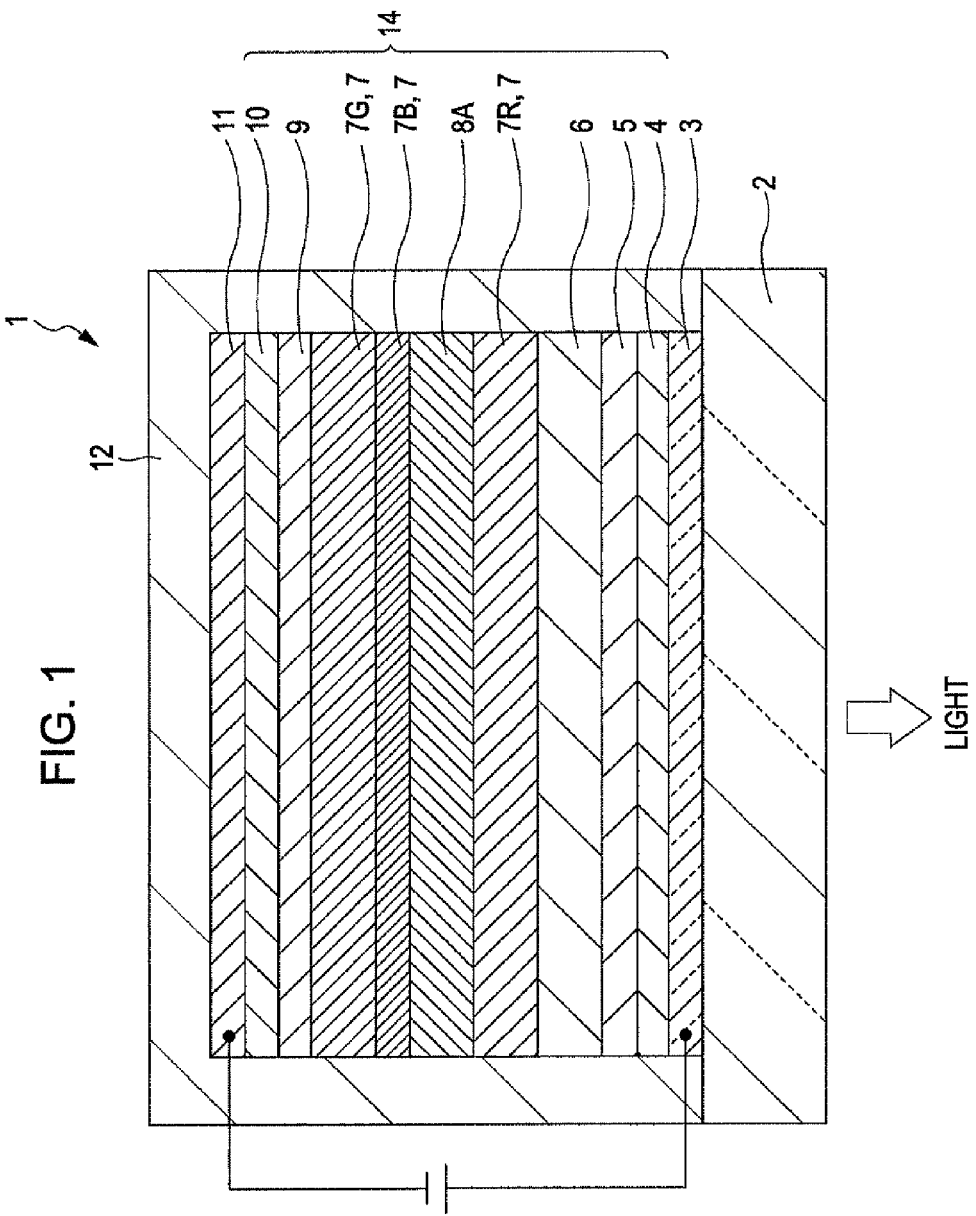
FIG. 1 is a cross-sectional diagram that schematically shows a light emitting element according to a first embodiment of the invention.

FIG. 1 is a cross-sectional diagram that schematically shows a light emitting element according to a first embodiment of the invention. Also, hereinafter, the upper side of FIG. 1 will be described as "top" and the lower side as "bottom" for the sake of convenience.

The light emitting element (electroluminescence element) 1 shown in FIG. 1 includes an anode 3, a hole injection layer 4, a hole transport layer 5, an infrared light emitting layer 6, a red light emitting layer 7R, a first intermediate layer 8A, a blue light emitting layer 7B, a green light emitting layer 7G, an electron transport layer 9, an electron injection layer 10, and a cathode 11, all being stacked in this sequence. That is, in the light emitting element 1, between the anode 3 and the cathode 11, a stacked body 14, in which the hole injection layer 4, the hole transport layer 5, the infrared light emitting layer 6, the red light emitting layer 7R, the first intermediate layer 8A, the blue light emitting layer 7B, the green light emitting layer 7G, the electron transport layer 9, and the electron injection layer 10 are stacked in this sequence starting from the anode 3 to the cathode 11, is interposed.

In addition, the light emitting element 1 is sealed with a sealing member 12 at the same time as the whole element is installed on a substrate 2.

In the light emitting element 1 such as this, a hole is introduced (injected) from the anode 3 at the same time as an electron is introduced (injected) from the cathode 11 with regard to each light emitting layer of the infrared light emitting layer 6, the red light emitting layer 7R, the blue light emitting layer 7B and the green light emitting layer 7G. Furthermore in each light emitting layer, the hole and the electron are reunited, an exciton is generated by the energy emitted from the reunion, and energy (fluorescence or phosphorescence) is released when the exciton returns to the ground state. This enables the red light emitting layer 7R, the blue light emitting layer 7B and the green light emitting layer 7G to emit red, blue, and green visible light, respectively, at the same time as the infrared light emitting layer 6 emits infrared light. As a result, the light emitting element 1 emits infrared light and white visible light. Also, in the embodiment, a visible light emitting layer 7 which emits visible light is formed by the three layers of the red light emitting layer 7R, the blue light emitting layer 7B and the green light emitting layer 7G.

Also, in the embodiment, movement of the holes and the electrons between the red light emitting layer 7R and the blue light emitting layer 7B may be adjusted since the light emitting element 1 has the first intermediate layer 8A between the red light emitting layer 7R and the blue light emitting layer 7B, therefore, energy transfer of the excitons between the red light emitting layer 7R and the blue light emitting layer 7B may be blocked. As a result, the red light emitting layer 7R and the blue light emitting layer 7B may emit light in a balanced way, respectively, therefore, the light emitting element 1 may emit white light as the visible light more reliably.

Also, the infrared light emitting layer 6 may emit light in a near-infrared region by using the light emitting material which is described later. Also, in this specification, "near-infrared region" represents the wavelength region of greater than or equal to 700 nm and less than or equal to 1500 nm.

The substrate 2 supports the anode 3. The light emitting element 1 of the embodiment is configured to take out the light from the side of the substrate 2 (bottom emission type), therefore, the substrate 2 and the anode 3 are substantially transparent (colorless and transparent, colored and transparent, or semi-transparent), respectively.

As a component material for the substrate 2, for example, a resin material such as polyethylene terephthalate, polyethylene naphthalate, polypropylene, cycloolefin polymer, polyamide, polyethersulfone, polymethylmethacrylate, polycarbonate, or polyarylate, or a glass material such as quartz glass or soda glass or the like may be used and be used either alone or as a combination of two or more.

The average thickness of the substrate 2 such as this, while not particularly limited, is preferably about 0.1 to 30 nm and more preferably about 0.1 to 10 nm.

Also, in a case in which the light emitting element 1 is configured to take out the light from the opposite side of the substrate 2 (top emission type), both a transparent substrate and an opaque substrate may be used as the substrate 2.

As the opaque substrate, for example, a substrate composed of a ceramic material such as alumina, a substrate in which an oxide film (an insulation film) is formed on the surface of a metal substrate such as stainless steel, and a substrate made of a resin material, may be used.

Also, in the light emitting element 1 such as this, the distance between the anode 3 and the cathode 11 (that is, the average thickness of the stacked body 14) is preferably 100 to 500 nm, more preferably 100 to 300 nm, and even more preferably 100 to 250 nm. This, simply and reliably, enables the driving voltage of the light emitting element 1 to be within a practical range.

Hereinafter, each section which configures the light emitting element 1 will be described one by one.

Anode

The anode 3 is an electrode in which holes are injected to the hole transport layer 5 through the hole injection layer 4 which is described later. As a component material for the anode 3, it is preferable that a material with a large work function and excellent conductivity be used.

As the component material for the anode 3, for example, an oxide such as ITO (Indium Tin Oxide), IZO (Indium Zinc Oxide), $In_3O_3$, $SnO_2$, Sb containing $SnO_2$, or Al containing ZnO, Au, Pt, Ag, Cu, or an alloy containing these or the like may be used and used either alone or as a combination of two or more.

Particularly, it is preferable that the anode 3 be composed of ITO. ITO is a material with a large work function and excellent conductivity and, at the same time, is transparent. Therefore, it is possible for the holes to be injected efficiently from the anode 3 to the hole injection layer 4.

Also, a surface of the hole injection layer 4 side of the anode 3 (the top in FIG. 1) is preferably subjected to a plasma treatment. This enables the chemical and the mechanical stability of the joint surface of the anode 3 and the hole injection layer 4 to be enhanced. As a result, it is possible to improve the hole injection property from the anode 3 to the hole injection layer 4. Also, regarding the plasma treatment, this will be described in detail in the description of the production method of the light emitting element 1 which is described later.

The average thickness of the anode 3 such as this, while not particularly limited, is preferably about 10 to 200 nm and more preferably about 50 to 150 nm.

Cathode

On the other hand, the cathode 11 is an electrode in which electrons are injected to the electron transport layer 9 through the electron injection layer 10 which is described later. As a component material for the cathode 11, it is preferable that a material with a small work function be used.

As the component material for the cathode 11, for example, Li, Mg, Ca, Sr, La, Ce, Er, Eu, Sc, Y, Yb, Ag, Cu, Al, Cs, Rb or an alloy containing these or the like may be used and used either alone or as a combination of two or more (for example, as a stacked body of plural layers, a mixed layer of plural kinds, or the like).

Particularly, in a case in which the alloy is used as the component material for the cathode 11, it is preferable that an alloy with unreactive metal atoms such as Ag, Al, or Cu, more specifically, an alloy such as MgAg, AlLi, or CuLi be used. From the use of such an alloy as the component material for the cathode 11, electron injection efficiency and stability improvement of the cathode 11 may be expected.

The average thickness of the cathode 11 such as this, while not particularly limited, is preferably about 100 to 10000 nm and more preferably about 100 to 500 nm.

Since the light emitting element 1 of the embodiment is a bottom emission type, light transparency of the cathode 11 is not required. Also, in a case in which a top emission type is used, the average thickness of the cathode 11 is preferably about 1 to 50 nm since light needs to penetrate from the side of the cathode 11.

Hole Injection Layer

The hole injection layer 4 has a function to increase the efficiency of hole injection from the anode 3 (that is, has a hole injection property).

In this way, by installing the hole injection layer 4 between the anode 3 and the hole transport layer 5 described later, it is possible to improve the hole injection property from the anode 3 and therefore to increase the light emitting efficiency of the light emitting element 1.

This hole injection layer 4 includes a material having the hole injection property (that is, a hole injection material).

As a hole injection material included in the hole injection layer 4, while not particularly limited, for example, copper phthalocyanine, 4,4',4''-tris(N,N-phenyl-3-methylphenylamino)triphenylamine (m-MTDATA), N,N'-bis-(4-diphenylaminophenyl)-N,N'-diphenylbiphenyl-4-4'-diamine, or the like may be used.

Among these, as the hole injection material included in the hole injection layer 4, an amine-based material is preferable from the viewpoint of a hole injection property and a hole transport property. It is more preferable that a diaminobenzene derivative, a benzidine derivative (a material having a benzidine skeleton), a triamine-based compound having both the "diaminobenzene" unit and the "benzidine" unit in the molecule, or a tetraamine-based compound be used.

The average thickness of the hole injection layer 4 such as this, while not particularly limited, is preferably about 5 to 90 nm and more preferably about 10 to 70 nm.

Also, the hole injection layer 4, depending on the component material for the anode 3 and the hole transport layer 5, may not be included.

Hole Transport Layer

The hole transport layer 5 has a function to transport the holes injected from the anode 3 through the hole injection layer 4 to the light emitting layer 6 (that is, has a hole transport property). The hole transport layer 5 includes a material having the hole transport property (that is, a hole transporting material).

As a hole transporting material included in the hole transport layer 5, a variety of p-type high-molecular-weight materials or a variety of p-type low-molecular-weight materials may be used either alone or as a combination of two or more. For example, a tetraarylbenzidine derivative such as N,N'-di(1-naphthyl)-N,N'-diphenyl-1,1'-diphenyl-4,4'-diamine (NPD), or N,N'-diphenyl-N,N'-bis(3-methylphenyl)-1,1'-diphenyl-4,4'-diamine (TPD), a tetraaryldiaminofluorene compound or derivatives thereof (an amine-based compound) or the like may be used and be used either alone or as a combination of two or more.

Among these, as the hole transporting material included in the hole transport layer 5, an amine-based material is preferable from the viewpoint of the hole injection property and the hole transport property and it is particularly preferable that a benzidine derivative (a material having a benzidine skeleton) be used.

The average thickness of the hole transport layer 5 such as this, while not particularly limited, is preferably about 5 to 90 nm and more preferably about 10 to 70 nm.

Infrared Light Emitting Layer

The infrared light emitting layer 6 emits infrared light as emission light by an electric voltage being applied between the anode 3 and the cathode 11 described above.

The infrared light emitting layer 6 such as this may include the light emitting material which emits infrared light as emission light, however, it is preferable that the infrared light emitting layer 6 include the light emitting material which emits infrared light of the near-infrared region, a wavelength region of greater than or equal to 700 nm and less than or equal to 1500 nm.

As the light emitting material which emits infrared light of the near-infrared region, a thiadiazole-based compound and a platinum complex-based compound is preferably used, in particular.

As the thiadiazole-based compound, compounds expressed by following Formulae (1A), (1B) and (1C) may be included.

First, the compound expressed by following formula (1A) is described.

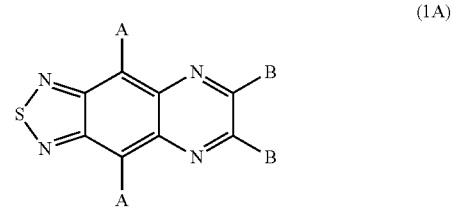

(1A)

In Formula (1A), A and B, each independently, represent a hydrogen atom, an alkyl group, an aryl group which may have a substituent, an arylamino group, or triarylamine.

The infrared light emitting layer 6 which includes the thiadiazole-based compound such as this may obtain a light emission in the wavelength region greater than or equal to 700 nm (near-infrared region).

Particularly, as the light emitting material (thiadiazole-based compound) used in the infrared light emitting layer 6, it is preferable that a compound expressed by following Formula (2A) or Formula (3A) be used.

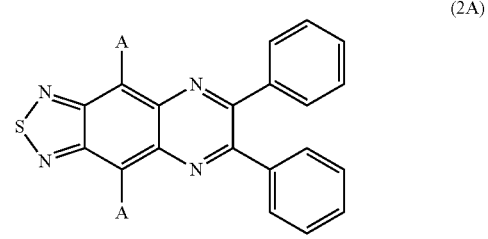

(2A)

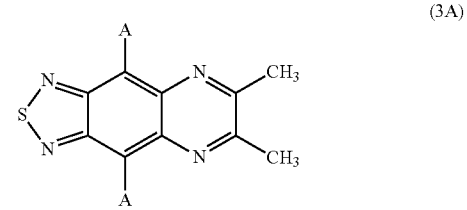

(3A)

In Formulae (2A) and (3A), As independently represent a hydrogen atom, an alkyl group, an aryl group which may have a substituent, an arylamino group, or triarylamine.

That is, in above Formula (1A), it is preferable that B be a phenyl group or a methyl group, respectively.

The phenyl group and the methyl group each have high chemical stability. Thus, by using this type of compound as the light emitting material included in the infrared light emitting layer 6, it is possible to extend the life of the infrared light emitting layer 6 and furthermore, the light emitting element 1. Also from the fact that the molecular weight of the light emitting material is able to be less reduced, an infrared light emitting layer 6 with high accuracy may be formed using a vapor deposition film formation. As a result, it is possible to achieve high efficiency and long life of the light emitting element 1.

In addition, as the light emitting material used in the infrared light emitting layer 6, it is preferable that compounds expressed by following Formulae (4A) to (9A) be used. More specifically, in particular, it is preferable that compounds expressed by following Formulae D-1 to D-3 be used.
(4A)
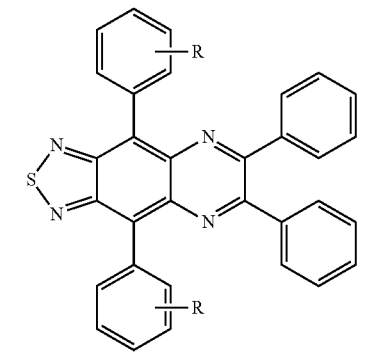
(5A)
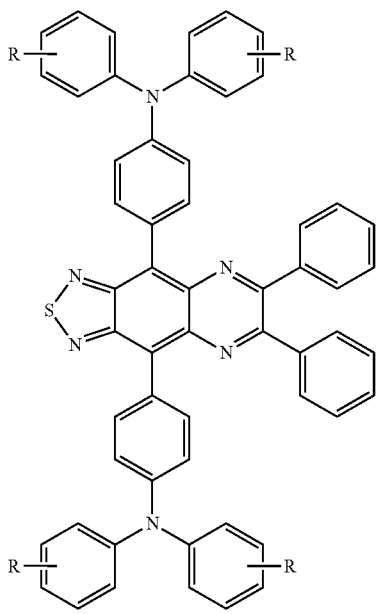
(6A)
(7A)
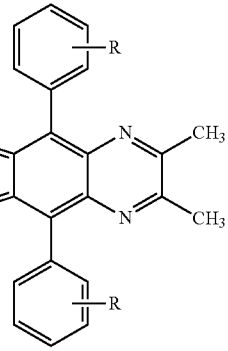
(8A)
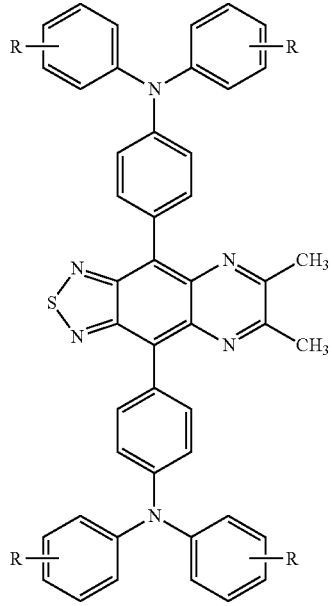
(9A)
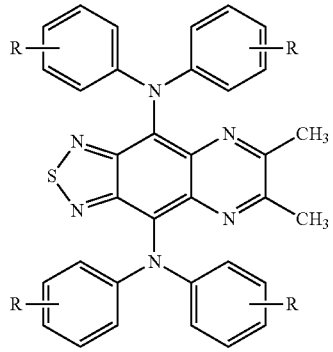

-continued

D-1
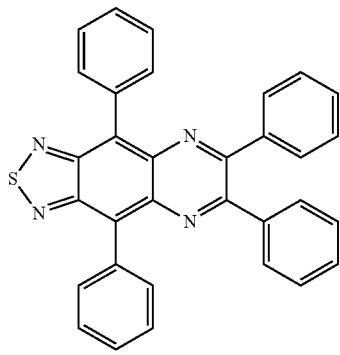

D-2
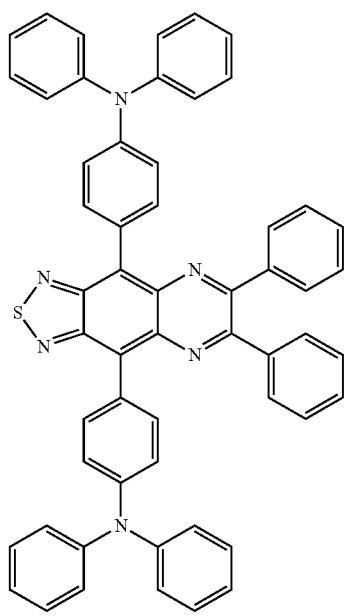

D-3
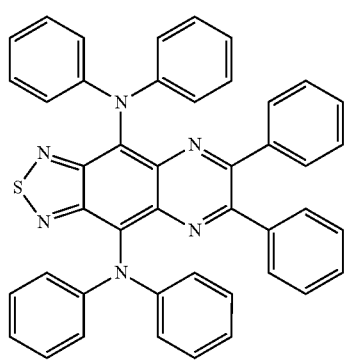

In Formulae (4A) to (9A), Rs each independently represent a hydrogen atom, an alkyl group, or an aryl group which may have a substituent. Also, adjacent carbons in two Rs may be connected and form a ring.

Next, the compound expressed by following formula (1B) is described.

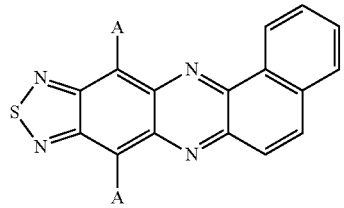
(1B)

In Formula (1B), As independently represent a hydrogen atom, an alkyl group, an aryl group which may have a substituent, an arylamino group, or triarylamine.

The infrared light emitting layer 6 which includes the thiadiazole-based compound such as this may obtain a light emission in the wavelength region greater than or equal to 700 nm (near-infrared region).

Particularly, as the light emitting material used in the infrared light emitting layer 6, it is preferable that compounds expressed by following Formulae (2B) to (4B) be used. More specifically, in particular, it is preferable that compounds expressed by following Formulae D-4 to D-6 be used.

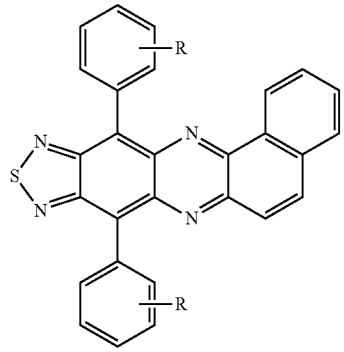
(2B)

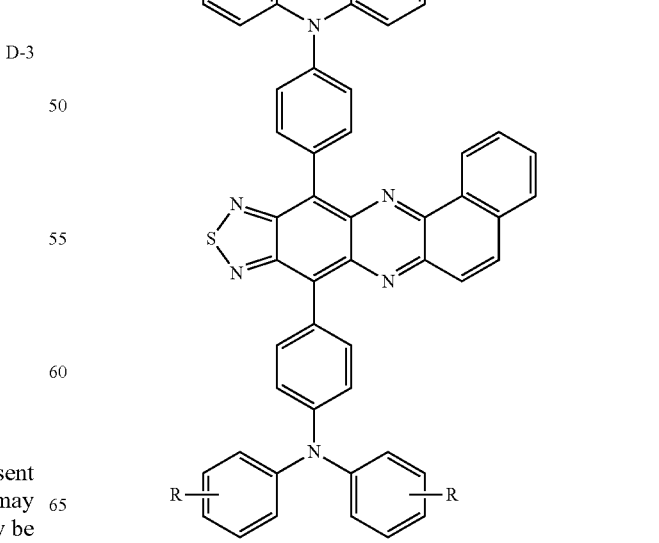
(3B)

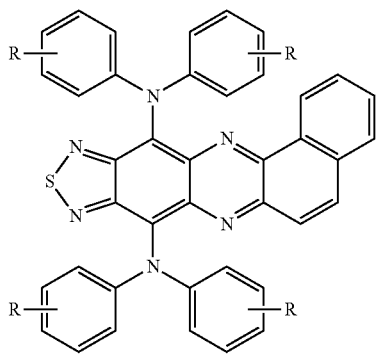
(4B)

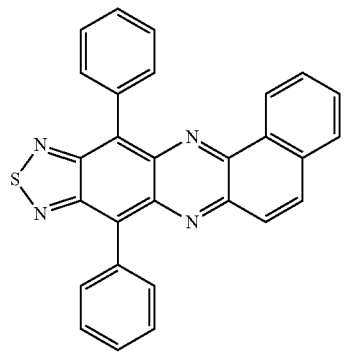
(D-4)

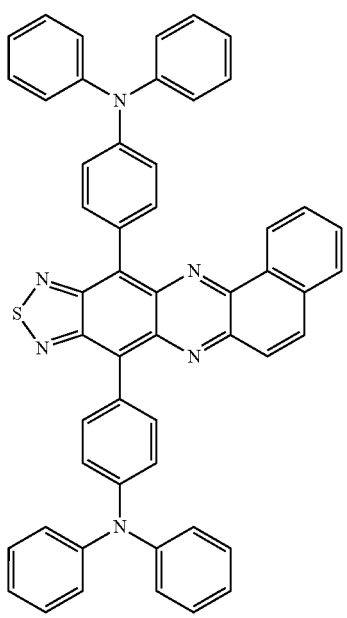
(D-5)

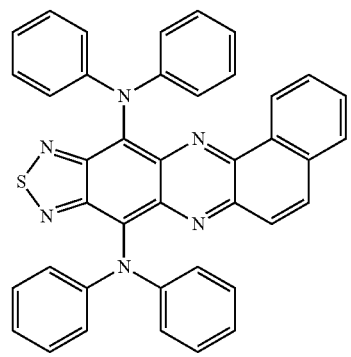
(D-6)

In Formulae (2B) to (4B), Rs each independently represent a hydrogen atom, an alkyl group, or an aryl group which may have a substituent. Also, adjacent carbons in two Rs may be connected and form a ring.

Next, the compound expressed by following formula (1C) is described.

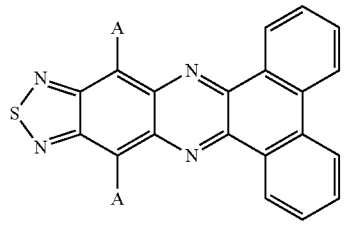
(1C)

In Formula (1C), A and B, each independently, represent a hydrogen atom, an alkyl group, an aryl group which may have a substituent, an arylamino group, or triarylamine.

The infrared light emitting layer 6 which includes the thiadiazole-based compound such as this may obtain a light emission in the wavelength region greater than or equal to 700 nm (near-infrared region).

In addition, as the light emitting material used in the infrared light emitting layer 6, from the viewpoint of higher efficiency and longer life, it is preferable that compounds expressed by following Formulae (2C) to (4C) be used. More specifically, in particular, it is preferable that compounds expressed by following Formulae D-7 to D-9 be used.

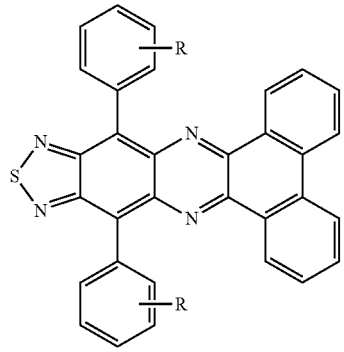
(2C)

(3C)
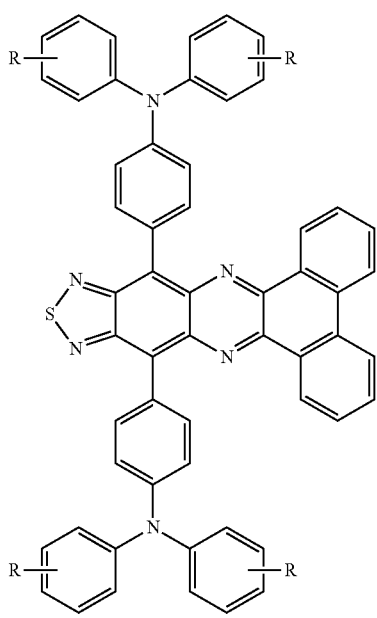
(4C)
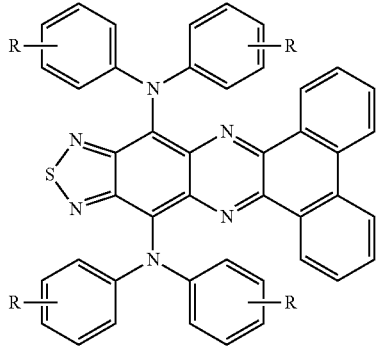
(D-7)
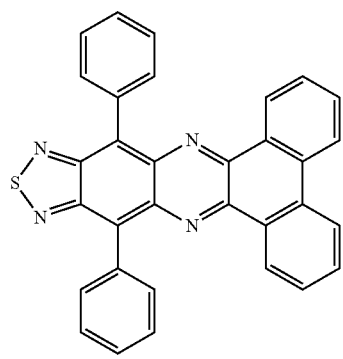
(D-8)
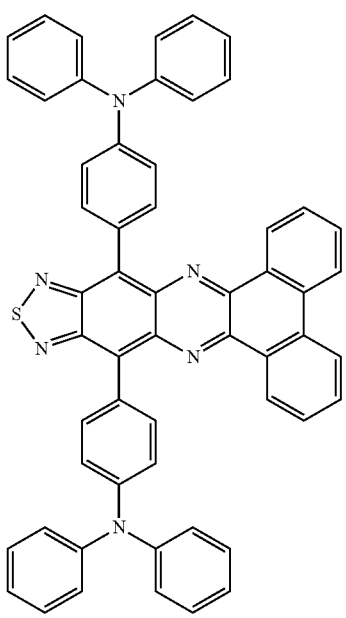
(D-9)
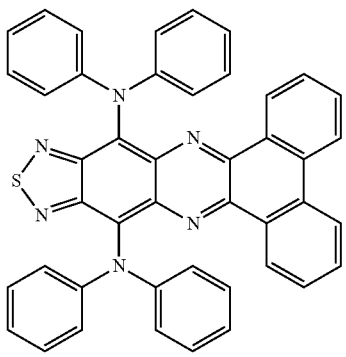
In Formulae (2C) to (4C), Rs each independently represent a hydrogen atom, an alkyl group, or an aryl group which may have a substituent. Also, adjacent carbons in two Rs may be connected and form a ring.
Also, as the platinum complex-based compound, the compound expressed by following formula (2) may be included.
(2)
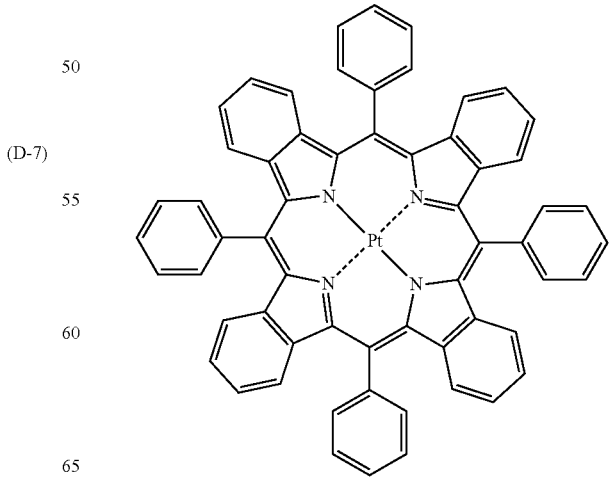

The infrared light emitting layer 6 which includes the platinum complex-based compound such as this (specifically, Pt(II) tetraphenyl tetrabenzoporphyrin: Pt(TPTBP)) may also obtain a light emission in the wavelength region greater than or equal to 700 nm (near-infrared region). Also, the infrared light emitting layer 6 may include a light emitting material (a variety of fluorescence materials, a variety of phosphorescence materials) other than the light emitting material described above.

Also, as a component material for the light emitting layer 6, in addition to the light emitting material described above, it is preferable that a host material in which this light emitting material is added (contained) as a guest material (dopant) be used.

This host material, along with generating excitons from the reunion of the holes and the electrons, has a function to transport the energy of the excitons to the light emitting material (a Foerster transport or a Dexter transport), and to excite the light emitting material. This makes it possible to increase the light emitting efficiency of the light emitting element 1. In the host material such as this, for example, the light emitting material which is a guest material may be used as a dopant with which the host material is doped.

As the host material, while not particularly limited as long as it functions as described above with regard to the light emitting material used, for example, a distyrylarylene derivative, a naphthacene derivative, an anthracene derivative such as 2-t-butyl-9,10-di(2-naphthyl)anthracene (TBADN), a perylene derivative, a distyrylbenzene derivative, a distyrylamine derivative, a quinolinolato-based metal complex such as bis(2-methyl-8-quinolinolato)(p-phenylphenolate)aluminum (BAlq) or tris(8-quinolinolato)aluminum complex (Alq$_3$), a triarylamine derivative such as triphenylamine tetramer, an oxadiazole derivative, rubrene and a derivative thereof, a silole derivative, a dicarbazole derivative, an oligothiophene derivative, a benzopyran derivative, a trizaole derivative, a benzoxazole derivative, a benzothiazole derivative, a quinoline derivative, a carbazole derivative such as 4,4'-bis(2,2'-diphenylvinyl)biphenyl (DPVBi), 3-phenyl-4-(1'-naphthyl)-5-phenylcarbazole, or 4,4'-N,N'-dicarbazolebiphenyl (CBP) or the like may be used and may be used alone or as a combination of two or more.

Among these, as the host material, it is preferable that an acene-based material be used.

The acene-based material, as described above, has a low level of reactivity with the light emitting material. Also, by using the acene-based material (particularly anthracene-based material and tetracene-based material) as the host material, an energy transfer from the host material to the light emitting material may be effectively performed. This is considered to be possible due to the facts as follows: (a) a generation of the singlet excited state of the light emitting material becomes possible through an energy transfer from the triplet excited state of the acene-based material, (b) an overlap between π electronic clouds of the acene-based material and electronic clouds of the light emitting material is increased, (c) an overlap between the fluorescent spectrum of the acene-based material and the absorption spectrum of the light emitting material is increased.

As a result, by using the acene-based material as the host material, light emitting efficiency of the light emitting element 1 may be increased.

Also, the acene-based material is excellent in tolerance to the electrons and the holes. Also, the acene-based material is excellent in thermal stability. Therefore, it is possible to extend the life of the light emitting element 1. Also, since the acene-based material is excellent in thermal stability, in a case in which the light emitting layer is formed using a vapor deposition method, it is possible to prevent a decomposition of the host material due to a heat during the film formation. As a result, the light emitting layer with an excellent film quality may be produced; therefore, it is possible to extend the life of the light emitting element and at the same time to increase the light emitting efficiency of the light emitting element 1.

Also, it is possible to prevent an adverse effect of the host material on the light emitting spectrum of the light emitting element 1 since it is difficult for the acene-based material to emit light itself.

Also, the acene-based material is not particularly limited as long as it has an acene skeleton and also, has an effect as described above, and, for example, a naphthalene derivative, an anthracene derivative, a naphthacene derivative (a tetracene derivative), or a pentacene derivative may be used and may be used alone or as a combination of two or more, however, it is preferable that an anthracene derivative (an anthracene-based material) or a tetracene derivative (a tetracene-based material) be used.

As a result, the electrons are efficiently transferred from the red light emitting layer 7R to the anthracene-based material or the tetracene-based material in the infrared light emitting layer 6.

As the tetracene-based material, while not particularly limited as long as it has at least one tetracene skeleton within one molecule and also functions as the host material as described above, it is preferable that a compound expressed by following Formula IRH-1 be used, it is more preferable that a compound expressed by following Formula IRH-2 be used, and it is even more preferable that a compound expressed by following Formula IRH-3 be used.

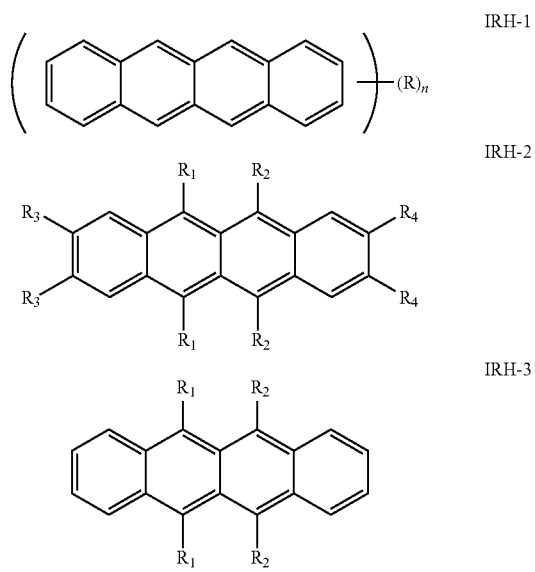

In the formula IRH-1, n represents a natural number of 1 to 12, Rs represent a substituent or a functional group, and each independently represents a hydrogen atom, an alkyl group, an aryl group which may have a substituent or an arylamino group. In the Formulae IRH-2 and IRH-3, $R_1$ to $R_4$ each independently represent a hydrogen atom, an alkyl group, an aryl group which may have a substituent or an arylamino group. In addition, $R_1$ to $R_4$ may be the same as or different from each other.

Also, it is preferable that the tetracene-based material be composed of carbon atoms and hydrogen atoms. As a result, it is possible to prevent a spontaneous interaction between the host material and the light emitting material. Therefore light emitting efficiency of the light emitting element 1 may be increased. Also, tolerance of the host material to the potential and the holes may be increased. Therefore, it is possible to extend the life of the light emitting element 1.

Specifically, as the tetracene-based material, for example, it is preferable that compounds represented by following Formulae H1-1 to H1-11 and compounds represented by following Formulae H1-12 to H1-27 be used.

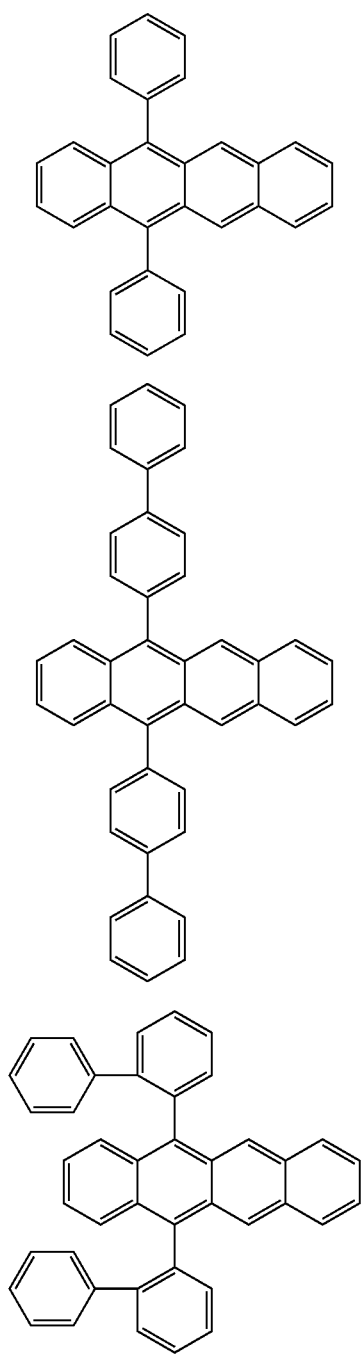

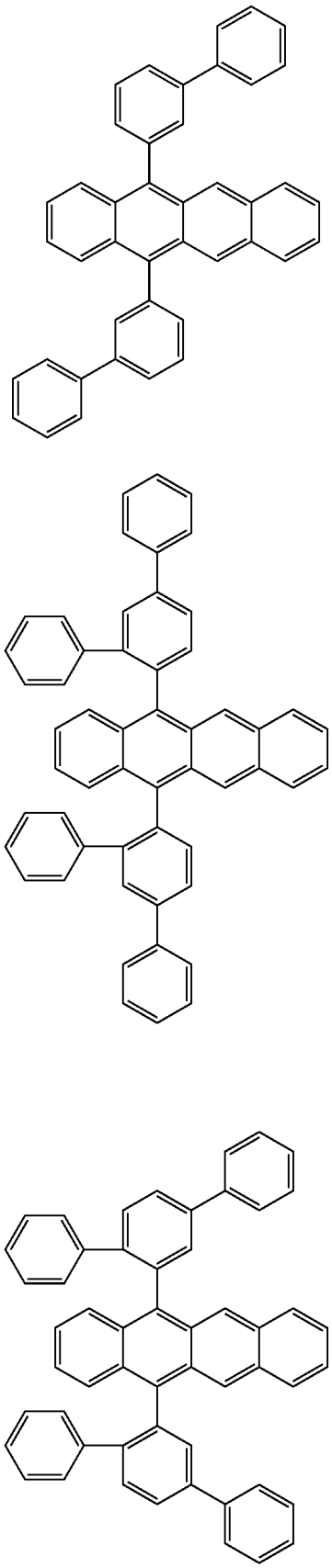

H1-7
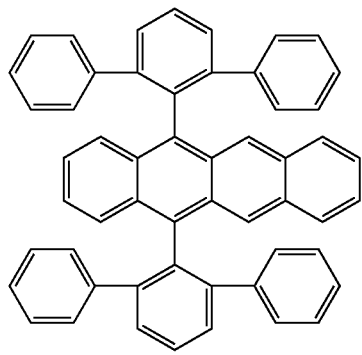
H1-8
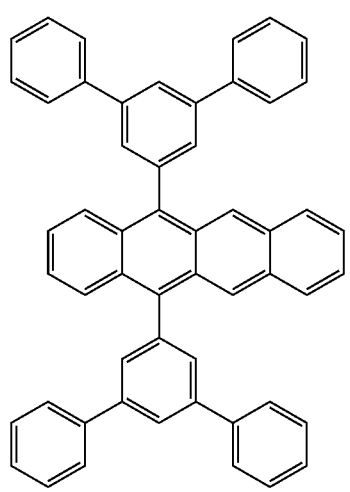
H1-9
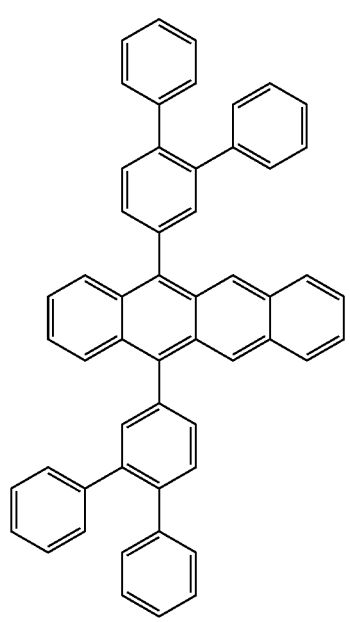
H1-10
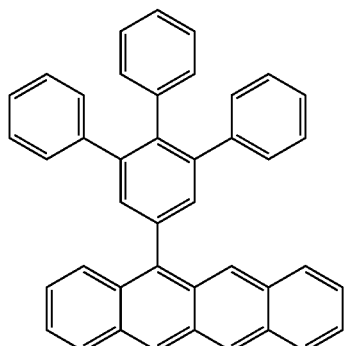
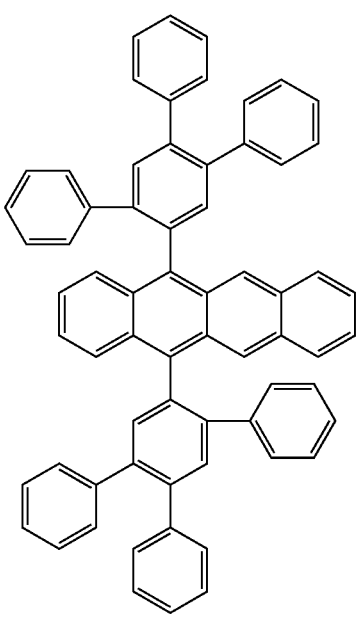
H1-11
H1-12
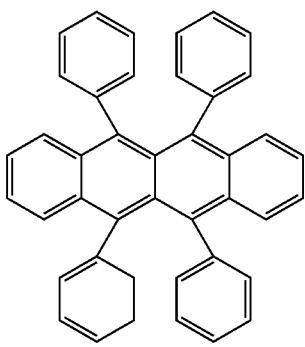

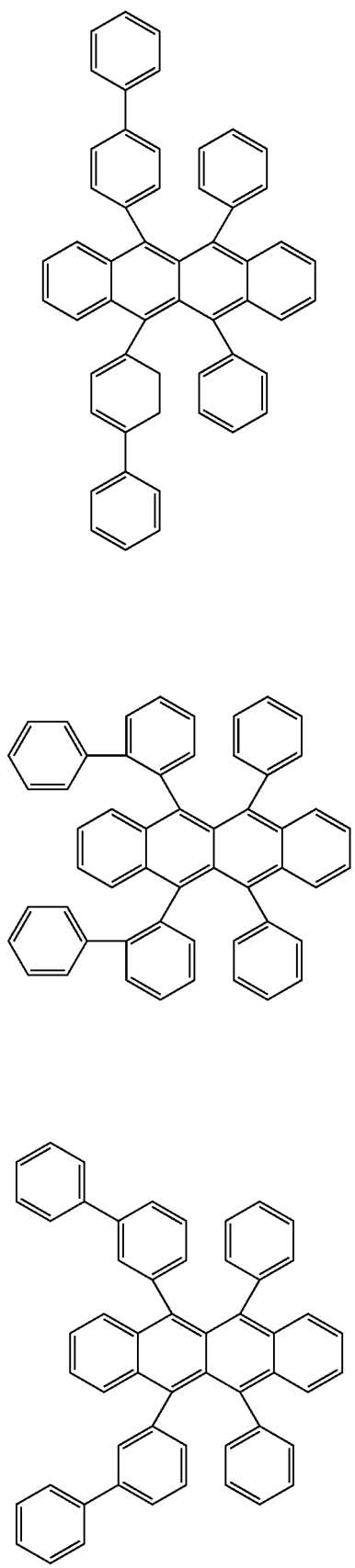
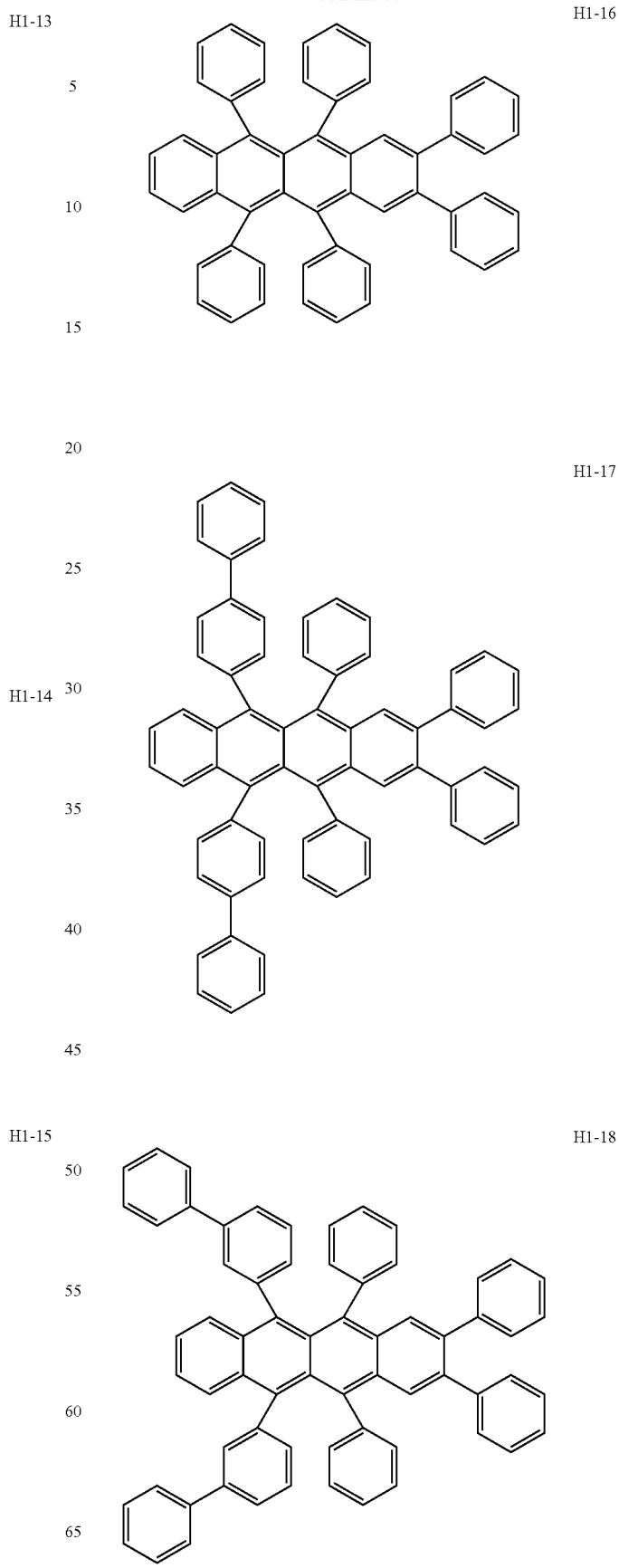

-continued
H1-19
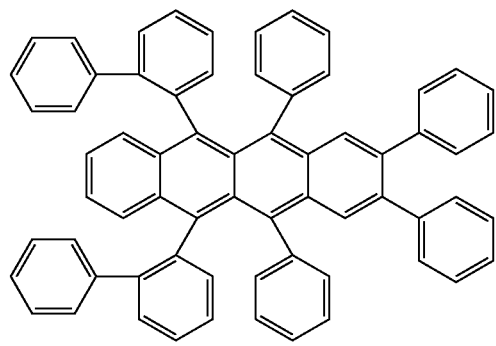
H1-20
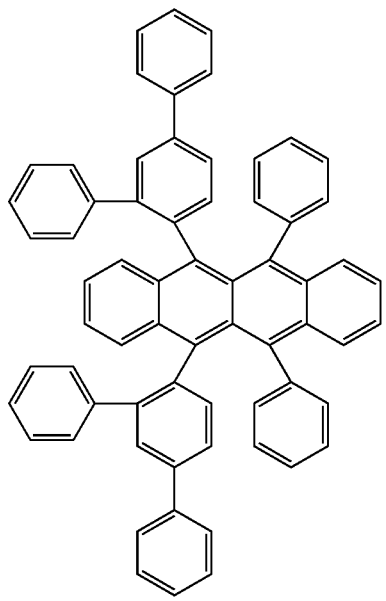
H1-21
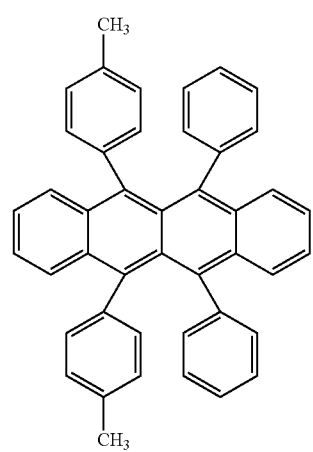
-continued
H1-22
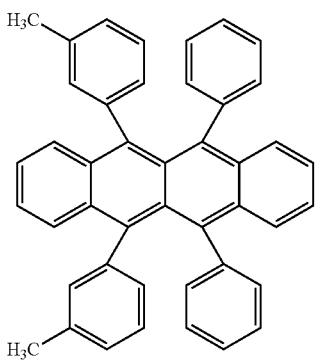
H1-23
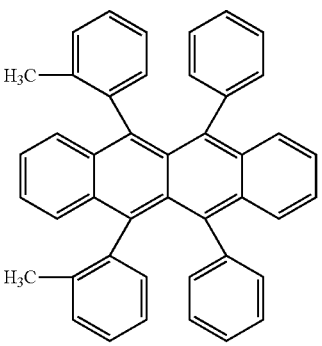
H1-24
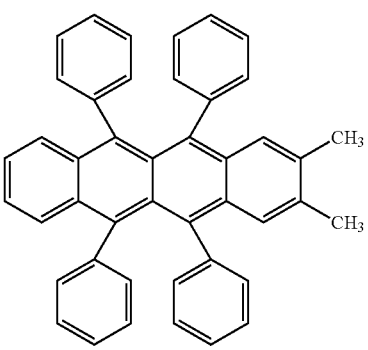
H1-25
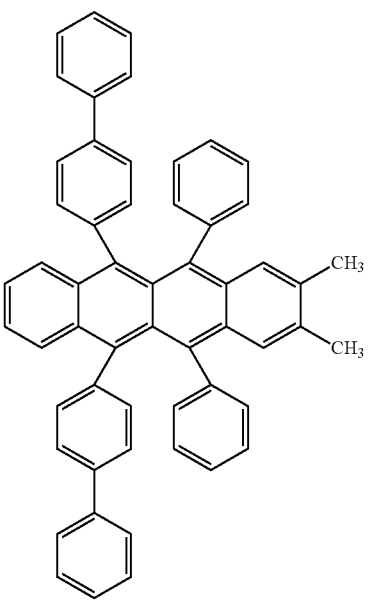

H1-26

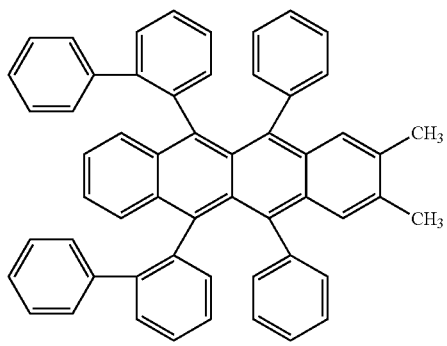

H1-27

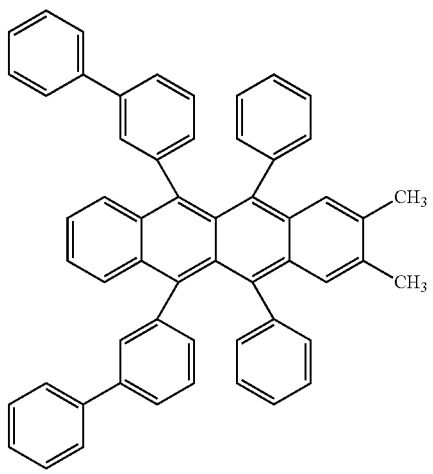

Also, as the anthracene-based material, while not particularly limited as long as it has at least one anthracene skeleton within one molecule and also functions as the host material as described above, it is preferable that a compound expressed by following Formula IRH-4 or a derivative thereof be used, and it is more preferable that a compound expressed by following Formulae IRH-5 to IRH-8 be used.

IRH-4

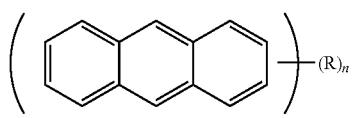

IRH-5

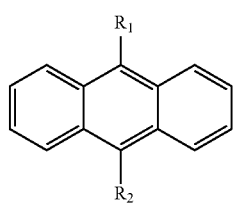

IRH-6

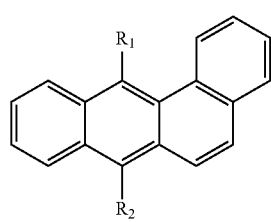

IRH-7

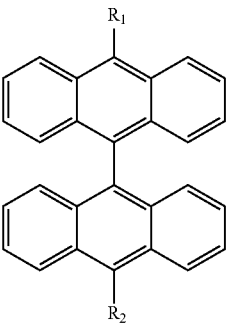

IRH-8

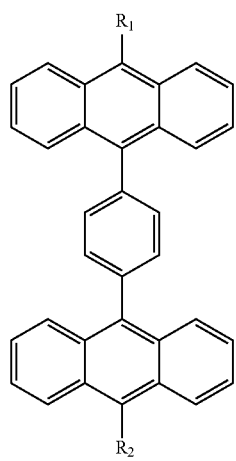

In the Formula IRH-4, n represents a natural number of 1 to 10, Rs represent a substituent or a functional group, and each independently represents a hydrogen atom, an alkyl group, an aryl group which may have a substituent or an arylamino group. In the Formulae IRH-5 to IRH-8, $R_1$ and $R_2$ each independently represent a hydrogen atom, an alkyl group, an aryl group which may have a substituent or an arylamino group. In addition, $R_1$ and $R_2$ may be the same as or different from each other.

Also, it is preferable that the anthracene-based material be composed of carbon atoms and hydrogen atoms. As a result, it is possible to prevent a spontaneous interaction between the host material and the light emitting material. Therefore light emitting efficiency of the light emitting element 1 may be increased. Also, tolerance of the host material to the potential and the holes may be increased. Therefore, it is possible to extend the life of the light emitting element 1.

Specifically, as the anthracene-based material, for example, it is preferable that the compounds expressed by following Formulae H2-1 to H2-16, the compounds expressed by following Formulae H2-21 to H2-40, and the compounds expressed by following Formulae H2-51 to H2-70, be used.

H2-1
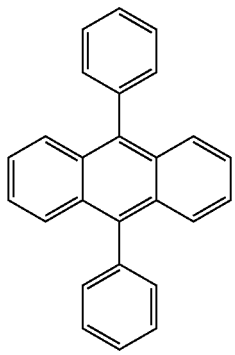
H2-2
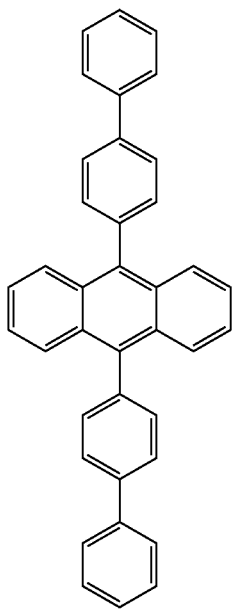
H2-3
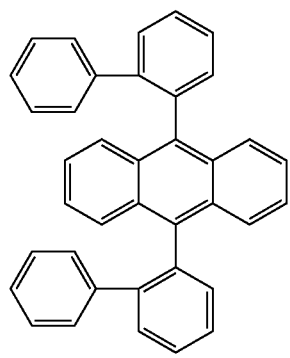
H2-4
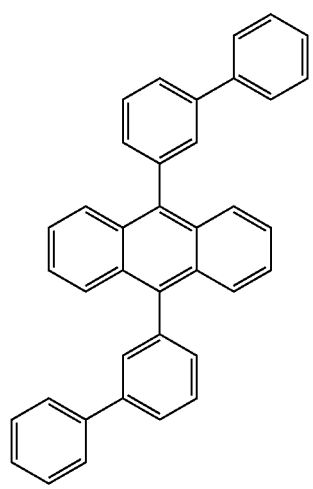
H2-5
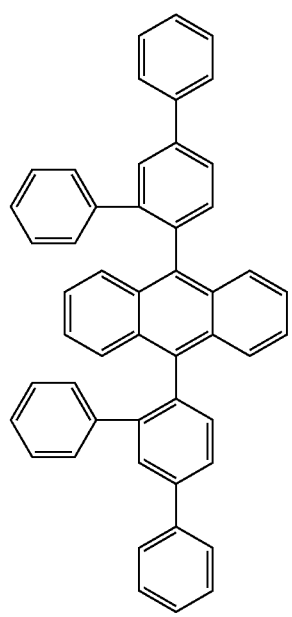
H2-6
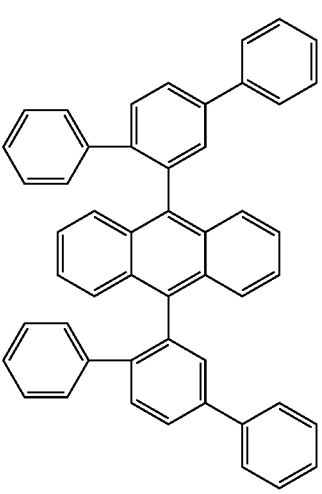

H2-7
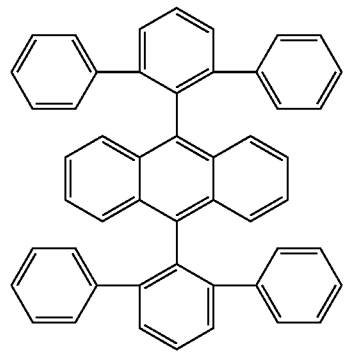
H2-8
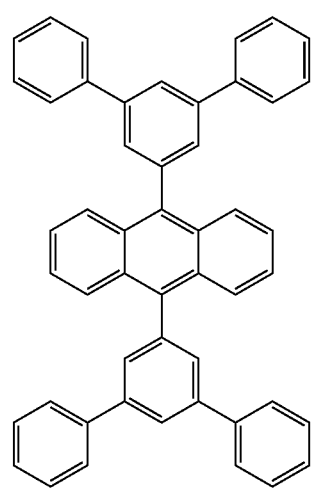
H2-9
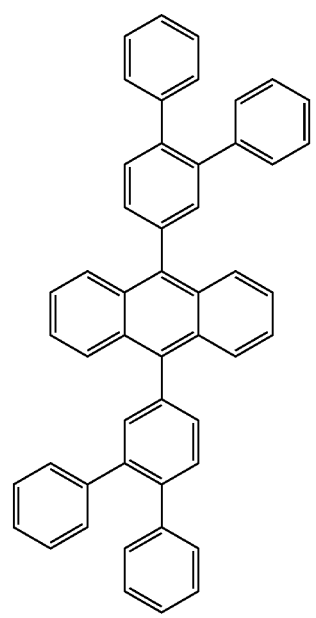
H2-10
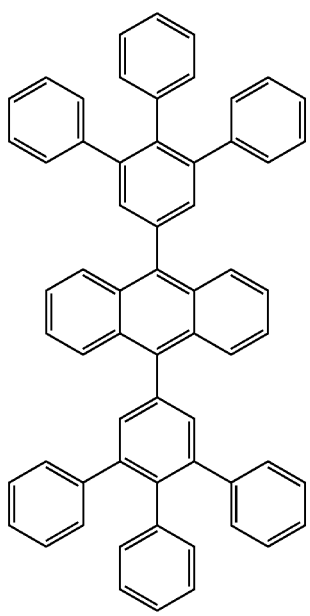
H2-11
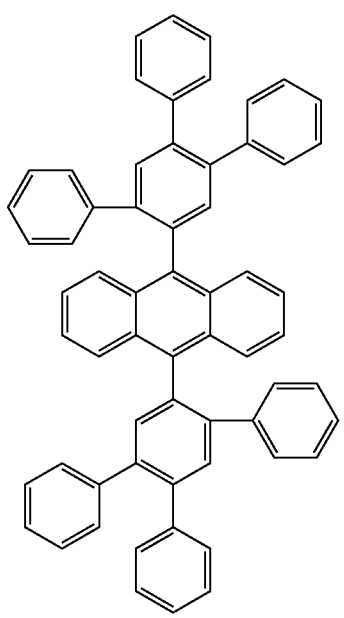
H2-12
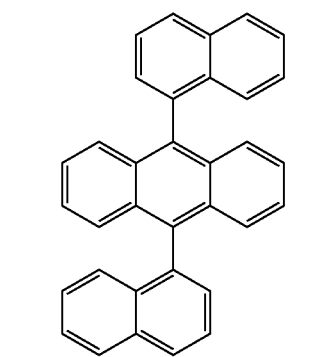

H2-13
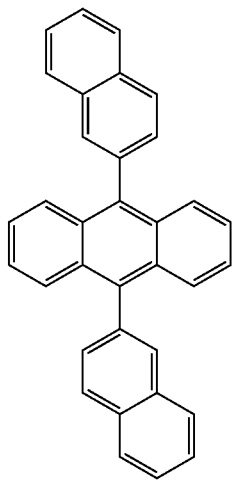
H2-16
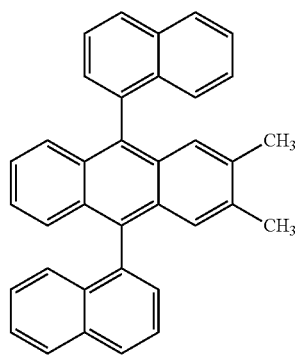
H2-14
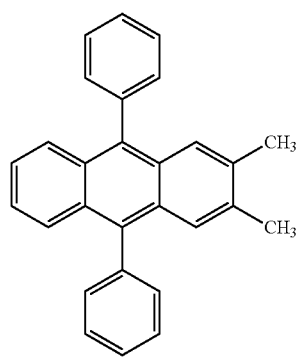
H2-21
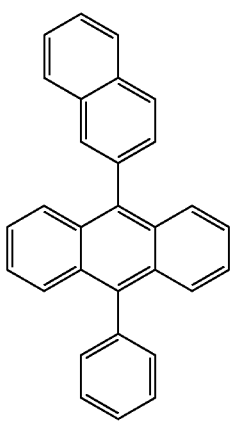
H2-15
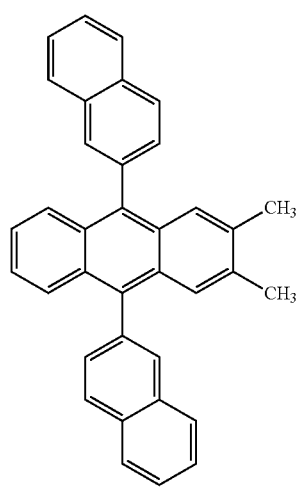
H2-22
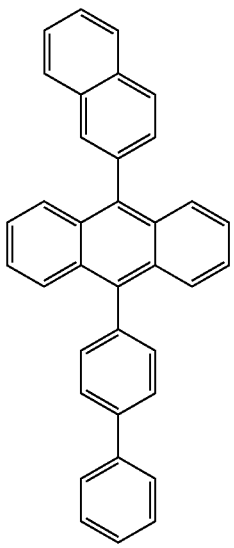

H2-23
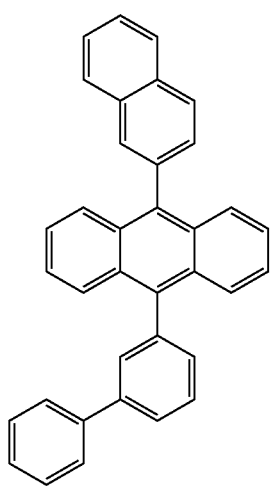
H2-24
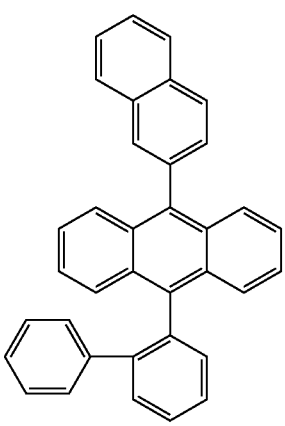
H2-25
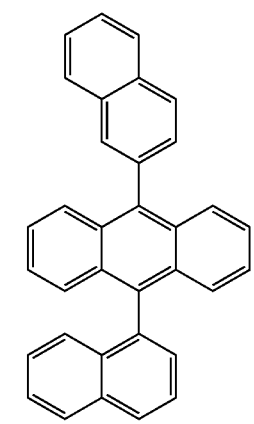
H2-26
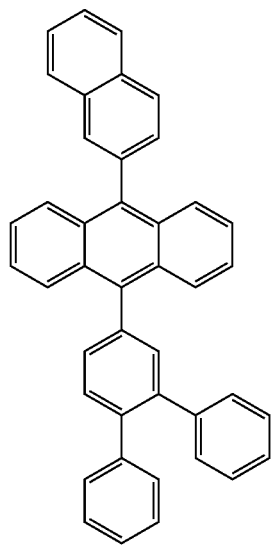
H2-27
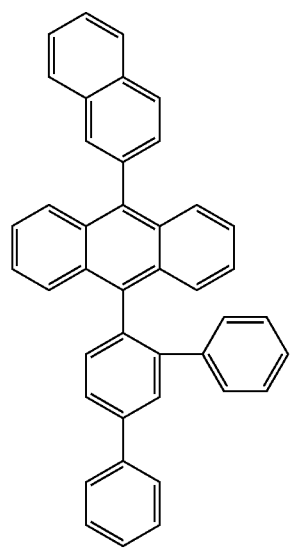
H2-28
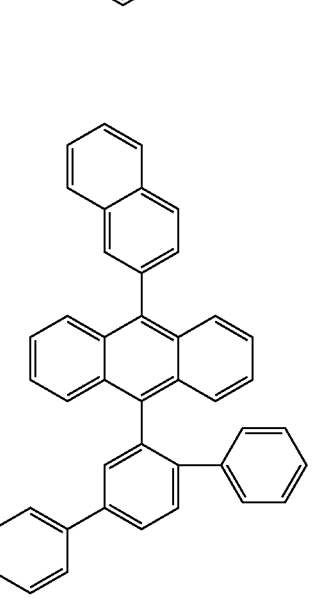

H2-29
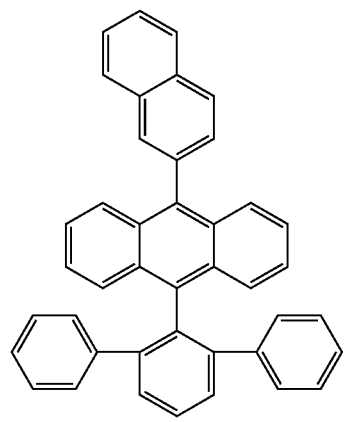
H2-30
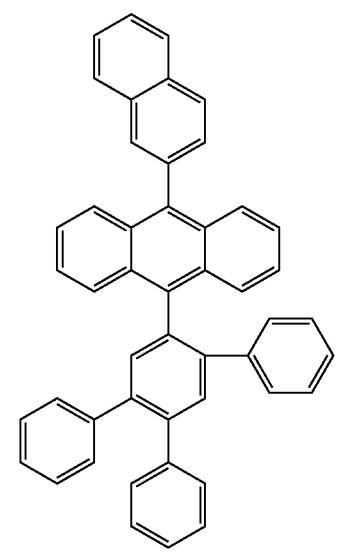
H2-31
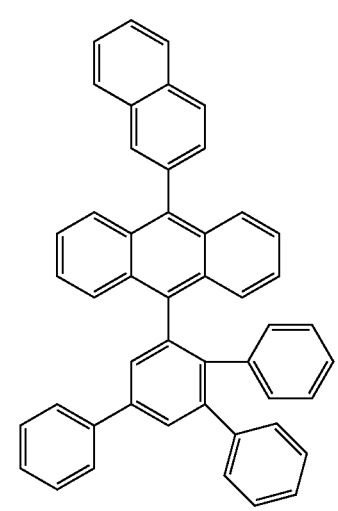
H2-32
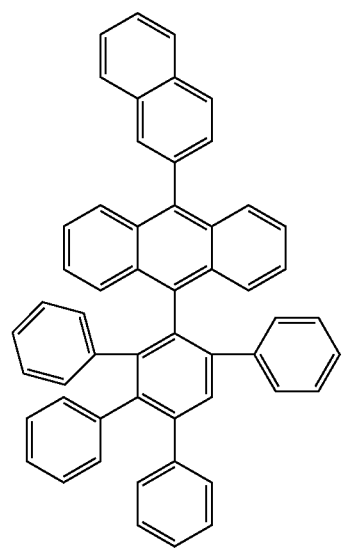
H2-33
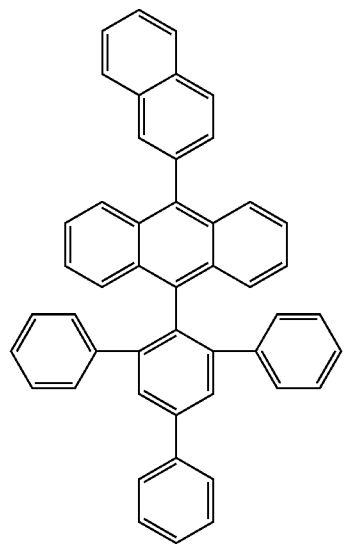

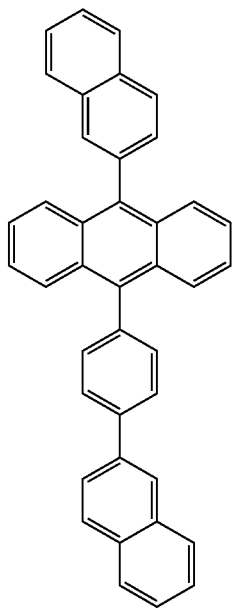
H2-34
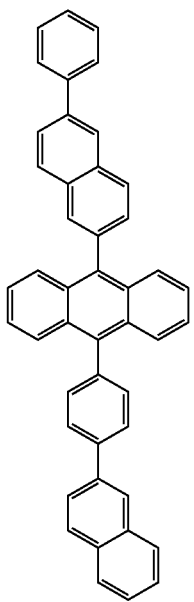
H2-36
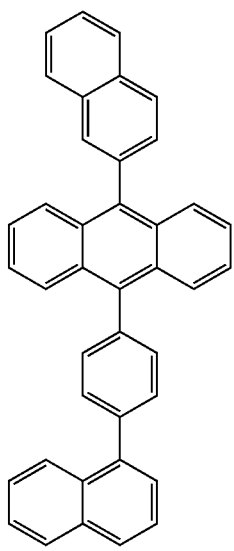
H2-35
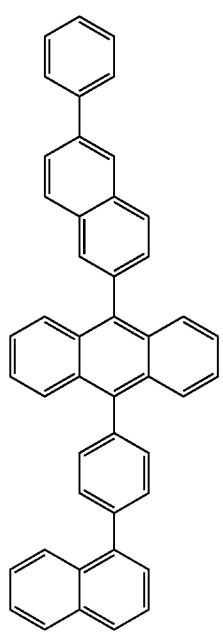
H2-37

H2-38
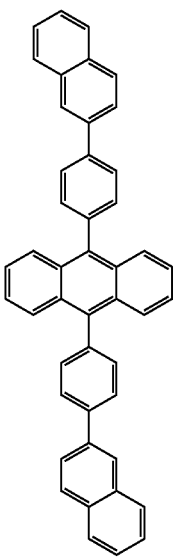
H2-39
H2-40
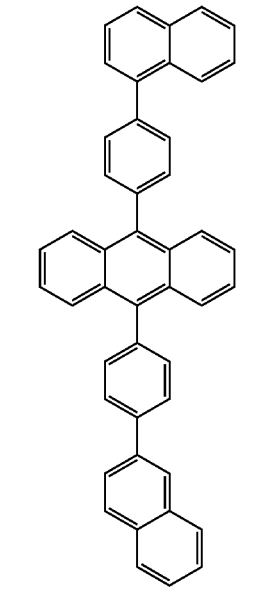
H2-51
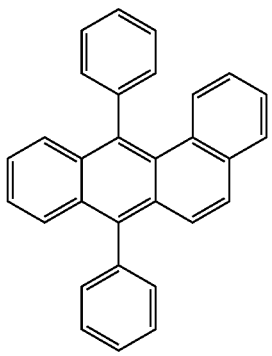
H2-52
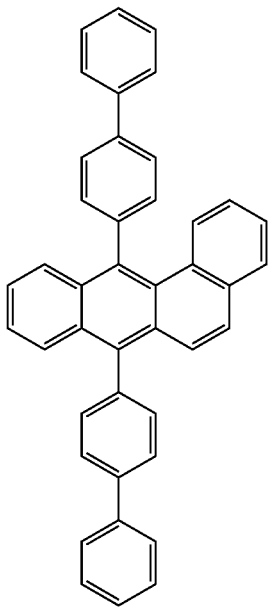

H2-53
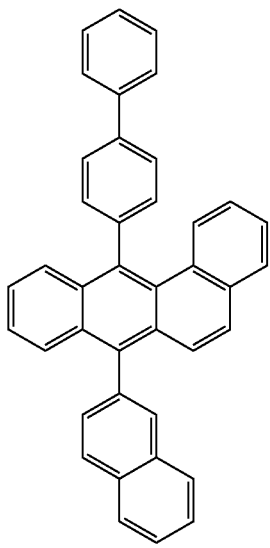
H2-54
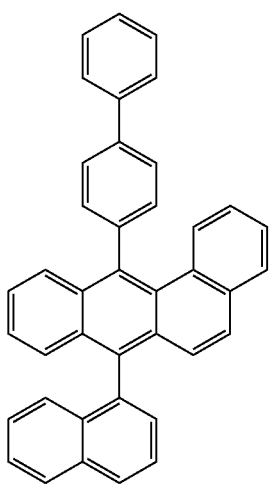
H2-55
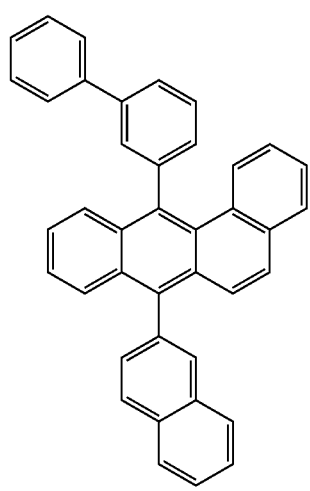
H2-56
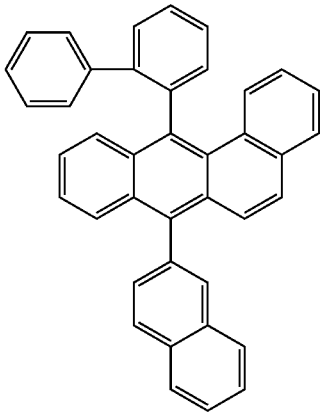
H2-57
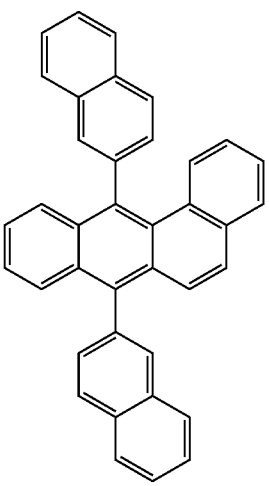
H2-58
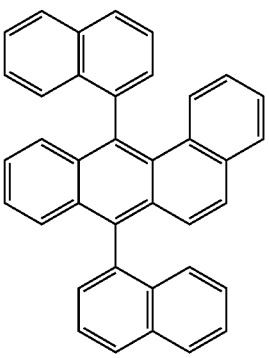

H2-59
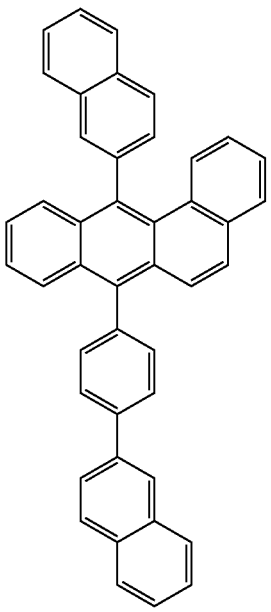
H2-60
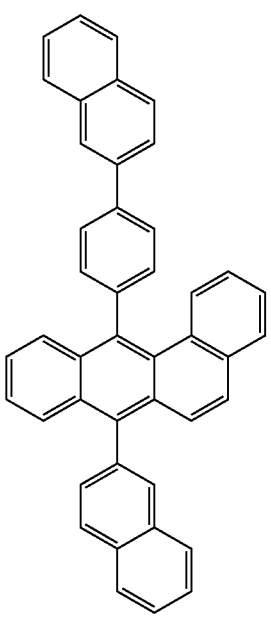
H2-61
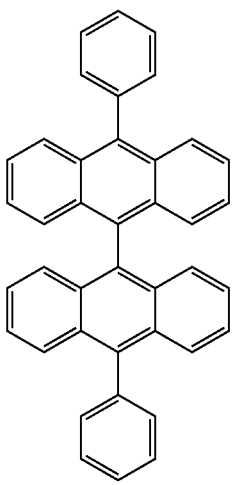
H2-62
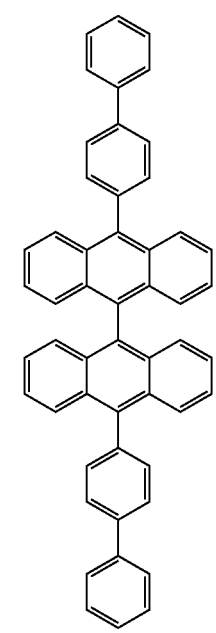

H2-63
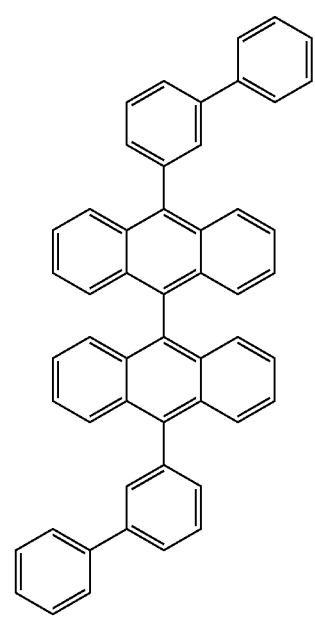
H2-64
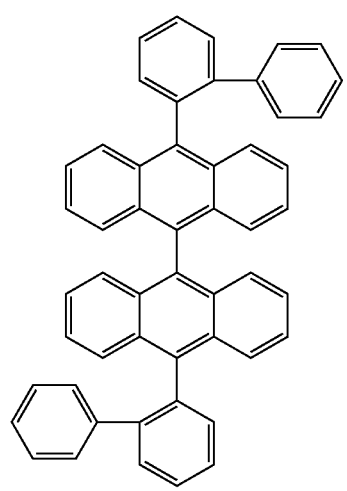
H2-65
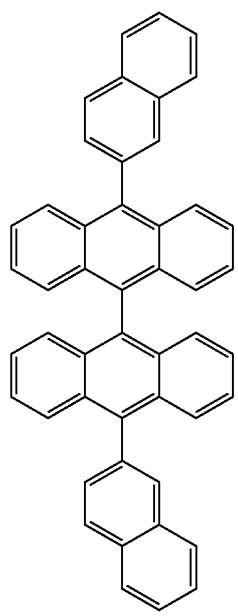
H2-66
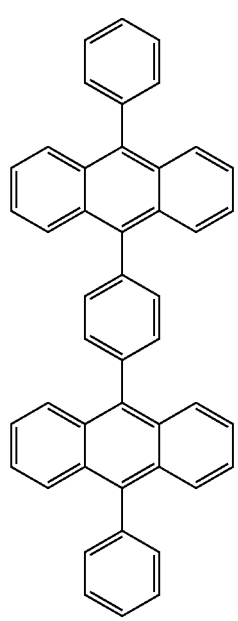

H2-67

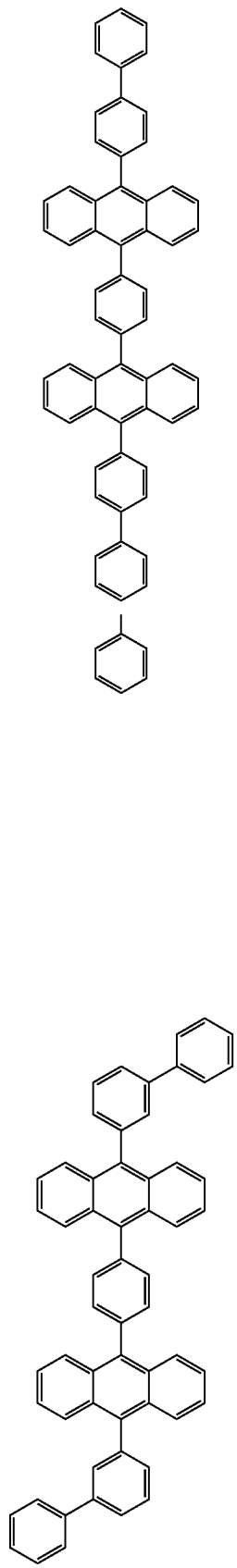

H2-68

H2-69

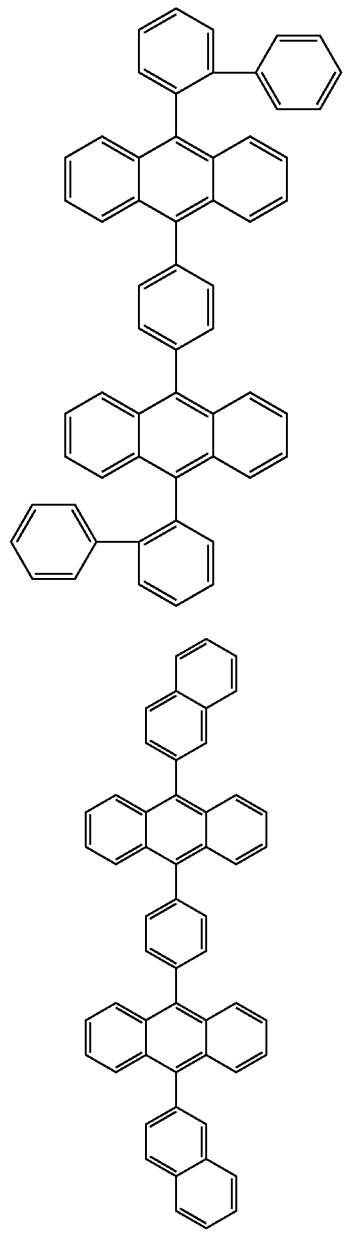

H2-70

In the infrared light emitting layer 6 which includes the light emitting material and the host material such as these, the content (doping amount) of the light emitting material is preferably 0.01 to 10 wt % and more preferably 0.1 to 5 wt %. Light emitting efficiency may be optimized by keeping the content of the light emitting material within this range.

Also, the average thickness of the light emitting layer 6, while not particularly limited, is preferably about 1 to 60 nm and more preferably about 3 to 50 nm.

Red Light Emitting Layer

This red light emitting layer 7R emits red light as emission light (visible light) by an electric voltage being applied between the anode 3 and the cathode 11 described above.

This red light emitting layer 7R includes the red light emitting material which emits red light.

The red light emitting material such as this is not particularly limited, and a variety of red fluorescent materials or phosphorescent materials may be used either alone or as a combination of two or more.

The red fluorescent material is not particularly limited as long as it emits red fluorescence and, for example, a perylene derivative such as a compound expressed by following Chemical Formula (17) (a diindenoperylene derivative), a europium complex, a benzopyran derivative, a rhodamine derivative, a benzothioxanthene derivative, a porphyrin derivative, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM) or the like may be included.

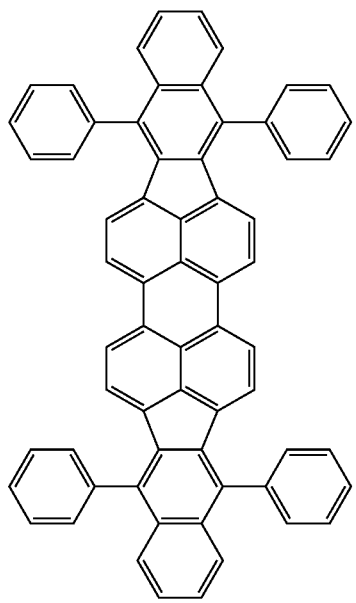

(17)

Among these, as the red light emitting material, using a diindenoperylene derivative is preferable. As a result, the red light emitting layer 7R may emit red light with high brightness.

The red phosphorescent material is not particularly limited as long as it emits red phosphorescence and, for example, metal complexes of iridium, ruthenium, platinum, osmium, rhenium, palladium, or the like may be included, and the complexes in which at least one of the ligands of these metal complexes has a phenylpyridine skeleton, a bipyridyl skeleton, a phorphyrin skeleton or the like may also be included. More specifically, tris(1-phenylisoquinoline)iridium, bis[2-(2'-benzo[4,5-α]thienyl)pyridinate-N,C$^{3'}$]iridium(acetylacetonate) (btp2Ir(acac)), 2,3,7,8,12,13,17,18-octaethyl-12H, 23H-porphyrin platinum(II), bis[2-(2'-benzo[4,5-α]thienyl)pyridinate-N,C$^3$]iridium, and bis(2-phenylpyridine)iridium (acetylacetonate) may be included.

Also, in the red light emitting layer 7R, it is preferable that a host material in which the red light emitting material is a guest material be included in addition to the red light emitting material described above.

As this host material, the same material described as the host material included in the infrared light emitting layer 6 may be used.

Also, a configuration in which the infrared light emitting layer 6 is positioned at the side of the anode 3 is preferable if the configuration in which the infrared light emitting layer 6 and the red light emitting layer 7R are adjacent is applied, as in the embodiment. As a result, an improvement of the light extraction efficiency in each light emitting layer 6 and 7R may be achieved.

Still, in this case, it is preferable that the host material of the red light emitting layer 7R be the same as the host material of the infrared light emitting layer 6. As a result, infrared light and red light may be emitted in a balanced way without a voltage build-up since a band gap between both light emitting layers 6 and 7R is not formed. That is, both infrared light and red light may be emitted in a balanced way even though the light emitting layers 6 and 7R are adjacent to each other.

First Intermediate Layer

The first intermediate layer 8A is prepared between the red light emitting layer 7R and the blue light emitting layer 7B adjoining to these red and blue light emitting layers and has a function to adjust the movement of carriers (holes or electrons) between the red light emitting layer 7R and the blue light emitting layer 7B. From these functions, the red light emitting layer 7R and the blue light emitting layer 7B may emit light efficiently, respectively.

This first intermediate layer 8A may be of any composition as long as it has a function to adjust the movement of the carriers (holes and electrons), however, particularly, it is preferable that the first intermediate layer 8A include the same kind of or the same material as the host material of the red light emitting layer 7R, and also, be composed without substantially including a material having a light emitting property.

As the component material of this first intermediate layer 8A, for example, including an acene-based material is suitably used as described above for the host material of the red light emitting layer 7R.

If these materials are used, an energy level of a highest occupied molecular orbital (HOMO) of the first intermediate layer 8A may be set lower than energy levels of both highest occupied molecular orbitals (HOMO) of the red light emitting layer 7R and the blue light emitting layer 7B, and also, an energy level of a lowest unoccupied molecular orbital (LUMO) of the first intermediate layer 8A may be set higher than energy levels of both lowest unoccupied molecular orbitals (LUMO) of the red light emitting layer 7R and the blue light emitting layer 7B. As a result, energy transfer of the excitons between the red light emitting layer 7R and the blue light emitting layer 7B is blocked more definitely.

The acene-based material is not particularly limited as long as it has an acene skeleton and also, has an effect as described above, and, for example, a naphthalene derivative, an anthracene derivative, a tetracene (naphthacene) derivative, a pentacene derivative, a hexacene derivative, a heptacene derivative or the like may be used and may be used alone or as a combination of two or more, however, it is preferable that a tetracene (naphthacene) derivative be used.

As the tetracene (naphthacene) derivative, while not particularly limited, the same derivative as the naphthacene derivative described as the host material of the infrared light emitting layer 6 as described above may be used.

This naphthacene derivative has a bipolar property. Therefore, the first intermediate layer 8A, along with smoothly transporting the holes from the red light emitting layer 7R to the blue light emitting layer 7B, may smoothly transport the electrons from the blue light emitting layer 7B to the red light emitting layer 7R. Also, the first intermediate layer 8A has excellent tolerance to the electrons and the holes. Therefore, degradation of the first intermediate layer 8A is prevented and as a result, the durability of the light emitting element 1 may be enhanced.

The content of the acene-based material in this first intermediate layer 8A is not particularly limited, however, 10 to 90 wt % is preferable, 30 to 70 wt % is more preferable, and 40 to 60 wt % is even more preferable.

Also, as the component material of the first intermediate layer 8A, it is particularly preferable that an amine-based material (an amine derivative) in addition to the acene-based material described above be included.

An amine-based material (a material having an amine skeleton) has an excellent hole transport property and the acene-based material described above (a material having an acene skeleton) has an excellent electron transport property. As a result, the first intermediate layer 8A has both an electron transport property and a hole transport property. That is, the first intermediate layer 8A has a bipolar property. If the first intermediate layer 8A has a bipolar property in this way, it is possible that the holes are smoothly transferred from the red light emitting layer 7R to the blue light emitting layer 7B through the first intermediate layer 8A and the electrons are smoothly transferred from the blue light emitting layer 7B to the red light emitting layer 7R through the first intermediate layer 8A. As a result, the electrons and the holes are efficiently injected to the red light emitting layer 7R and the blue light emitting layer 7B, respectively and are emitted.

Also, this first intermediate layer 8A is excellent in tolerance to the carriers (electrons and holes) since it has a bipolar property. Also, from the fact that the acene-based material is excellent in tolerance to excitons, degradation of the first intermediate layer 8A may be prevented or suppressed even when the excitons are generated by the reunion of the electrons and the holes in the first intermediate layer 8A, thus the deterioration of the first intermediate layer 8A is prevented or suppressed, and as a result, an excellent durability of the light emitting element 1 may be achieved.

The amine-based material used in the first intermediate layer 8A is not particularly limited as long as it has an amine skeleton and also, has an effect as described above, and, for example, a material having the amine skeleton of the hole transporting materials described above may be used, however, a bendizine-based amine derivative is preferable.

Particularly, among the bendizine-based amine derivatives, a material adopting two or more naphthyl groups is preferable as the amine-based material used in the first intermediate layer 8A. As this bendizine-based amine derivative, for example, N,N'-bis(1-naphthyl)-N,N'-diphenyl[1,1'-biphenyl]-4,4'-diamine(α-NPD) represented by following Chemical Formula (22) or N,N,N',N'-tetranaphthylbendizine (TNB) represented by following Chemical Formula (23) or the like may be included.

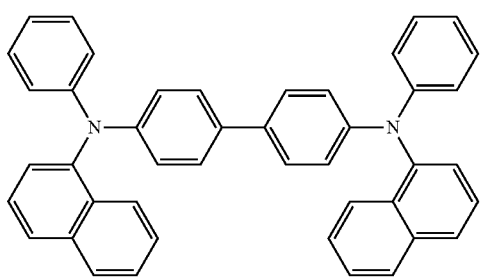

(22)

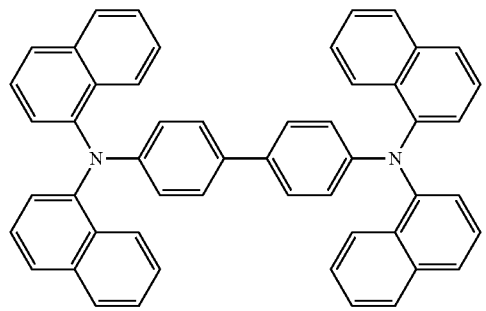

(23)

This amine-based material, generally, has an excellent hole transport property and hole mobility of the amine-based material is better than hole mobility of the acene-based material described later. Therefore, the holes may be smoothly transferred from the red light emitting layer 7R to the blue light emitting layer 7B through the first intermediate layer 8A.

The content of the amine-based material in this first intermediate layer 8A is not particularly limited, however, 10 to 90 wt % is preferable, 30 to 70 wt % is more preferable, and 40 to 60 wt % is even more preferable.

Also, the average thickness of the first intermediate layer 8A is not particularly limited, however, 1 to 100 nm is preferable, 3 to 50 nm is more preferable, and 5 to 30 nm is even more preferable. As a result, movement of the holes and the electrons between the red light emitting layer 7R and the blue light emitting layer 7B may be definitely adjusted by the first intermediate layer 8A while the driving voltage is suppressed.

With regard to this, if the average thickness of the first intermediate layer 8A is above the upper limit, either the driving voltage may be noticeably increased or light emission (white light emission, in particular) of the light emitting element 1 may become difficult depending on the component material of the first intermediate layer 8A or the like. On the other hand, if the average thickness of the first intermediate layer 8A is below the lower limit, it is possible that adjusting the movement of the holes and the electrons between the red light emitting layer 7R and the blue light emitting layer 7B definitely by the first intermediate layer 8A may become difficult depending on the component material of the first intermediate layer 8A, the driving voltage or the like.

Blue Light Emitting Layer

This blue light emitting layer 7B emits blue light as emission light (visible light) by an electric voltage being applied between the anode 3 and the cathode 11 described above.

This blue light emitting layer 7B includes the blue light emitting material which emits blue light.

The blue light emitting material such as this is not particularly limited, and a variety of blue fluorescent materials or phosphorescent materials may be used either alone or as a combination of two or more.

The blue fluorescent material is not particularly limited as long as it emits blue fluorescence and, for example, a styrylamine derivative such as a styrylamine-based compound expressed by following Chemical Formula (24A) or by following Chemical Formula (24B), a fluoranthene derivative, a pyrene derivative, perylene and a perylene derivative, an anthracene derivative, a benzoxazole derivative, a benzothiazole derivative, a benzoimidazole derivative, a chrysene derivative, a phenanthrene derivative, a distyrylbenzene derivative, tetraphenylbutadiene, 4,4'-bis(9-ethyl-3-carbazovinylene)-1.1'-biphenyl (BCzVBi), poly[(9,9-dioctylflouorene-2,7-diyl)-co-(2,5-dimethoxybenzene-1,4-diyl)], poly[(9,9-dihexyloxyflouorene-2,7-diyl)-ortho-co-(2-methoxy-5-{2-ethoxyhexyloxy}phenylene-1,4-diyl)], poly[(9,9-dioctylflouorene-2,7-diyl)-co-(ethynylbenzene)] or the like may be included.

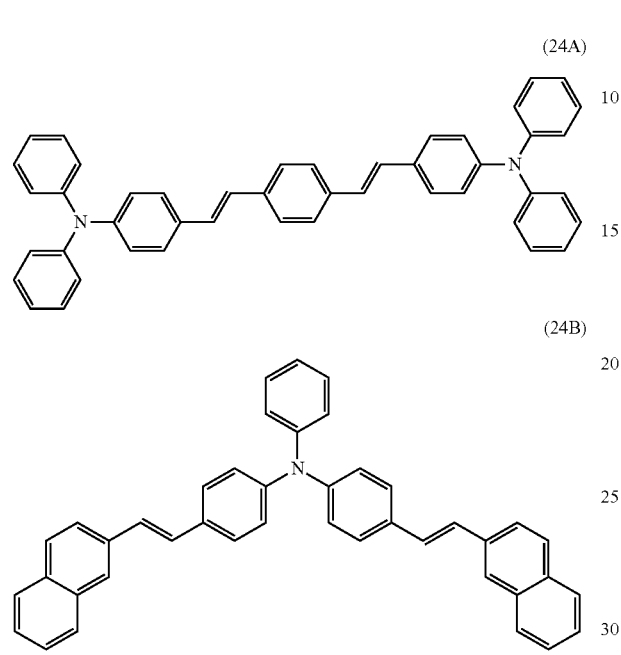

The blue phosphorescent material is not particularly limited as long as it emits blue phosphorescence and, for example, metal complexes of iridium, ruthenium, platinum, osmium, rhenium, palladium, or the like may be included, and more specifically, bis[4,6-difluorophenylpyridinate-N,$C^{2'}$]-picolinate iridium, tris[2-(2,4-difluorophenyl)pyridinate-N,$C^{2'}$]iridium, bis[2-(3,5-trifluorophenyl)pyridinate-N,$C^{2'}$]-picolinate iridium, bis(4,6-difluorophenylpyridinate-N,$C^{2'}$) iridium(acetylacetonate) or the like may be included.

Also, in the blue light emitting layer 7B, it is preferable that a host material in which the blue light emitting material is a guest material be included in addition to the blue light emitting material described above.

As this host material, the same material described as the host material included in the infrared light emitting layer 6 may be used.

Green Light Emitting Layer

This green light emitting layer 7G emits green light as emission light (visible light) by an electric voltage being applied between the anode 3 and the cathode 11 described above.

This green light emitting layer 7G includes the green light emitting material which emits green light.

The green light emitting material such as this is not particularly limited, and a variety of green fluorescent materials or phosphorescent materials may be used either alone or as a combination of two or more.

The green fluorescent material is not particularly limited as long as it emits green fluorescence and, for example, a coumarin derivative, quinacridone and a derivative thereof such as a quinacridone derivative expressed by following Chemical Formula (25), 9,10-bis[(9-ethyl-3-carbazole)-vinylenyl] anthracene, poly(9,9-dihexyl-2,7-vinylenefluorenylene), poly[(9,9-dioctylfluorene-2,7-diyl)-co-(1,4-diphenylenevinylene-2-methoxy-5-{2-ethylhexyloxy}benzene)], poly[(9,9-dioctyl-2,7-di vinylenefluorenylene)-ortho-co-(2-methoxy-5-(2-ethoxylhexyloxy})-1,4-phenylene)] or the like may be included.

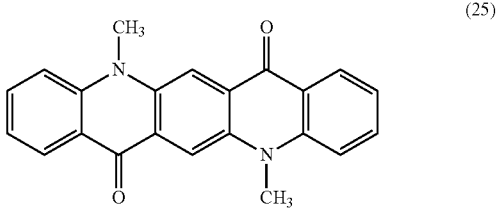 [SMILES: Cn1c2ccccc2c(=O)c2cc3c(cc21)c(=O)c1ccccc1n3C]

The green phosphorescent material is not particularly limited as long as it emits green phosphorescence and, for example, metal complexes of iridium, ruthenium, platinum, osmium, rhenium, palladium, or the like may be included, and more specifically, fac-tris(2-phenylpyridine)iridium (Ir(ppy)3), bis(2-phenylpyridinate-N,$C^{2'}$)iridium(acetylacetonate), fac-tris[5-fluoro-2-(5-trifluoromethyl-2-pyridine)-phenyl-C,N]iridium or the like may be included.

Also, in the green light emitting layer 7G, it is preferable that a host material in which the green light emitting material is a guest material be included in addition to the green light emitting material described above.

As this host material, the same material described as the host material included in the infrared light emitting layer 6 may be used.

Also, as this host material of the green light emitting layer 7G, it is preferable that an acene derivative (an acene-based material) be used in the same manner as the host material of the red light emitting layer 7R. As a result, the green light emitting layer 7G may emit red light with higher brightness or higher efficiency.

Also it is preferable that this host material of the green light emitting layer 7G be the same as the host material of the blue light emitting layer 8 described above. As a result, green light and blue light may be emitted in a balanced way since a band gap between both light emitting layers 7G and 8 is not formed.

Electron Transport Layer

The electron transport layer 9 has a function to transport the electrons injected from the cathode 11 through the electron injection layer 10 to the green light emitting layer 7G.

As a component material for the electron transport layer 9 (an electron transporting material), for example, a phenanthroline derivative such as 2,9-dimethyl-4,7-diphenyl-1,10-phenanthroline (BCP), a quinoline derivative such as an organic metal complex which uses 8-quinolinol such as tris(8-quinolinolato)aluminum ($Alq_3$) or a derivative thereof as a ligand, an azaindolizine derivative, an oxadiazole derivative, a perylene derivative, a pyridine derivative, a pyrimidine derivative, a quinoxaline derivative, a diphenylquinone derivative, a nitro-substituted fluorene derivative or the like may be used and be used either alone or as a combination of two or more.

Among these, as the electron transporting material used in the electron transport layer 9, an azaindolizine derivative is preferable and it is particularly preferable that a compound having an azaindolizine skeleton and an anthracene skeleton within the molecule (hereinafter, also referred to as an "azaindolizine-based compound") be used.

As the electron transporting material used in the electron transport layer 9 adjacent to the green light emitting layer 7G, since the compound having an azaindolizine skeleton and an anthracene skeleton within the molecule is used, it is possible to efficiently transport the electrons from the electron transport layer 9 to the green light emitting layer 7G. Therefore high light emitting efficiency of the light emitting element 1 may be achieved.

Also, since the electron transport from the electron transport layer 9 to the green light emitting layer 7G may be efficiently performed, it is possible to lower the driving voltage of the light emitting element 1, and therefore, to extend the life of the light emitting element 1.

In addition, since the compound having an azaindolizine skeleton and an anthracene skeleton within the molecule shows an excellent stability (tolerance) toward electrons and holes, in this regard, it is possible to extend the life of the light emitting element 1 as well.

As the electron transporting material (azaindolizine-based compound) used in the electron transport layer 9, for example, it is preferable that the number of the azaindolizine skeletons and the anthracene skeletons included within one molecule be one or two. As a result, the electron transport property and the electron injection property of the electron transport layer 9 may be excellent.

Specifically, as the azaindolizine-based compound used in the electron transport layer 9, for example, it is preferable that compounds expressed by following Formulae ELT-A1 to ELT-A24, compounds represented by following Formulae ELT-B1 to ELT-B12, and compounds expressed by following ELT-C1 to ELT-C20 be used.

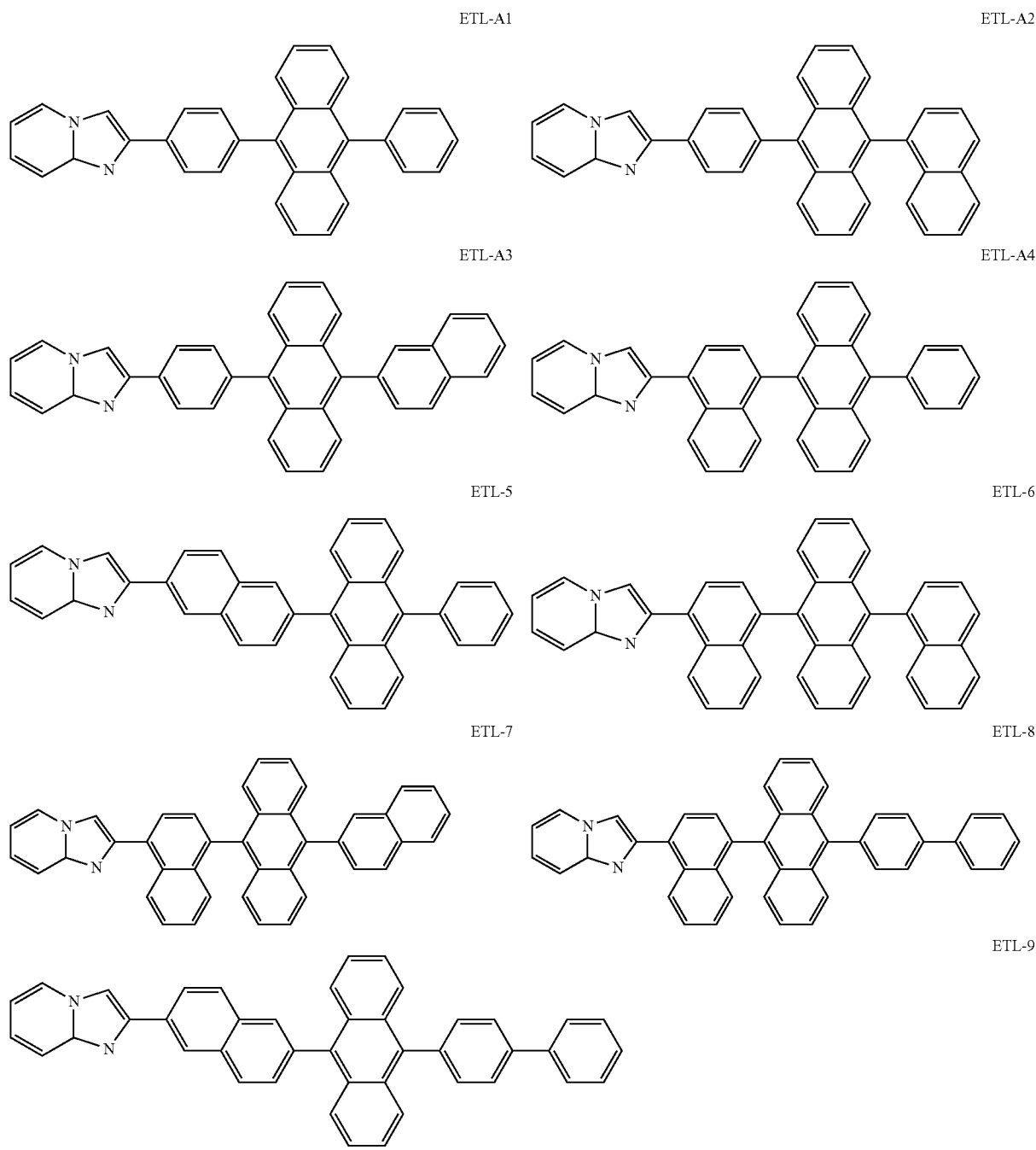

-continued
ETL-A10
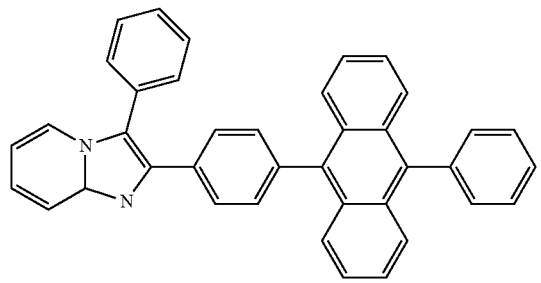
ETL-A11
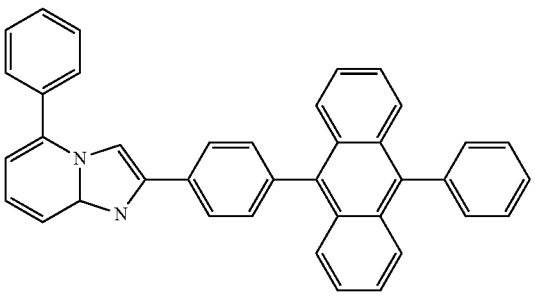
ETL-12
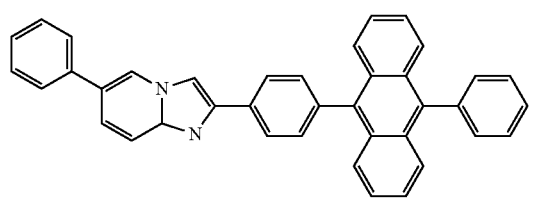
ETL-13
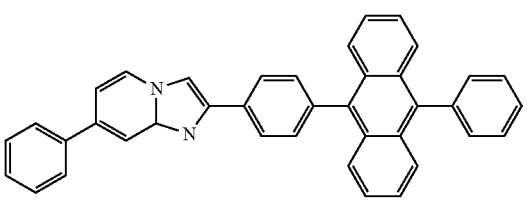
ETL-14
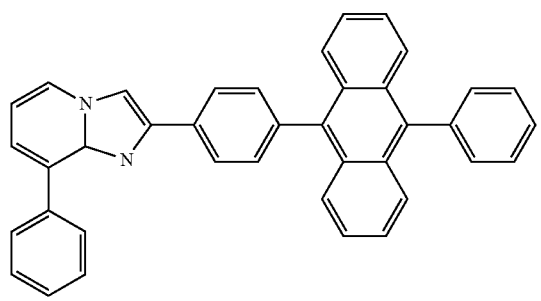
ETL-15
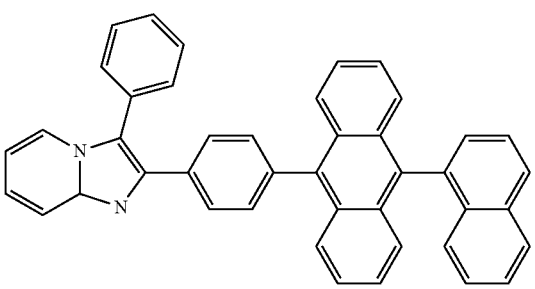
ETL-16
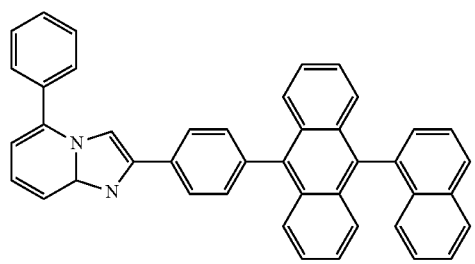
ETL-17
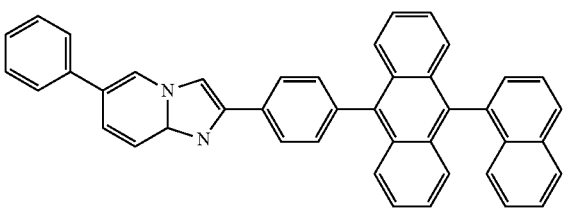
ETL-18
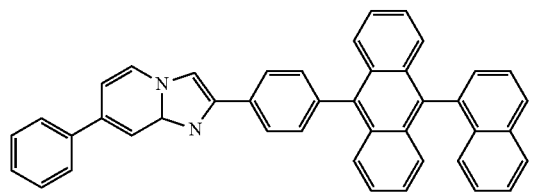
ETL-19
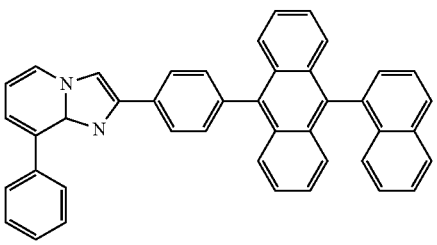

-continued
ETL-20
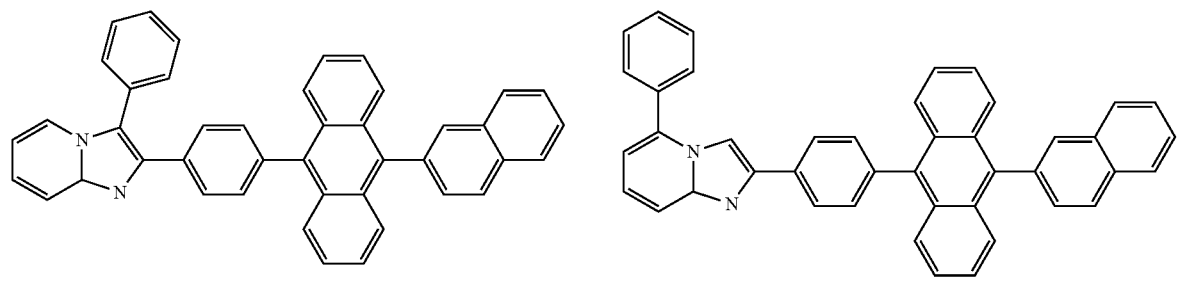
ETL-21
ETL-22
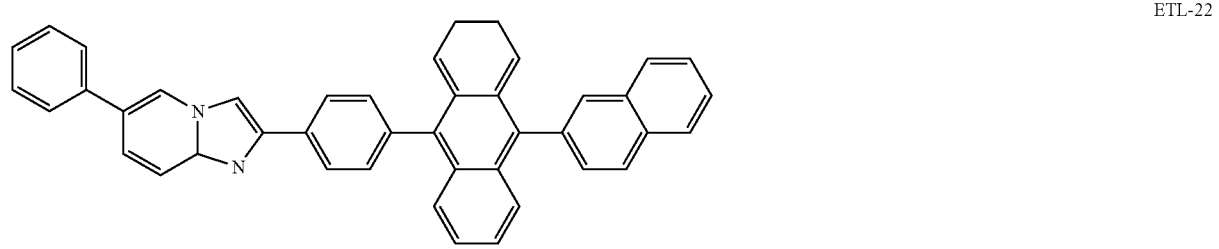
ETL-A23
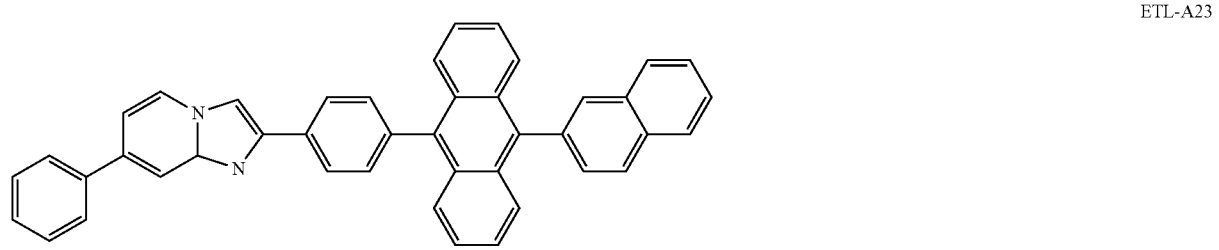
ETL-A24
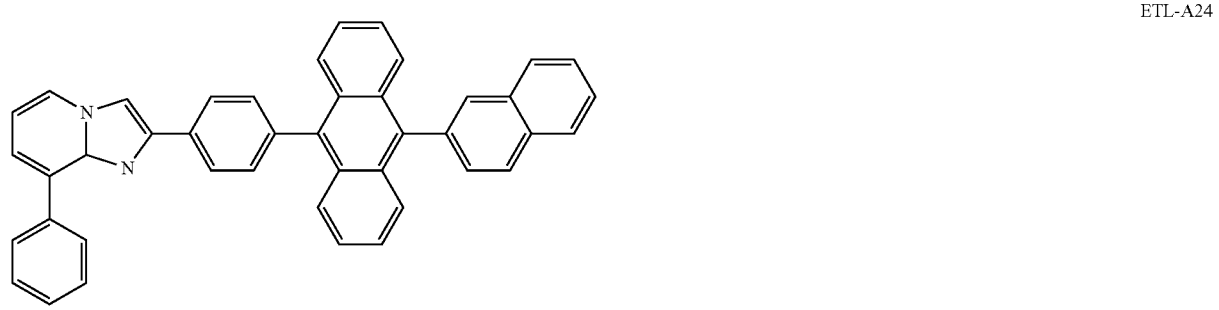
ETL-B1
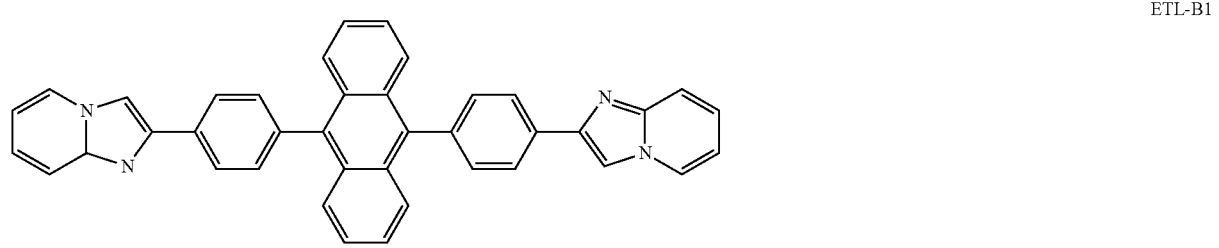

ETL-B2
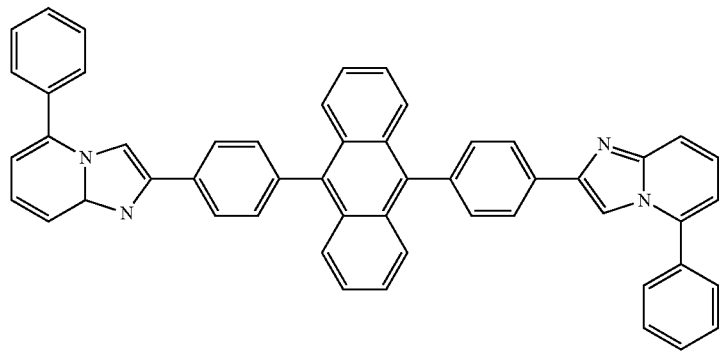
ETL-B3
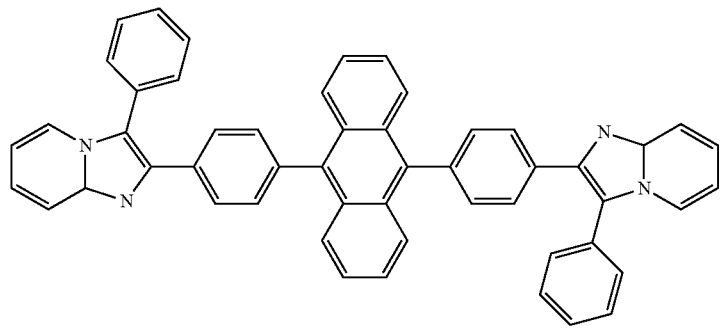
ETL-B4
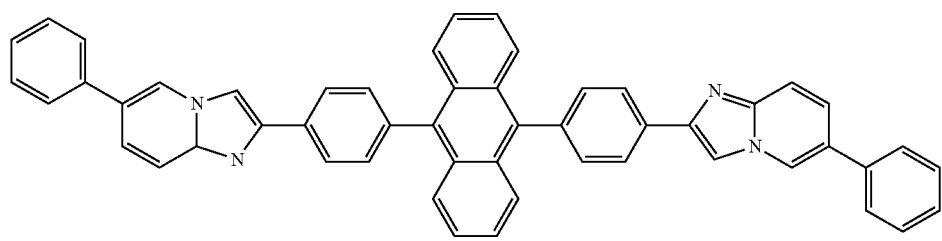
ETL-B5
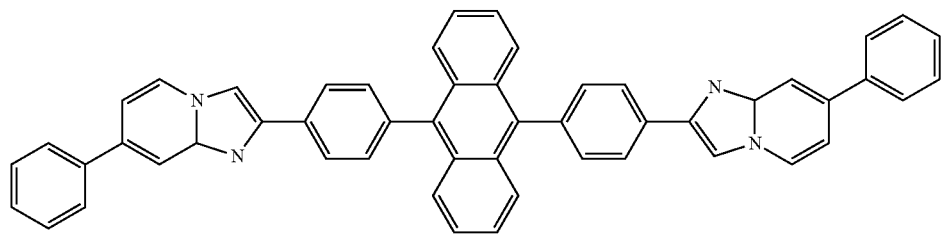
ETL-B6
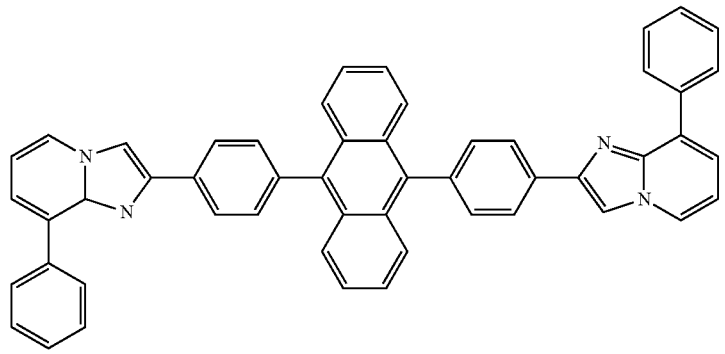

-continued
ETL-B7
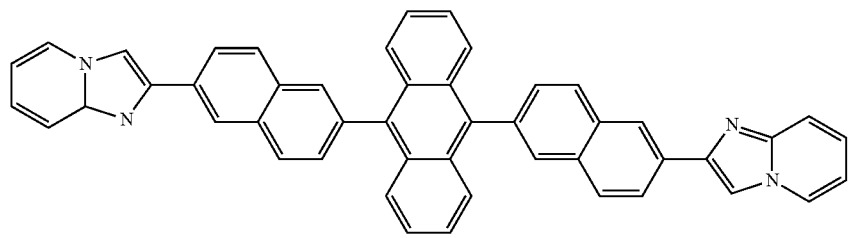
ETL-B8
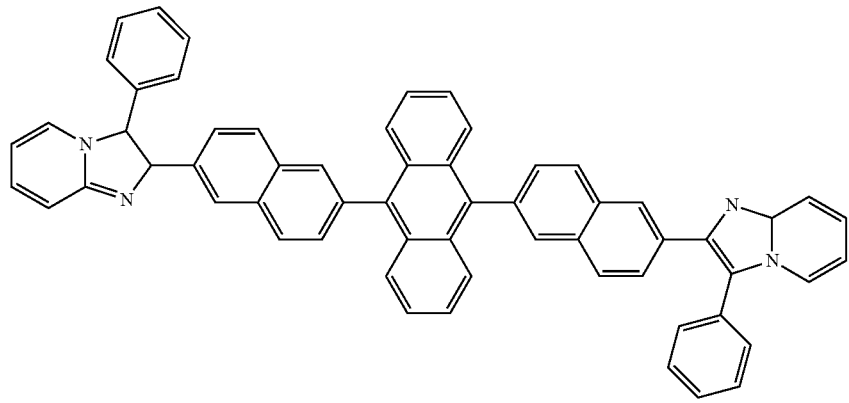
ETL-B9
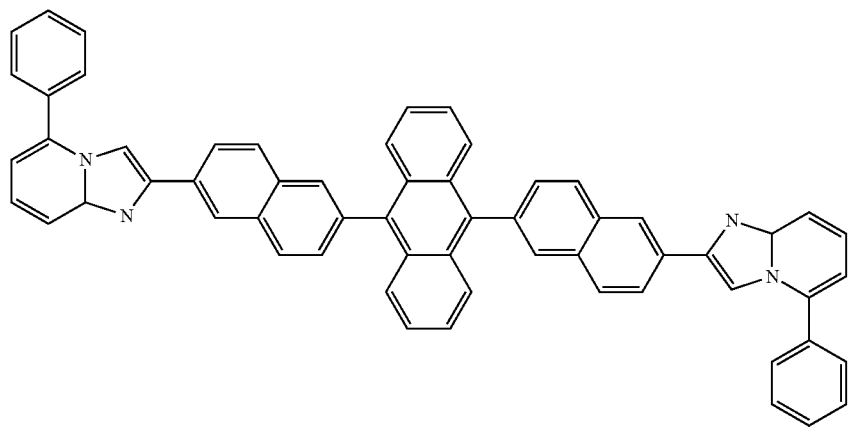
ETL-B10
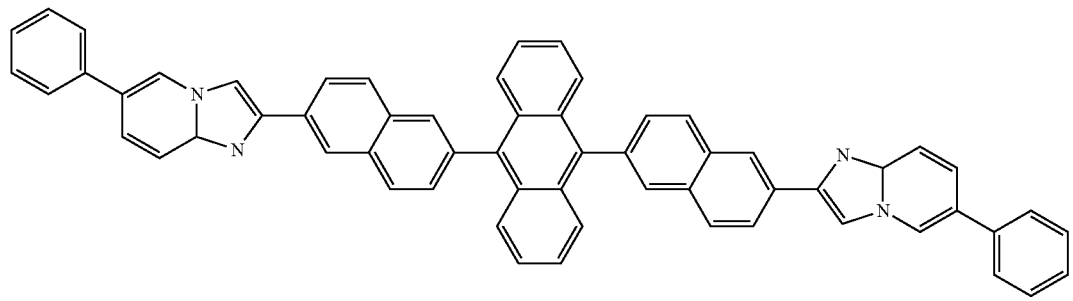
ETL-B11
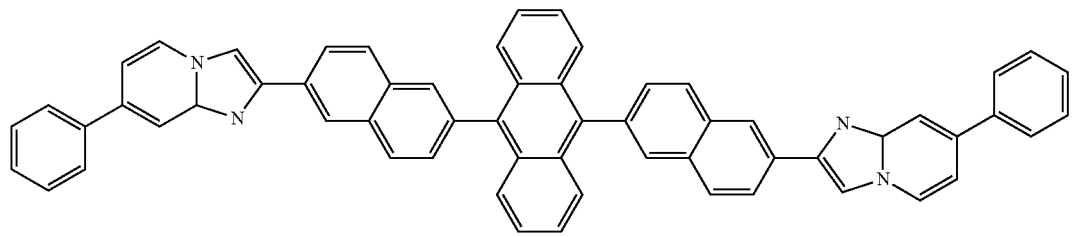

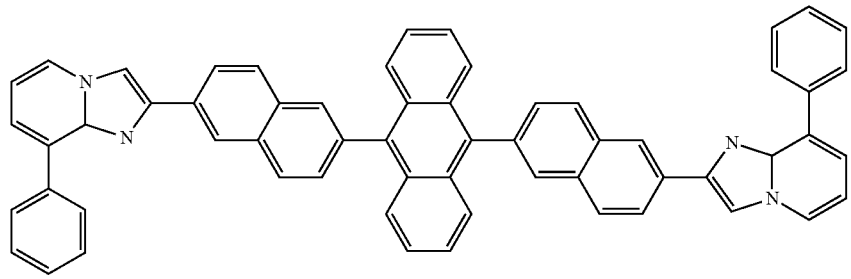
ETL-B12
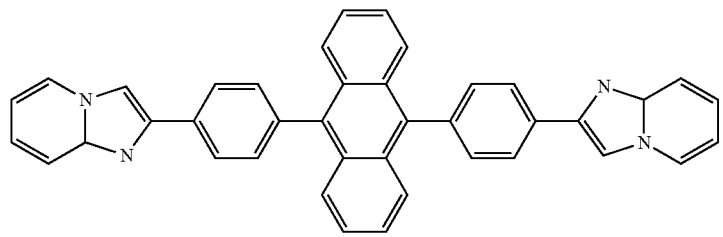
ETL-C1
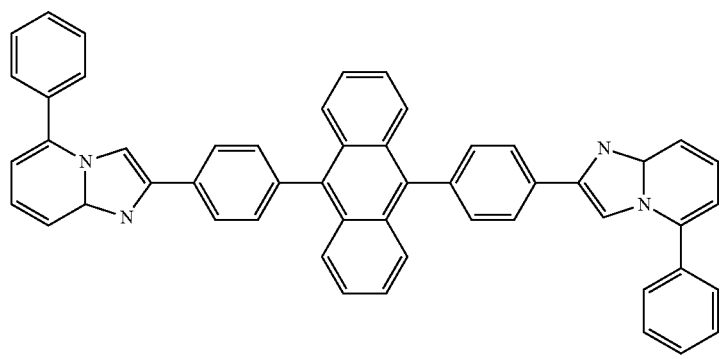
ETL-C2
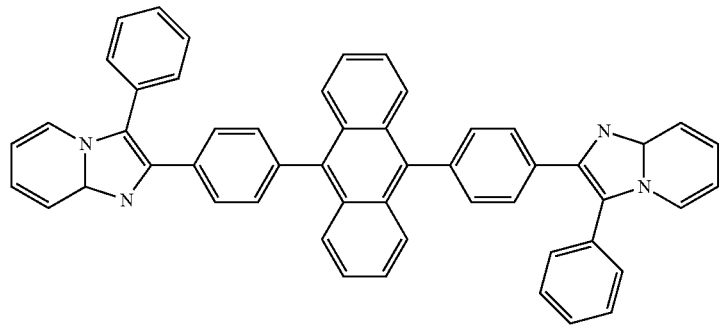
ETL-C3
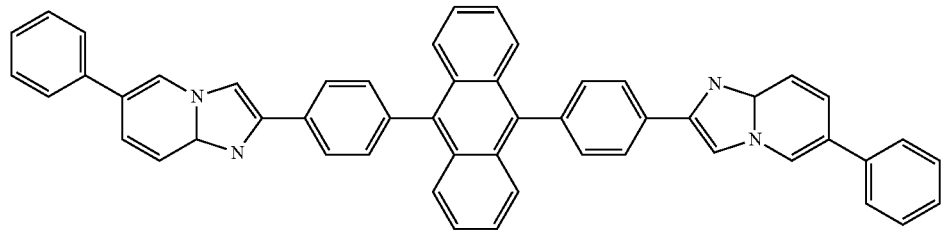
ETL-C4

-continued
ETL-C5
ETL-C6
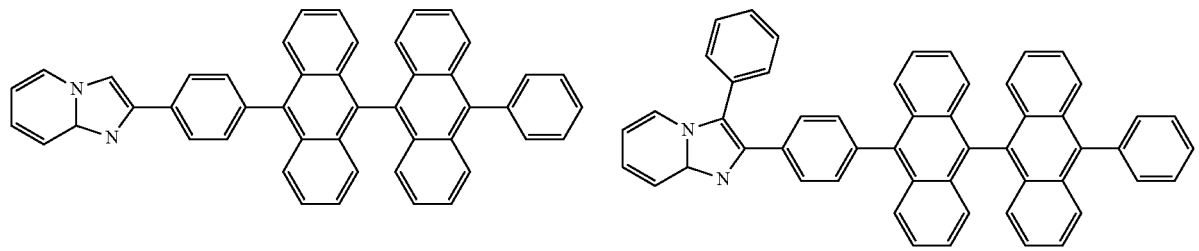
ETL-C7
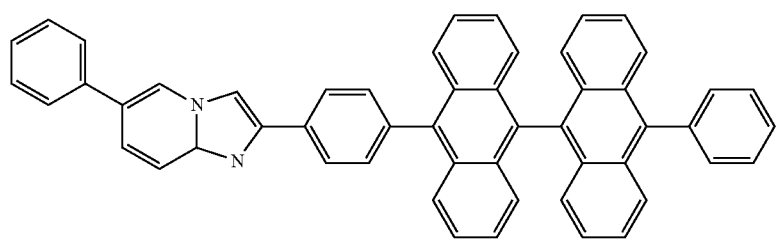
ETL-C8
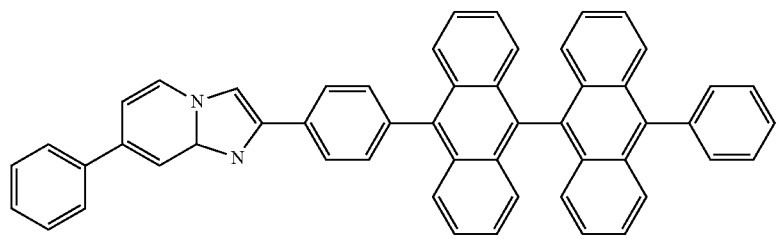
ETL-C9
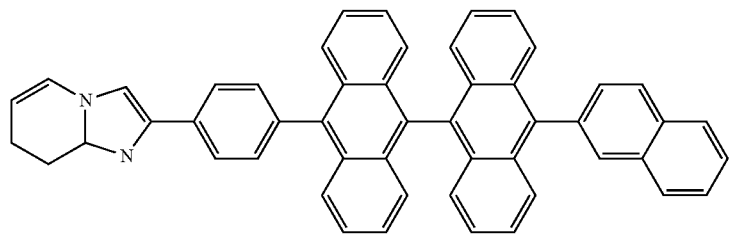
ETL-C10
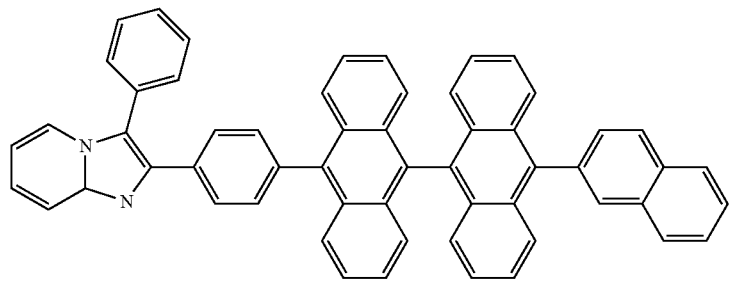
ETL-C11
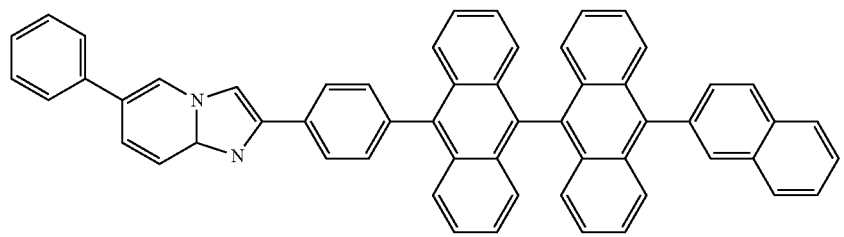

-continued
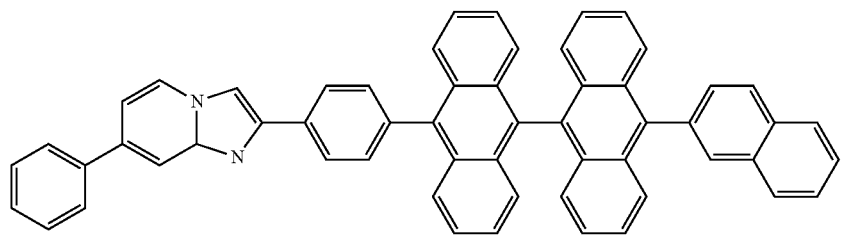
ETL-C12
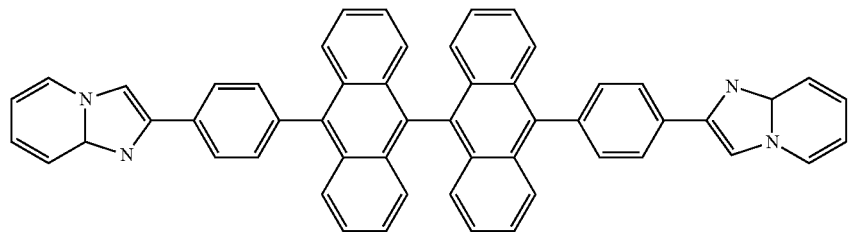
ETL-C13
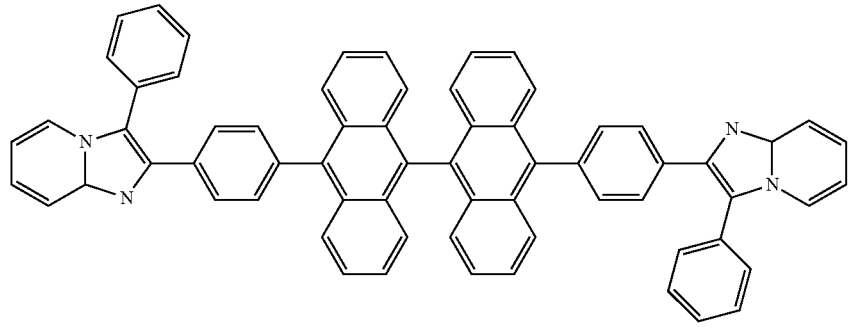
ETL-C14
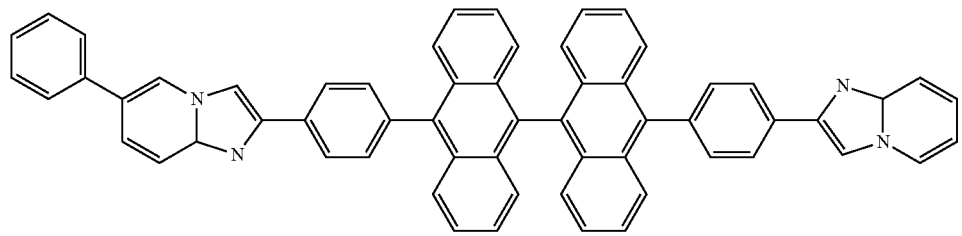
ETL-C15
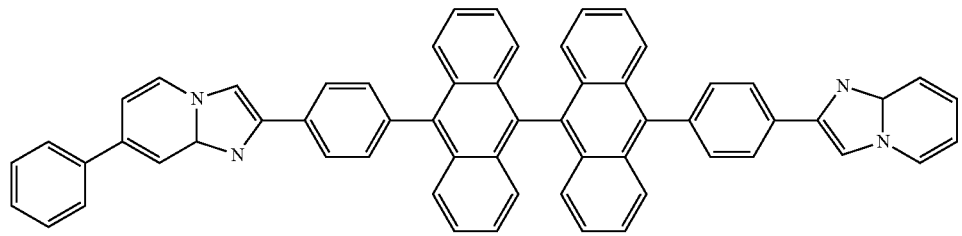
ETL-C16
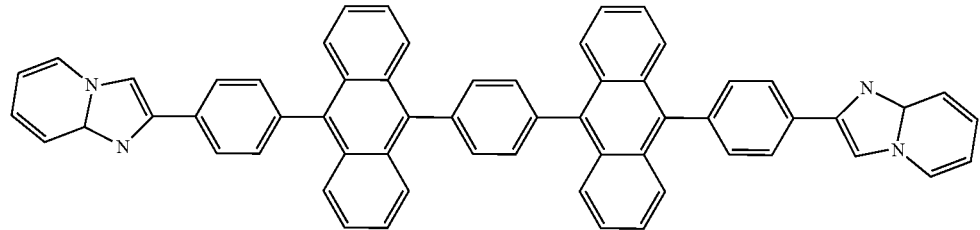
ETL-C17

ETL-C18

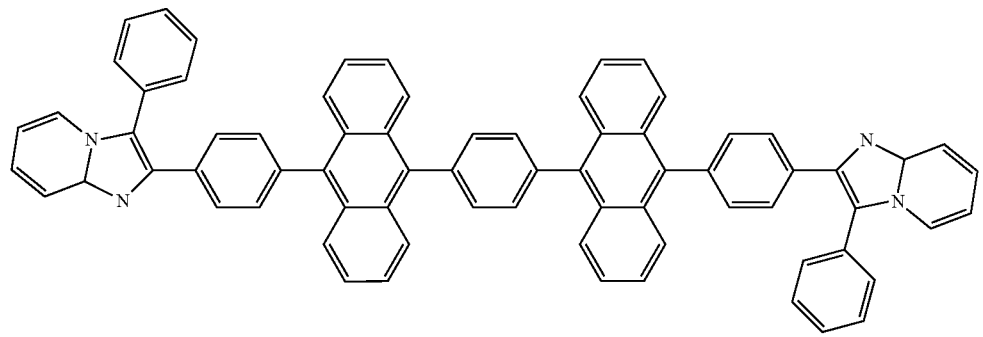

ETL-C19

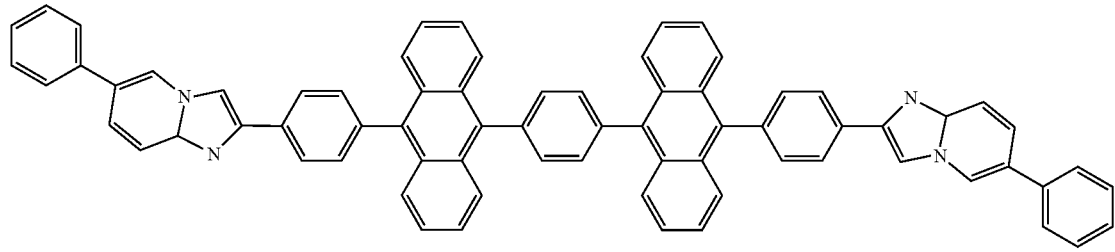

ETL-C20

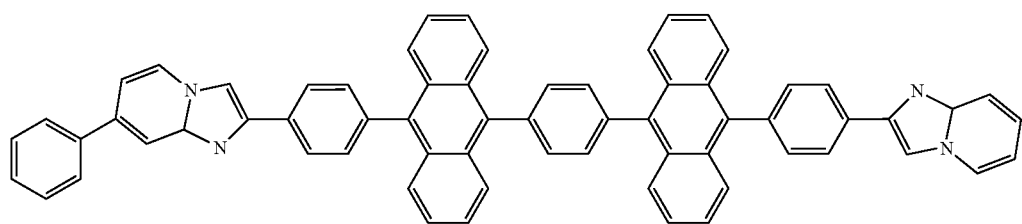

The azaindolizine compound such as this is excellent in terms of the electron transport property and the electron injection property. Therefore, light emitting efficiency of the light emitting element 1 may be increased.

The reason that the electron transport property and the electron injection property of the azaindolizine-based compound such as this are excellent is considered to be as follows.

As described above, in the azaindolizine-based compound having the azaindolizine skeleton and the anthracene skeleton within the molecule, since the entire molecule is connected by a π conjugated system, an electron cloud is spread over the entire molecule.

The azaindolizine skeleton portion in the azaindolizine-based compound such as this also has a function to receive electrons and to deliver the electrons received to the anthracene skeleton portion. Meanwhile, the anthracene skeleton portion in the azaindolizine-based compound such as this has a function to receive electrons from the azaindolizine skeleton portion and to transfer the electrons received to the layer adjacent to the anode 3 side of the electron transport layer 9, that is, the green light emitting layer 7G.

Specifically, the azaindolizine skeleton portion in the azaindolizine-based compound such as this has two nitrogen atoms, a nitrogen atom at one side (near the anthracene skeleton portion) with an sp2 hybrid orbital and a nitrogen atom at the other side (far from the anthracene skeleton portion) with an sp3 hybrid orbital. The nitrogen atom with the sp2 hybrid orbital, at the same time forms part of the conjugated system of the molecule in the azaindolizine-based compound, and functions as a part which accepts the electrons, since a nitrogen atom has a higher electronegativity than a carbon atom and is likely to attract the electrons. On the other hand, for the nitrogen atom with the sp3 hybrid orbital, even though it is not in a normal conjugated system, since the nitrogen has a lone electron pair, these electrons function as a part which transport the electrons toward the conjugated system of the molecule in the azaindolizine-based compound.

On the other hand, the anthracene skeleton in the azaindolizine-based compound, since it is electrically neutral, may easily accept the electrons from the portion of the azaindolizine skeleton. Also, the anthracene skeleton portion in the azaindolizine-based compound easily transfers the electrons to the host material in the green light emitting layer 7G, since the overlap of the orbital between the anthracene skeleton and the component material for the green light emitting layer 7G, particularly the host material (acene-based material) is large.

Also, the azaindolizine-based compound such as this, since it is excellent in terms of the electron transport property and the electron injection property as described above, may, as a result, lower the driving voltage of the light emitting element 1.

Also, the azaindolizine skeleton portion is stable when the nitrogen atom with the sp2 hybrid orbital is reduced and is also stable when the nitrogen atom with the sp3 hybrid orbital is oxidized. For this reason, stability of the azaindolizine-based compound such as this with regard to the electrons and the holes is high. As a result, it is possible to extend the life of the light emitting element 1.

Also, in a case in which the electron transport layer 9 is used as a combination of two or more electron transporting materials as described above, it may be composed of mixed materials of two or more electron transporting materials or may be composed of a stacked layer in which a plurality of layers composed of different electron transporting materials are stacked.

The average thickness of the electron transport layer 9 such as this, while not particularly limited, is preferably about 1.0 to 200 nm and more preferably about 10 to 100 nm.

Electron Injection Layer

The electron injection layer 10 has a function to increase the efficiency of electron injection from the cathode 11. As a component material for the electron injection layer 10 (an electron injection material), for example, a variety of inorganic insulation materials and a variety of inorganic semiconductor materials may be used.

As the inorganic insulation material such as this, for example, an alkali metal chalcogenide (an oxide, a sulfide, a selenide, a telluride), an alkaline earth metal chalcogenide, an alkali metal halide, an alkaline earth metal halide or the like may be used and may be used alone or as a combination of two or more. By using these as main materials to form the electron ejection layer 10, it is possible to further improve the electron injection property. In particular, an alkali metal compound (an alkali metal chalcogenide, an alkali metal halide or the like) has a very small work function; therefore, by using it to form the electron ejection layer 10, high brightness of the light emitting element 1 may be obtained.

As alkali metal chalcogenides, for example, $Li_2O$, LiO, $Na_2S$, $Na_2Se$, NaO or the like may be used.

As alkaline earth metal chalcogenides, for example, CaO, BaO, SrO, BeO, BaS, MgO, CaSe or the like may be used.

As alkali metal halides, for example, CsF, LiF, NaF, KF, LiCl, KCl, NaCl or the like may be used.

As alkaline earth metal halides, for example, $CaF_2$, $BaF_2$, $SrF_2$, $MgF_2$, $BeF_2$ or the like may be used.

Also, as an inorganic semiconductor material, for example, an oxide, a nitride, or a nitride-oxide containing at least one element of Li, Na, Ba, Ca, Sr, Yb, Al, Ga, In, Cd, Mg, Si, Ta, Sb, and Zn may be used and may be used alone or as a combination of two or more.

The average thickness of the electron injection layer 10 such as this, while not particularly limited, is preferably about 0.1 to 1,000 nm, more preferably about 0.2 to 100 nm, and even more preferably about 0.2 to 50 nm.

Also, the electron injection layer 10, depending on the component material or the thickness or the like of the cathode 11 and the electron transport layer 9, may not be included.

Sealing Member

The sealing member 12 is installed to cover the anode 3, the stacked body 14, and the cathode 11, and has a function to seal them air-tight, and to block the oxygen or moisture. From the installation of the sealing member 12, effects such as improvement of reliability of the light emitting element 1 or prevention of an alteration and degradation (improvement of durability) may be achieved.

As a component material for the sealing member 12, for example, Al, Au, Cr, Nb, Ta, Ti or an alloy containing these, silicon oxide, a variety of resin materials or the like may be used. Also, in a case in which a material with conductivity is used as the component material for the sealing member 12, in order to prevent a short circuit, it is preferable that an insulating film be installed between the sealing member 12 and the anode 3, the stacked body 14, and the cathode 11, if necessary.

Also, the sealing member 12, as a planar type, is placed opposite to the substrate 2, and, for example, the sealant such as a heat-curable resin may be used to seal the gap.

According to the light emitting element 1 described above, along with using the thiadiazole-based material as the light emitting material of the infrared light emitting layer 6, by using the tetracene-based material or the anthracene-based material as the host material of the infrared light emitting layer 6, it is possible to achieve a high efficiency and long life along with emission light in a near-infrared region.

The light emitting element 1 described above may be prepared, for example, as follows.

[1] First, the substrate 2 is prepared and the anode 3 is formed on the substrate 2.

The anode 3 may be formed using, for example, a plasma CVD, chemical vapor deposition (CVD) such as a thermal CVD, a dry plating method such as a vacuum deposition, a wet plating method such as an electrolytic plating, a spraying method, a sol-gel method, a MOD method, metal foil joining or the like.

[2] Next, the hole injection layer 4 is formed on the anode 3.

The hole injection layer 4 is preferably formed from, for example, a vapor phase process using CVD or a dry plating method such as vacuum deposition and sputtering.

Also, the hole injection layer 4 may be formed, for example, as follows. A hole injection layer forming material obtained by dissolving the hole injection material in a solvent or by dispersing into a dispersion medium is supplied on the anode 3 and then is dried (removing the solvent or the dispersion medium).

As a method of supplying the hole injection layer forming material, for example, a variety of coating methods such as a spin coating method, a roll coating method, and an ink jet printing method may be used. These coating methods enable the hole injection layer 4 to be formed relatively easily.

As the solvent or the dispersion medium used to prepare the hole injection layer forming material, examples include various inorganic solvents, various organic solvents or a mixed solvent containing these.

Also, the drying may be carried out by, for example, leaving to stand under atmospheric pressure or reduced pressure, a heat treatment, spraying an inert gas or the like.

Also, prior to this step, an oxygen plasma treatment may be performed on the upper surface of the anode 3. By doing so, it is possible to impart a lyophilic property on the upper surface of the anode 3, to remove (wash off) the organic matter attached to the upper surface of the anode 3, and to adjust a work function near the surface of the anode 3 and the like.

Here, as a condition for the oxygen plasma treatment, for example, it is preferable that a plasma power be about 100 to 800 W, an oxygen gas flow rate be about 50 to 100 mL/min, a transport rate of the treated member (the anode 3) be about 0.5 to 10 mm/sec, and the temperature of the substrate 2 be about 70 to 90° C.

[3] Next, the hole transport layer 5 is formed on the hole injection layer 4.

The hole transport layer 5, is preferably formed from, for example, a vapor phase process using CVD or a dry plating method such as vacuum deposition and sputtering.

Also, the hole transport layer 5 may be formed as follows. A hole transport layer forming material obtained by dissolving the hole transporting material in a solvent or by dispersing into a dispersion medium is supplied on the hole injection layer 4 and then is dried (removing the solvent or the dispersion medium).

[4] Next, the infrared light emitting layer 6 is formed on the hole transport layer 5.

The infrared light emitting layer 6 may be formed from, for example, a vapor phase process using a dry plating method such as a vacuum deposition.

[5] Next, the red light emitting layer 7R is formed on the infrared light emitting layer 6.

The red light emitting layer 7R may be formed from, for example, a vapor phase process using CVD or a dry plating method such as vacuum deposition and sputtering.

[6] Next, the first intermediate layer 8A is formed on the red light emitting layer 7R.

The first intermediate layer 8A may be formed from, for example, a vapor phase process using CVD or a dry plating method such as vacuum deposition and sputtering.

Also, first intermediate layer 8A may be formed, for example, as follows. A first intermediate layer forming material obtained by dissolving the component material in a solvent or by dispersing into a dispersion medium is supplied on the red light emitting layer 7R and then is dried (removing the solvent or the dispersion medium).

[7] Next, the blue light emitting layer 7B is formed on the first intermediate layer 8A.

The blue light emitting layer 7B may be formed from, for example, a vapor phase process using CVD or a dry plating method such as vacuum deposition and sputtering.

[8] Next, the green light emitting layer 7G is formed on the blue light emitting layer 7B.

The green light emitting layer 7G may be formed from, for example, a vapor phase process using CVD or a dry plating method such as vacuum deposition and sputtering.

[9] Next, the electron transport layer 9 is formed on the green light emitting layer 7G.

The electron transport layer 9 may be formed from, for example, a vapor phase process using CVD or a dry plating method such as vacuum deposition and sputtering.

Also, the electron transport layer 9 may be formed, for example, as follows. An electron transport layer forming material obtained by dissolving the electron transporting material in a solvent or by dispersing into a dispersion medium is supplied on the green light emitting layer 7G and then is dried (removing the solvent or the dispersion medium).

[10] Next, the electron injection layer 10 is formed on the electron transport layer 9.

In a case in which an inorganic material is used as the component material for the electron injection layer 10, the electron injection layer 10 may be formed, for example, from a vapor phase process using a CVD or a dry plating method such as vacuum deposition or sputtering, from coating and baking of inorganic ink particles or the like.

[11] Next, the cathode 11 is formed on the electron injection layer 10.

The cathode 11 may be formed from, for example, a vapor deposition method, a sputtering method, metal foil joining, coating or baking of metallic ink particles or the like.

From the processes described above, the light emitting element 1 may be obtained.

Lastly, the sealing member 12 is made to cover the light emitting element 1 obtained and then connect to the substrate 2.

Second Embodiment

Figure 2:
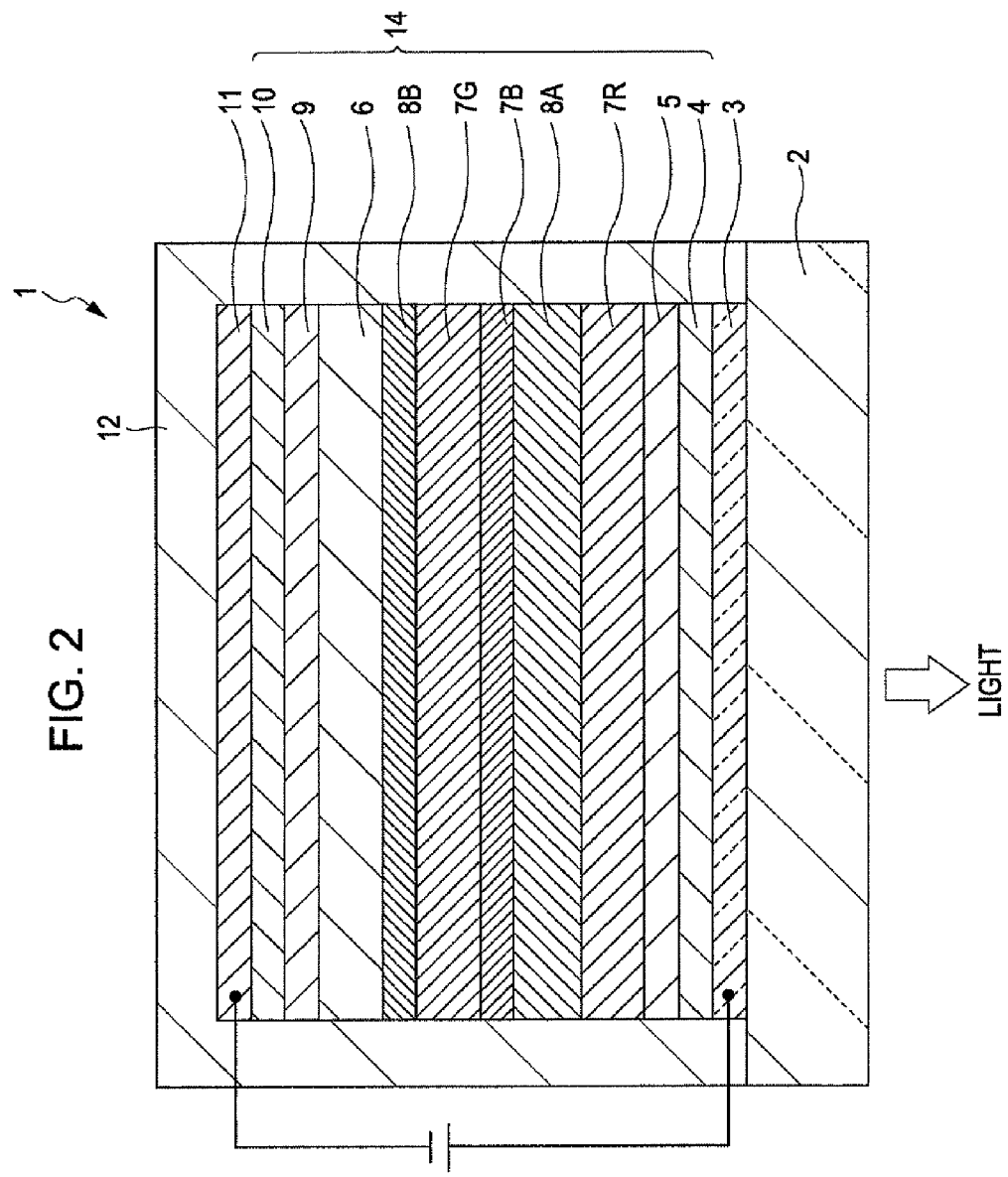
FIG. 2 is a cross-sectional diagram that schematically shows a light emitting element according to a second embodiment of the invention.

FIG. 2 is a cross-sectional diagram that schematically shows a light emitting element according to a second embodiment of the invention.

Hereinafter, the light emitting element of the second embodiment will be described focusing on the differences from that of the first embodiment and a description regarding the same matters will not be repeated.

The light emitting element 1 of the second embodiment is the same as the light emitting element of the first embodiment except that the position where the infrared light emitting layer 6 is stacked is different and also, at the stacked position, a second intermediate layer 8B is prepared between the infrared light emitting layer 6 and the green light emitting layer 7G.

That is, the light emitting element 1 shown in FIG. 2 includes the anode 3, the hole injection layer 4, the hole transport layer 5, the red light emitting layer 7R, the first intermediate layer 8A, the blue light emitting layer 7B, the green light emitting layer 7G, the second intermediate layer 8B, the infrared light emitting layer 6, the electron transport layer 9, the electron injection layer 10, and the cathode 11, all being stacked in this sequence. In other words, in the light emitting element 1, between the anode 3 and the cathode 11, the stacked body 14, in which the hole injection layer 4, the hole transport layer 5, the red light emitting layer 7R, the first intermediate layer 8A, the blue light emitting layer 7B, the green light emitting layer 7G, the second intermediate layer 8B, the infrared light emitting layer 6, the electron transport layer 9, and the electron injection layer 10 are stacked in this sequence starting from the anode 3 to the cathode 11, is interposed.

In addition, the light emitting element 1 is sealed with a sealing member 12 at the same time as the whole element is installed on a substrate 2.

In the light emitting element 1 such as this, like the light emitting element 1 of the first embodiment, a hole is introduced (injected) from the anode 3 at the same time as an electron is introduced (injected) from the cathode 11 with regard to each light emitting layer of the infrared light emitting layer 6, the red light emitting layer 7R, the blue light emitting layer 7B and the green light emitting layer 7G. Furthermore in each light emitting layer, the hole and the electron are reunited, an exciton is generated by the energy emitted from the reunion, and energy (fluorescence or phosphorescence) is released when the exciton returns to the ground state. This enables the red light emitting layer 7R, the blue light emitting layer 7B and the green light emitting layer 7G to emit red, blue, and green visible light, respectively, at the same time as the infrared light emitting layer 6 emits infrared light. As a result, the light emitting element 1 of the embodiment emits infrared light and white visible light. Also, in the embodiment, a visible light emitting layer 7 which emits visible light is formed by the three layers of the red light emitting layer 7R, the blue light emitting layer 7B and the green light emitting layer 7G.

Also, in the embodiment, movement of the holes and the electrons between the red light emitting layer 7R and the blue light emitting layer 7B may be adjusted since the light emitting element 1 has the first intermediate layer 8A between the red light emitting layer 7R and the blue light emitting layer 7B, therefore, energy transfer of the excitons between the red light emitting layer 7R and the blue light emitting layer 7B may be blocked. As a result, the red light emitting layer 7R and the blue light emitting layer 7B may emit light in a balanced way, respectively, therefore, the light emitting element 1 may emit white light as the visible light more reliably.

Also, in the embodiment, movement of the holes and the electrons between the green light emitting layer 7G and the infrared light emitting layer 6 may be adjusted since the light emitting element 1 has the second intermediate layer 8B between the green light emitting layer 7G and the infrared light emitting layer 6, therefore, energy transfer of the excitons between the green light emitting layer 7G and the infrared light emitting layer 6 may be blocked. As a result, the green light emitting layer 7G and the infrared light emitting layer 6 may emit light in a balanced way, respectively, therefore, the light emitting element 1 may emit white light as the visible light more reliably and may also emit infrared light more reliably.

The infrared light emitting layer 6 emits infrared light as emission light through an electric voltage being applied between the anode 3 and the cathode 11 described above.

This infrared light emitting layer 6 may have the same composition as the infrared light emitting layer 6 included in the light emitting element 1 according to the first embodiment, however, if the infrared light emitting layer 6 is positioned closer to the cathode 11 than other light emitting layers 7R, 7G, and 7B as in the embodiment, a quinolinolato-based metal complex such as bis(2-methyl-8-quinolinolato)(p-phenylphenolate)aluminum (BAlq) or tris(8-quinolinolato)aluminum complex ($Alq_3$) is preferably used as the host material included in the infrared light emitting layer 6. As a result, it is possible to extend the life of the infrared light emitting layer 6.

Also, the second intermediate layer 8B may have the same composition as the first intermediate layer 8A included in the light emitting element 1 according to the first embodiment.

Third Embodiment

Figure 3:
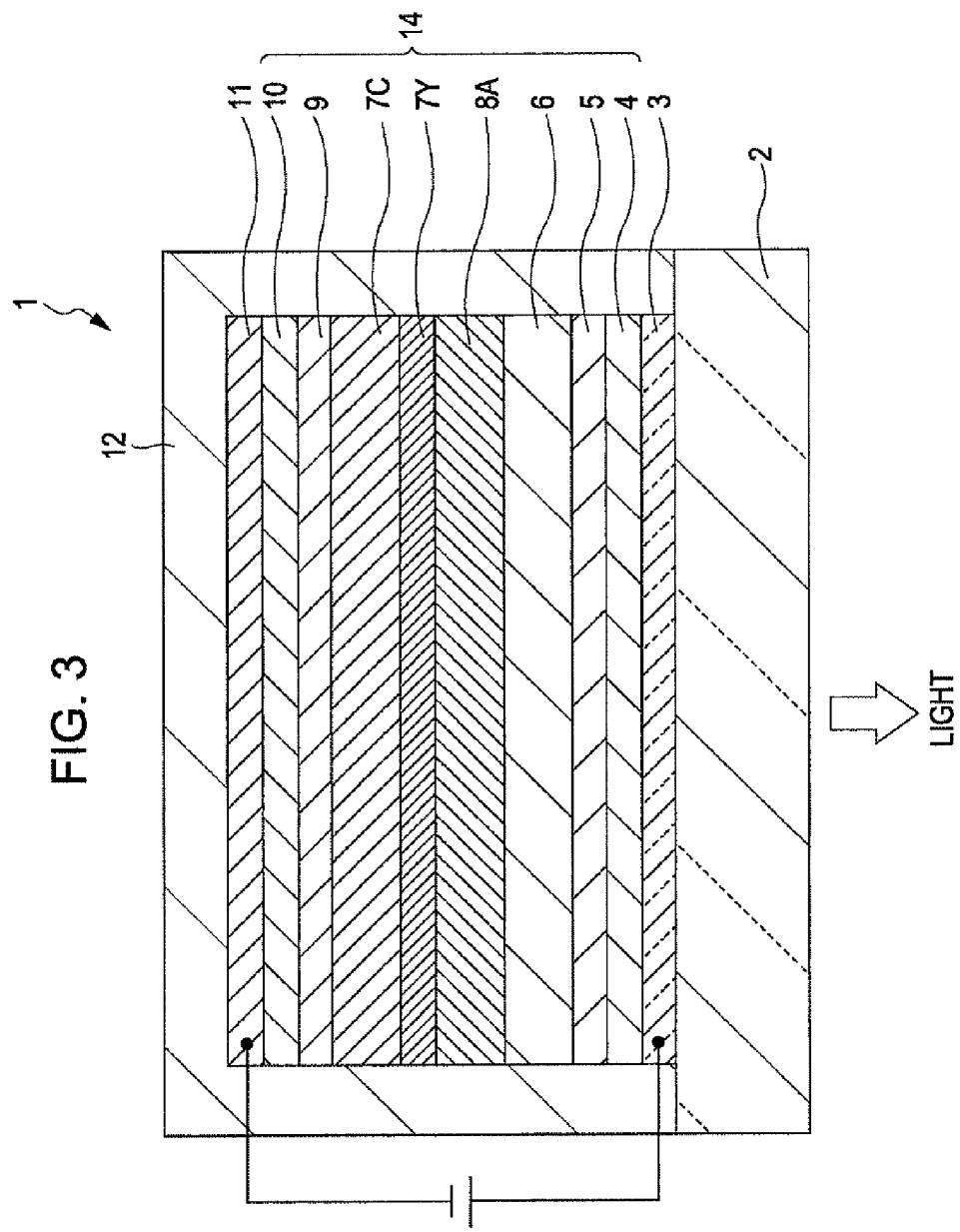
FIG. 3 is a cross-sectional diagram that schematically shows a light emitting element according to a third embodiment of the invention.

FIG. 3 is a cross-sectional diagram that schematically shows a light emitting element according to a third embodiment of the invention.

Hereinafter, the light emitting element of the third embodiment will be described focusing on the differences from that of the first embodiment and the description on the same matters will not be repeated.

The light emitting element of the third embodiment is the same as the light emitting element 1 of the first embodiment except that the red light emitting layer 7R, the blue light emitting layer 7B, and the green light emitting layer 7G are not formed and the yellow light emitting layer 7Y, and the cyan light emitting layer 7C are formed.

That is, the light emitting element 1 shown in FIG. 3 includes the anode 3, the hole injection layer 4, the hole transport layer 5, the infrared light emitting layer 6, the first intermediate layer 8A, the yellow light emitting layer 7Y, the cyan light emitting layer 7C, the electron transport layer 9, the electron injection layer 10, and the cathode 11, all being stacked in this sequence. In other words, in the light emitting element 1, between the anode 3 and the cathode 11, the stacked body 14, in which the hole injection layer 4, the hole transport layer 5, the infrared light emitting layer 6, the first intermediate layer 8A, the yellow light emitting layer 7Y, the cyan light emitting layer 7C, the electron transport layer 9, and the electron injection layer 10 are stacked in this sequence starting from the anode 3 to the cathode 11, is interposed.

In addition, the light emitting element 1 is sealed with a sealing member 12 at the same time as the whole element is installed on a substrate 2.

In the light emitting element 1 such as this, a hole is introduced (injected) from the anode 3 at the same time as an electron is introduced (injected) from the cathode 11 with regard to each light emitting layer of the infrared light emitting layer 6, the yellow light emitting layer 7Y and the cyan light emitting layer 7C. Furthermore in each light emitting layer, the hole and the electron are reunited, an exciton is generated by the energy emitted from the reunion, and energy (fluorescence or phosphorescence) is released when the exciton returns to the ground state. This enables the yellow light emitting layer 7Y and the cyan light emitting layer 7C to emit yellow and cyan visible light, respectively, at the same time as the infrared light emitting layer 6 emits infrared light. As a result, the light emitting element 1 of the embodiment emits infrared light and white visible light. Also, in the embodiment, a visible light emitting layer 7 which emits visible light is formed by the two layers of the yellow light emitting layer 7Y and the cyan light emitting layer 7C.

Yellow Light Emitting Layer

The yellow light emitting layer 7Y emits yellow light as emission light (visible light) by an electric voltage being applied between the anode 3 and the cathode 11 described above.

This yellow light emitting layer 7Y includes the yellow light emitting material which emits yellow light.

The yellow light emitting material such as this is not particularly limited, and a variety of yellow fluorescent materials or phosphorescent materials may be used either alone or as a combination of two or more. The yellow fluorescent material is not particularly limited as long as it emits yellow fluorescence and, for example, a tetracene-based compound expressed by following Chemical Formula (26A), tetraphenylnaphthacene (common name: rubrene) or the like may be included, and may be used either alone or as a combination of two or more.

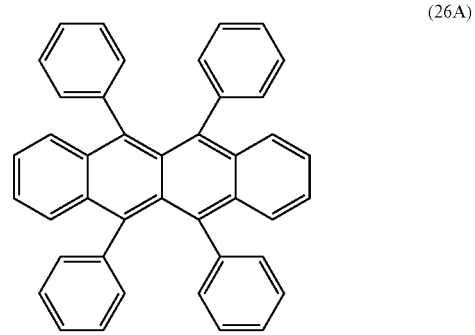 [SMILES: c1ccc(-c2c3ccccc3c(-c3ccccc3)c3c(-c4ccccc4)c4ccccc4c(-c4ccccc4)c23)cc1]

(26A)

Also, the yellow phosphorescent material is not particularly limited as long as it emits yellow phosphorescence and, for example, tris(2-phenylquinoline)iridium(III) expressed by following Formula (26B) or the like may be included.

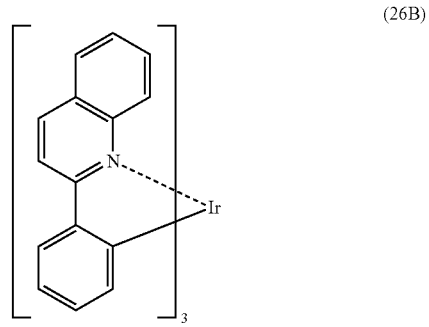

(26B)

Cyan Light Emitting Layer

The cyan light emitting layer 7C emits cyan light as emission light (visible light) by an electric voltage being applied between the anode 3 and the cathode 11 described above.

This cyan light emitting layer 7C includes the cyan light emitting material which emits cyan light.

The cyan light emitting material such as this is not particularly limited, and a variety of cyan fluorescent materials or phosphorescent materials may be used either alone or as a combination of two or more.

The cyan fluorescent material is not particularly limited as long as it emits cyan fluorescence and, for example, a styrylamine derivative such as a styrylamine-based compound expressed by following Chemical Formula (24A), 4,4'-bisphenylaminodistilbene or the like may be included and may be used either alone or as a combination of two or more.

The cyan phosphorescent material is not particularly limited as long as it emits cyan phosphorescence and, for example, bis(3,5-difluoro-2-(2-pyridyl)phenyl)-(2-carboxypyridyl)iridium(III) expressed by following Formula (27) or the like may be included.

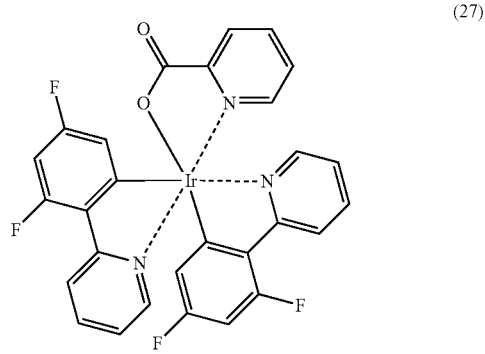

(27)

Also, in the yellow light emitting layer 7Y and the cyan light emitting layer 7C, it is preferable that, respectively, a host material in which the yellow light emitting material and the cyan light emitting material is a guest material be included in addition to the yellow light emitting material and the cyan light emitting material described above.

As this host material, the same material described as the host material included in the infrared light emitting layer 6 may be used.

Fourth Embodiment

Figure 4:
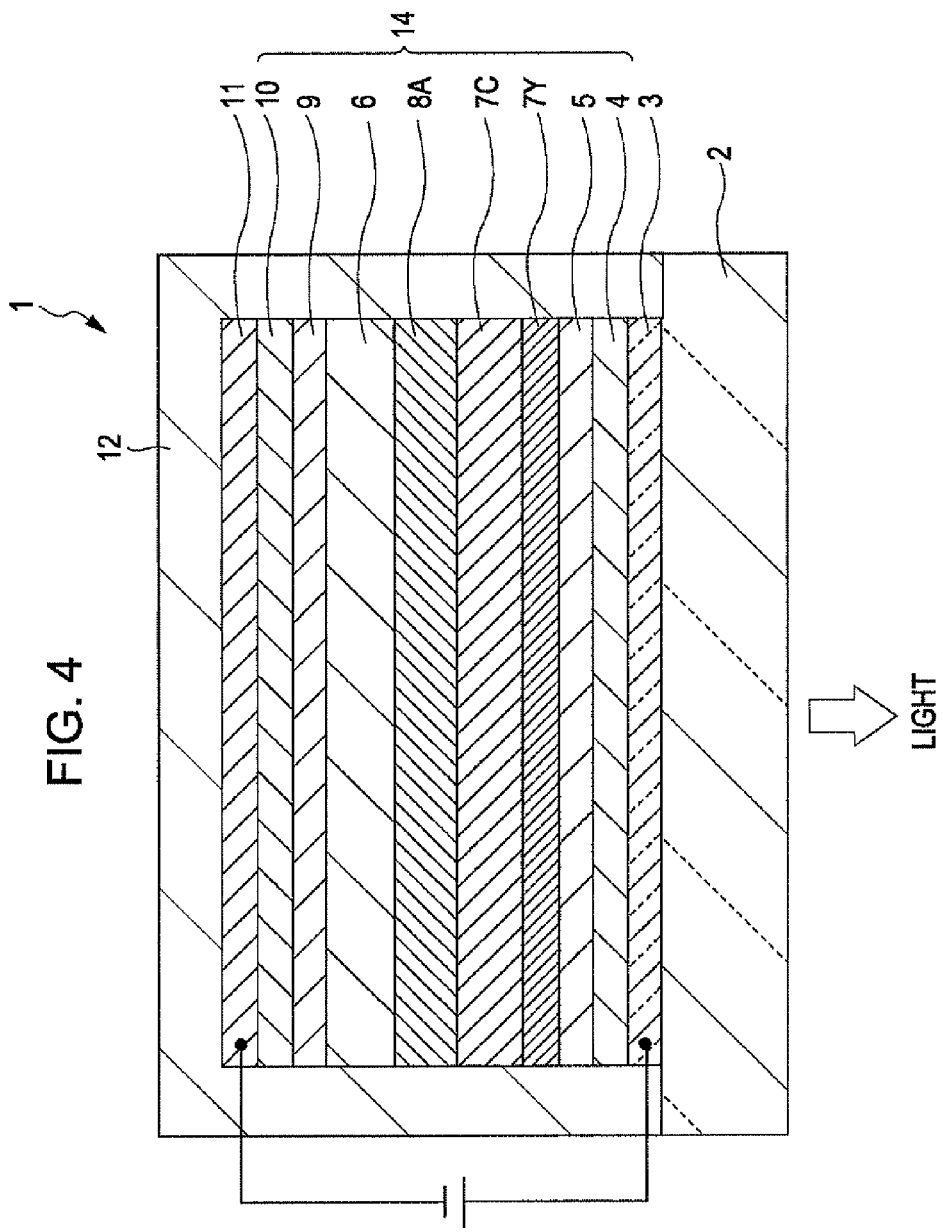
FIG. 4 is a cross-sectional diagram that schematically shows a light emitting element according to a fourth embodiment of the invention.

FIG. 4 is a cross-sectional diagram that schematically shows a light emitting element according to a fourth embodiment of the invention.

Hereinafter, the light emitting element of the fourth embodiment will be described focusing on the differences from that of the third embodiment and the description on the same matters will not be repeated.

The light emitting element of the fourth embodiment is the same as the light emitting element 1 of the third embodiment except that the position where the infrared light emitting layer 6 is stacked is different and also, at the stacked position, the first intermediate layer 8A is prepared between the infrared light emitting layer 6 and the cyan light emitting layer 7C.

That is, the light emitting element 1 shown in FIG. 4 includes the anode 3, the hole injection layer 4, the hole transport layer 5, the yellow light emitting layer 7Y, the cyan light emitting layer 7C, the first intermediate layer 8A, the infrared light emitting layer 6, the electron transport layer 9, the electron injection layer 10, and the cathode 11, all being stacked in this sequence. In other words, in the light emitting element 1, between the anode 3 and the cathode 11, the stacked body 14, in which the hole injection layer 4, the hole transport layer 5, the yellow light emitting layer 7Y, the cyan light emitting layer 7C, the first intermediate layer 8A, the infrared light emitting layer 6, the electron transport layer 9, and the electron injection layer 10 are stacked in this sequence starting from the anode 3 to the cathode 11, is interposed.

In addition, the light emitting element 1 is sealed with a sealing member 12 at the same time as the whole element is installed on a substrate 2.

In the light emitting element 1 such as this, like the light emitting element 1 of the third embodiment, a hole is introduced (injected) from the anode 3 at the same time as an electron is introduced (injected) from the cathode 11 with regard to each light emitting layer of the infrared light emitting layer 6, the yellow light emitting layer 7Y and the cyan light emitting layer 7C. Furthermore in each light emitting layer, the hole and the electron are reunited, an exciton is generated by the energy emitted from the reunion, and energy (fluorescence or phosphorescence) is released when the exciton returns to the ground state. This enables the yellow light emitting layer 7Y and the cyan light emitting layer 7C to emit yellow and cyan visible light, respectively, at the same time as the infrared light emitting layer 6 emits infrared light. As a result, the light emitting element 1 of the embodiment emits infrared light and white visible light. Also, in the embodiment, a visible light emitting layer 7 which emits visible light is formed by the two layers of the yellow light emitting layer 7Y and the cyan light emitting layer 7C.

Also, in the embodiment, movement of the holes and the electrons between the cyan light emitting layer 7C and the infrared light emitting layer 6 may be adjusted since the light emitting element 1 has the first intermediate layer 8A between the cyan light emitting layer 7C and the infrared light emitting layer 6, therefore, energy transfer of the excitons between the cyan light emitting layer 7C and the infrared light emitting layer 6 may be blocked. As a result, the cyan light emitting layer 7C and the infrared light emitting layer 6 may emit light in a balanced way, respectively, therefore, the light emitting element 1 may emit white light as the visible light more reliably.

The infrared light emitting layer 6 emits infrared light as emission light by an electric voltage being applied between the anode 3 and the cathode 11 described above.

This infrared light emitting layer 6 may have the same composition as the infrared light emitting layer 6 included in the light emitting element 1 according to the third embodiment, however, if the infrared light emitting layer 6 is positioned closer to the cathode 11 than other light emitting layers 7Y and 7C as in the embodiment, a quinolinolato-based metal complex such as bis(2-methyl-8-quinolinolato)(p-phenylphenolate)aluminum (BAlq) or tris(8-quinolinolato)aluminum complex ($Alq_3$) is preferably used as the host material included in the infrared light emitting layer 6. As a result, it is possible to extend the life of the infrared light emitting layer 6.

Fifth Embodiment

Figure 5:
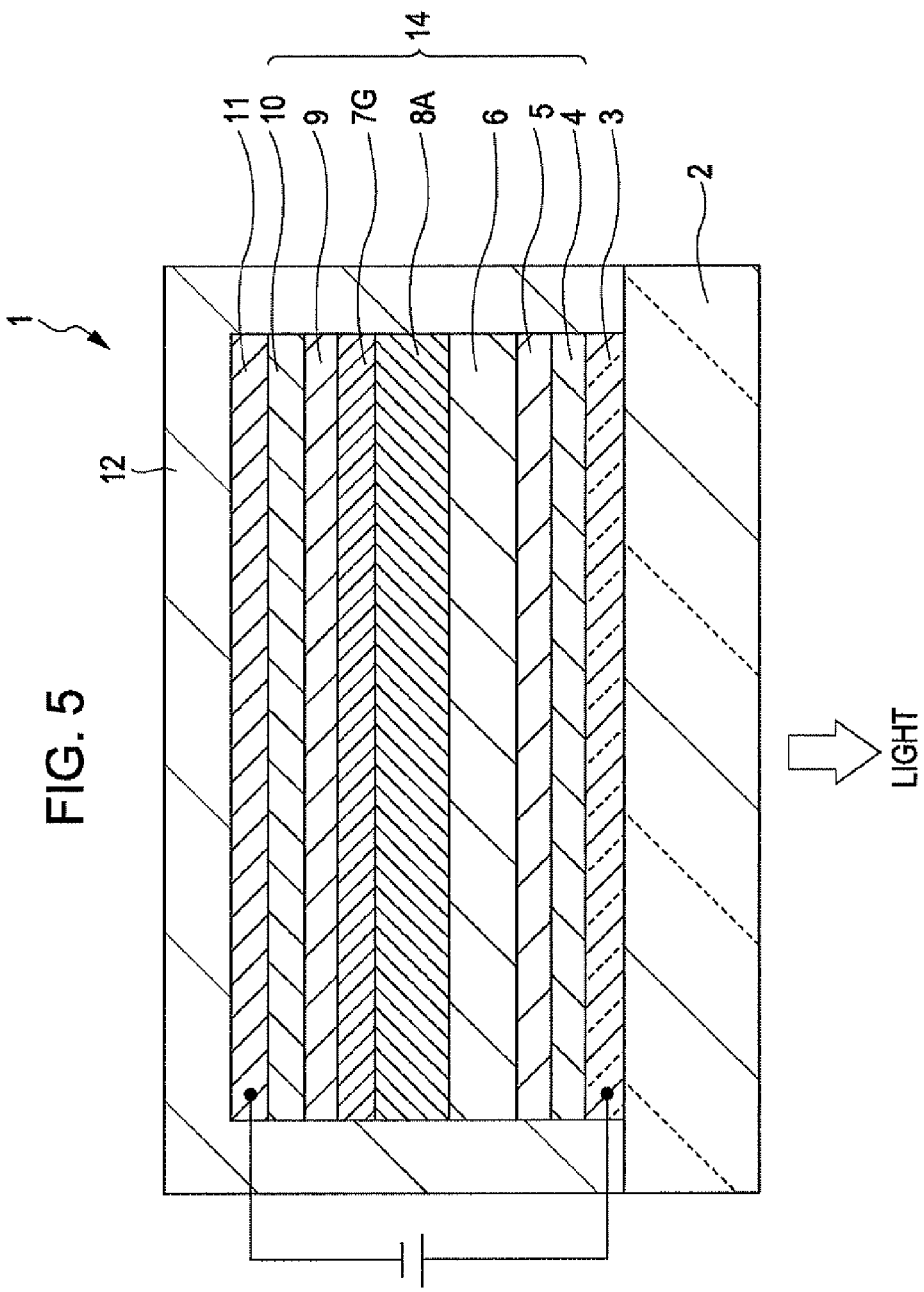
FIG. 5 is a cross-sectional diagram that schematically shows a light emitting element according to a fifth embodiment of the invention.

FIG. 5 is a cross-sectional diagram that schematically shows a light emitting element according to a fifth embodiment of the invention.

Hereinafter, the light emitting element of the fifth embodiment will be described focusing on the differences from that of the first embodiment and the description on the same matters will not be repeated.

The light emitting element 1 of the fifth embodiment is the same as the light emitting element of the first embodiment except that the red light emitting layer 7R, and the blue light emitting layer 7B are not formed and the green light emitting layer 7G is formed alone.

That is, the light emitting element 1 shown in FIG. 5 includes the anode 3, the hole injection layer 4, the hole transport layer 5, the infrared light emitting layer 6, the first intermediate layer 8A, the green light emitting layer 7G, the electron transport layer 9, the electron injection layer 10, and the cathode 11, all being stacked in this sequence. In other words, in the light emitting element 1, between the anode 3 and the cathode 11, the stacked body 14, in which the hole injection layer 4, the hole transport layer 5, the infrared light emitting layer 6, the first intermediate layer 8A, the green light emitting layer 7G, the electron transport layer 9, and the electron injection layer 10 are stacked in this sequence starting from the anode 3 to the cathode 11, is interposed.

In addition, the light emitting element 1 is sealed with a sealing member 12 at the same time as the whole element is installed on a substrate 2.

In the light emitting element 1 such as this, a hole is introduced (injected) from the anode 3 at the same time as an electron is introduced (injected) from the cathode 11 with regard to each light emitting layer of the infrared light emitting layer 6 and the green light emitting layer 7G. Furthermore in each light emitting layer, the hole and the electron are reunited, an exciton is generated by the energy emitted from the reunion, and energy (fluorescence or phosphorescence) is released when the exciton returns to the ground state. This enables the green light emitting layer 7G to emit green visible light at the same time as the infrared light emitting layer 6 emits infrared light. As a result, the light emitting element 1 of the embodiment emits infrared light and green visible light. Also, in the embodiment, a visible light emitting layer 7 which emits visible light is formed by the green light emitting layer 7G.

Also, in the embodiment, movement of the holes and the electrons between the infrared light emitting layer 6 and the green light emitting layer 7G may be adjusted since the light emitting element 1 has the first intermediate layer 8A between the infrared light emitting layer 6 and the green light emitting layer 7G, therefore, energy transfer of the excitons between the infrared light emitting layer 6 and the green light emitting layer 7G may be blocked. As a result, the infrared light emitting layer 6 and the green light emitting layer 7G may emit light in a balanced way, respectively, therefore, the light emitting element 1 may emit green light as the visible light more reliably. Also, obtainment of this effect may be remarkable in a case in which the green light emitting layer 7G contains a green phosphorescent material as the light emitting material. That is, deactivation of the triplet exciton generated in the green phosphorescent material may be reliably prevented by blocking the energy transfer of the excitons between the infrared light emitting layer 6 and the green light emitting layer 7G.

Next, a light emitting device (a light emitting device according to the aspect of the invention) which includes the light emitting element according to the aspect of the invention is described.

Light Source for Illumination

First, a case in which the light emitting device according to the aspect of the invention is applied to a light source for illumination is described.

Figure 6:
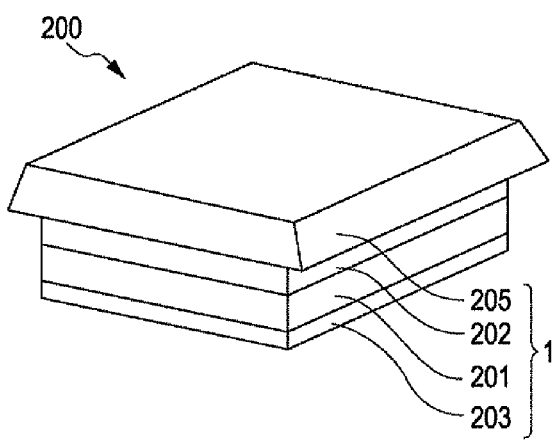
FIG. 6 is a diagram that shows a light source for illumination to which a light emitting device according to an embodiment of the invention is applied.

FIG. 6 is a diagram that shows a light source for illumination to which a light emitting device according to an embodiment of the invention is applied.

The light source for illumination 200 shown in FIG. 6 is a light source for illumination, particularly, a light source used for interior illumination.

This light source for illumination 200 has a transparent substrate 205 and the light emitting element 1.

The light emitting element 1 has a transparent electrode 202, a counter electrode 203, and a stacked body 201 and, through the application of an electric field between the transparent electrode 202 and the counter electrode 203, the light emitting layer which includes the stacked body 201 emits light. Furthermore, for example, the interior is illuminated by the emission light generated in the light emitting layer penetrating the transparent substrate 205.

In the embodiment, the light emitting element 1 which includes the light source for illumination 200 emits infrared light and white visible light. That is, the light source for illumination 200 is equipped with the configurations described in the first to the fourth embodiments as the light emitting element 1.

Here, in conventional light sources for interior illumination, for example, a fluorescent light or the like, the light emission wavelength is mostly 400 to 700 nm and is not in the near-infrared region.

With regard to this, the light receiving wavelength of a light receiving element included in a digital camera (CCD, CMOS, or the like) is about 1,100 nm.

In this way, the light receiving element has a sensitivity for wavelengths of the near-infrared region (700 to 1,100 nm)

Therefore, a problem of subtle differences in the quality of each image is caused when taking a photograph indoors and outdoors using the digital camera.

In order to solve the problem such as this, infrared light in the infrared region and white visible light are emitted as emission light in this light source for illumination 200.

In this way, when taking a photograph indoors, almost the same image may be obtained as the image taken outdoors since light in the near infrared region is emitted as well as visible light.

Also, the light source for illumination 200 is excellent in reliability since it is equipped with the light emitting elements 1 with high efficiency and long life.

Skin Diagnostic Device

Next, a case in which the light emitting device according to the aspect of the invention is applied to a skin diagnostic device is described.

Figure 7:
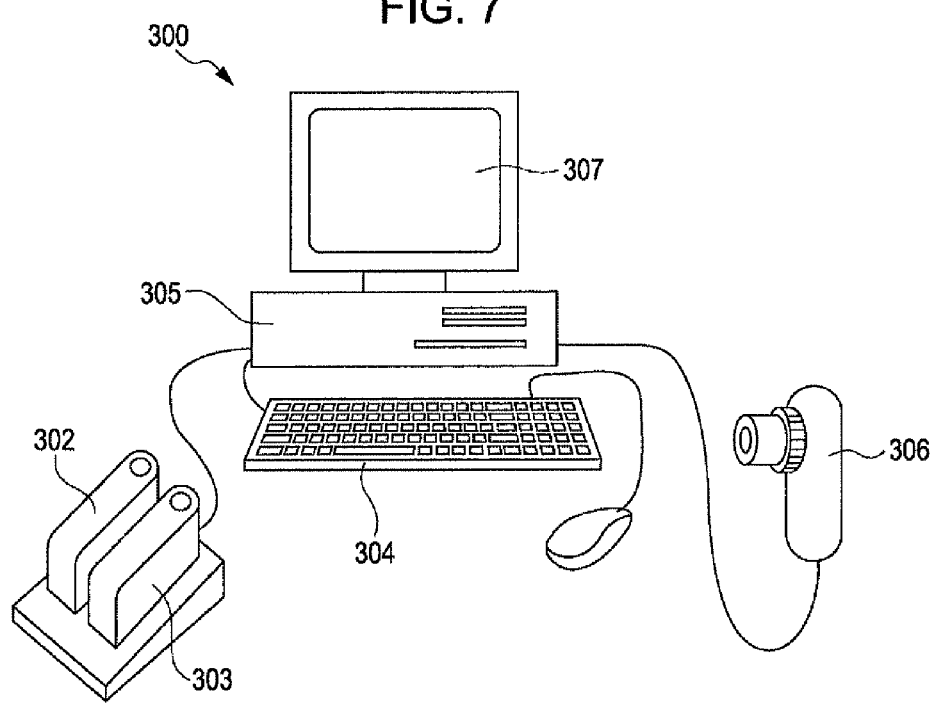
FIG. 7 is a diagram that shows a skin diagnostic device to which a light emitting device according to an embodiment of the invention is applied.

FIG. 7 is a diagram that shows a skin diagnostic device to which a light emitting device according to an embodiment of the invention is applied.

The skin diagnostic device 300 shown in FIG. 7 is a skin diagnostic device which accurately determines a skin condition based on a measurement of the skin condition.

This skin diagnostic device 300 has a first measurement probe 302, a second measurement probe 303, a keyboard 304, a calculation unit 305, a digital micro camera 306, and a display 307.

The first measurement probe 302 measures the amount of water, the amount of sebum, and the elasticity of skin and the like.

Also, the second measurement probe 303 measures the tone, the blood circulation condition, the melanin pigmentation of skin and the like.

The keyboard 304 is an input tool to input results of the examination by interview from subjects or the observation or the palpitation of skin of subjects.

The calculation unit 305 calculates an evaluation index of the skin condition of the subjects based on the input results of measurement signals from the measurement probes 302 and 303 or examination by interview, observation or palpitation.

The digital micro camera 306 has a configuration which is possible to be connected by USB terminal, has a light source, and may enlarge images 20-fold to 150-fold.

The display 307 is for displaying the evaluation index of the skin condition calculated.

In the skin diagnostic device 300 of this configuration, the light source included in the digital micro camera 306 means being equipped with a plurality of the light emitting elements 1 described above and emits infrared light in the near-infrared region and white visible light toward the skin which is an object of the imaging.

That is, the light source is equipped with a plurality of the light emitting elements 1 with a configuration described in the first to fourth embodiments.

According to this skin diagnostic device. 300, the imaging is carried out by the digital micro camera 306 using infrared light in the near-infrared region and white visible light.

In this way, information on blood may also be obtained since the imaging is carried out using not only visible light but also infrared light in the near-infrared region. That is, not only an ostensible condition of the skin (for example, the amount of melanin pigment on the skin surface), but also erythrocyte indices and haematocrit values and the like may be obtained. Therefore, a skin condition which affects the complexion may be measured.

Also, the skin diagnostic device 300 is excellent in reliability since it is equipped with the light emitting elements 1 with high efficiency and long life.

Pulse Measuring Device

Next, a case in which the light emitting device according to the aspect of the invention is applied to a pulse measuring device is described.

Figure 8:
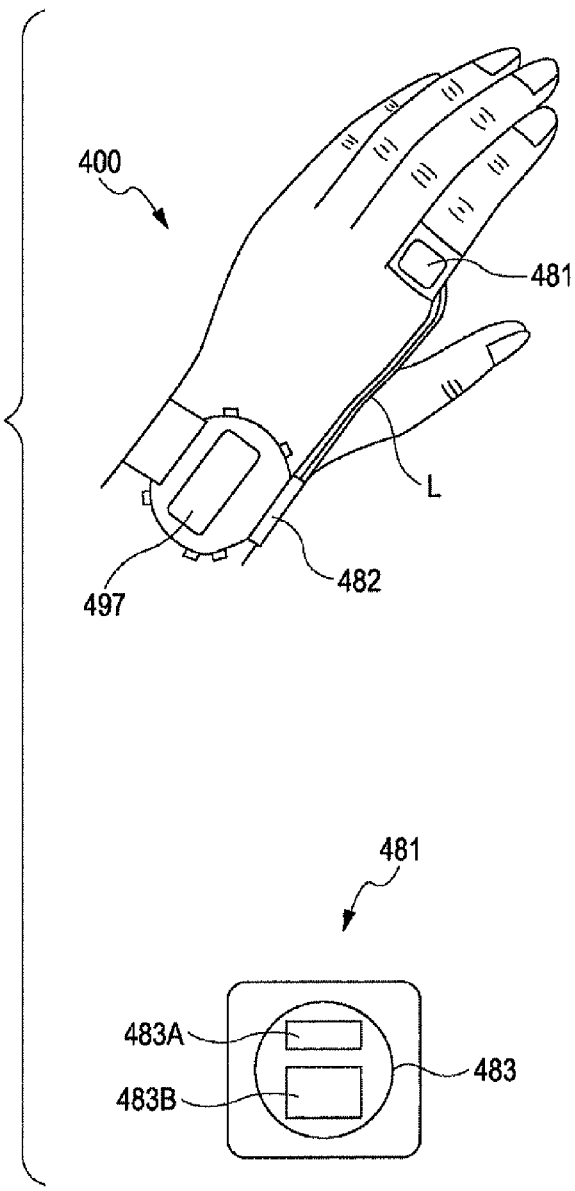
FIG. 8 is a diagram that shows a pulse measuring device to which a light emitting device according to an embodiment of the invention is applied.

FIG. 8 is a diagram that shows a pulse measuring device to which a light emitting device according to an embodiment of the invention is applied.

The pulse measuring device 400 shown in FIG. 8 is a portable pulse measuring device in which a sensor module is installed on a finger and a pulse rate is measured.

The pulse measuring device 400 has a sensor module 481, a device main body 482, and a wiring L which connects these.

The sensor module 481 is installed on the finger of a measured person and has a pulse wave sensor 483 which detects a pulse wave component.

Also, the pulse wave sensor 483 has a light source 483A which emits detecting light and a receiving light unit (Photo-detector) 483B which receives the detecting light reflected by a human body (a finger).

The device main body 482 extracts the pulse wave component based on the light receiving results in the light receiving unit 483B, measures the pulse rate and displays the pulse rate which is the measurement result in a display unit 497.

In the pulse measuring device 400 of this configuration, the light source 483A is equipped with the light emitting element 1 and emits infrared light in the near-infrared region and green visible light toward the finger of which the pulse rate needs to be measured.

That is, the light source 483A, is equipped with the light emitting elements 1 with a configuration described in the fifth embodiment.

According to the pulse measuring device 400 such as this, the detecting light that is reflected by the finger is generated using infrared light in the near-infrared region and green visible light emitted in the light source 483A and the pulse rate is measured based on changes (dynamics) of the intensity of the detecting light.

Here, if the pulse measurement is carried out indoors, changes of the intensity of the detecting light may be detected in the light receiving unit 483B according to a method which uses only infrared light in the near-infrared region. However, if the pulse measurement is carried out outdoors, noise and the like occurs in the light receiving results of the light receiving unit 483B since sunlight includes strong near-infrared rays.

Also, green (wavelength: about 500 to 550 nm) visible light is suitable among all visible light types for the measurement of the pulse rate since the penetration to the inside of the skin is occurs easily compared to visible light of other wavelengths. However, if the pulse is measured using only green visible light, measurement of a stabilized pulse rate is difficult since a power of the emission light needs to be particularly increased.

As a result, by using infrared light in a near-infrared region and green visible light as the light source used in measurement of the pulse rate, these defects are compensate for each other and thereby outdoor pulse rate measurements become possible.

Also, the pulse rating device 400 is excellent in reliability since it is equipped with the light emitting elements 1 with high efficiency and long life.

Authentication Device

Next, a case in which the light emitting device according to the aspect of the invention is applied to an authentication device is described.

Figure 9:
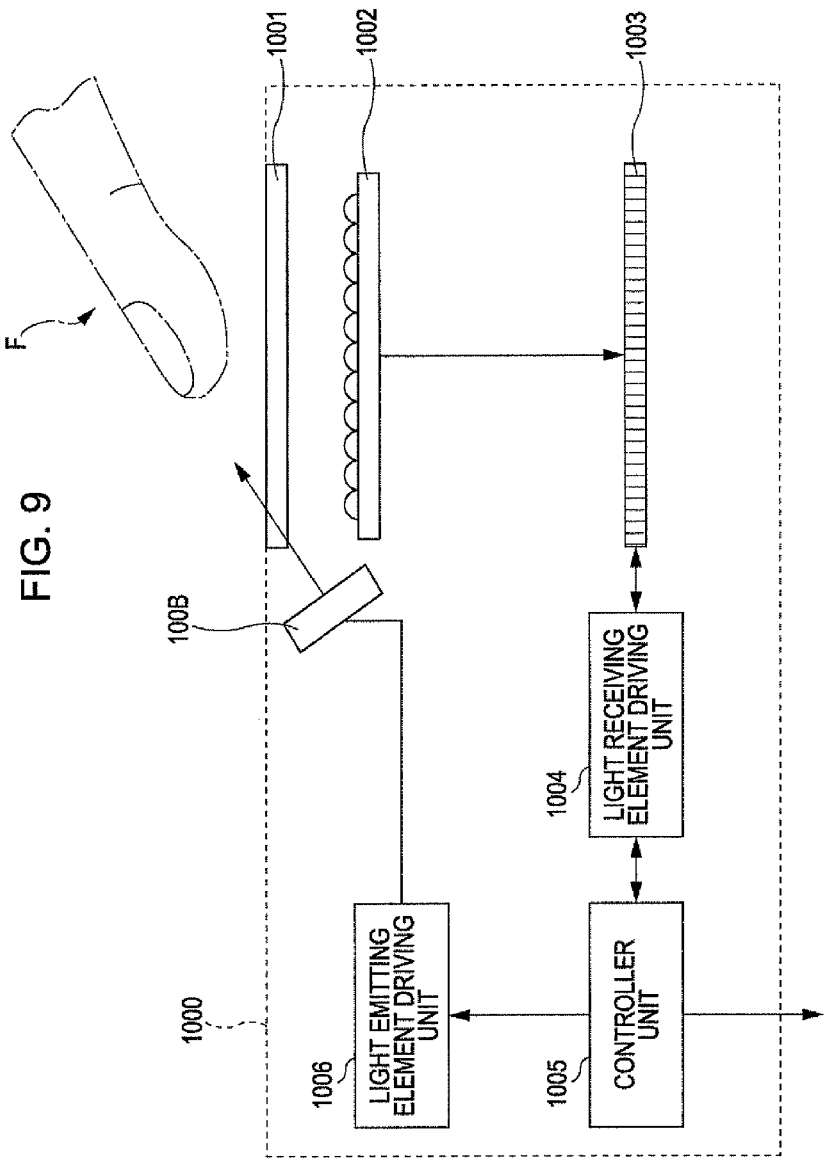
FIG. 9 is a diagram that shows an authentication device to which a light emitting device according to an embodiment of the invention is applied.

FIG. 9 is a diagram which shows an authentication device according to an embodiment of the invention.

The authentication device 1000 shown in FIG. 9 is a biometric authentication device which authenticates a person using biometric information of body F (a fingerprint in the embodiments).

The authentication device 1000 has a light source 100B, a cover glass 1001, a micro-lens array 1002, a light receiving element group 1003, a light emitting element driving unit 1006, a light receiving element driving unit 1004, and a controller unit 1005.

The light source 100B is equipped with a plurality of the light emitting elements 1 described above and irradiates a light in a near-infrared region toward the body F which is an object of imaging.

That is, the light source 100B, is equipped with a plurality of the light emitting elements 1 with a configuration described in the fifth embodiment.

Also, a plurality of the light emitting elements 1 in this light source 100B is, for example, placed along the outer periphery of the cover glass 1001.

The cover glass 1001 is the region where the body F contacts or comes close to.

The micro-lens array 1002 is installed on the opposite side to the side where the body F of the cover glass 1001 contacts or comes close to. This micro-lens array 1002 is configured of a plurality of micro-lenses arranged in a matrix form.

The light receiving element group 1003 is installed on the opposite side to the cover glass 1001 with regard to the micro-lens array 1002. This light receiving element group 1003 is configured of a plurality of light receiving elements arranged in a matrix form corresponding to a plurality of micro-lenses of the micro-lens array 1002. As each light receiving element of this light receiving element group 1003, for example, a CCD (Charge Coupled Device), a CMOS or the like may be used.

The light emitting element driving unit 1006 is a driving circuit which drives the light source 100B.

The light receiving element driving unit 1004 is a driving circuit which drives the light receiving element group 1003.

The controller unit 1005 is, for example, an MPU, and has a function to control the driving of the light emitting element driving unit 1006 and the light receiving element driving unit 1004.

Also, the controller unit 1005 has a function to carry out the authentication of body F from the comparison of a light receiving result of the light receiving element group 1003 with the already stored biometric authentication information.

For example, the controller unit 1005 generates an image pattern on body F (for example, a vein pattern) based on the result of light received from the light receiving element group 1003. Then the controller unit 1005 compares the image pattern with an image pattern already stored as biometric authentication information, and carries out the authentication of body F (for example, a vein authentication) based on results of the comparison.

According to the authentication device 1000 such as this, the biometric authentication is carried out based on the result of light received from the light receiving element group 1003 which is formed using infrared light in a near-infrared region and green visible light.

Here, if the biometric authentication is carried out indoors, the image pattern (for example, a vein pattern) may be generated using only infrared light in a near-infrared region. However, if the biometric authentication is carried out outdoors, noise and the like occurs in the light receiving results of the light receiving element group 1003 since sunlight includes strong near-infrared rays.

Also, green (wavelength: about 500 to 550 nm) visible light is suitable among all visible light types for the generation of the image pattern (for example, a vein pattern)

As a result, the biometric authentication may be carried out outdoors by using infrared light in a near-infrared region and green visible light as the light source used in the biometric authentication.

Also, the device is excellent in reliability since it is equipped with the light emitting elements 1 with high efficiency and long life. The authentication device 1000 such as this may be used to equip a variety of electronic devices.

Electronic Device

Figure 10:
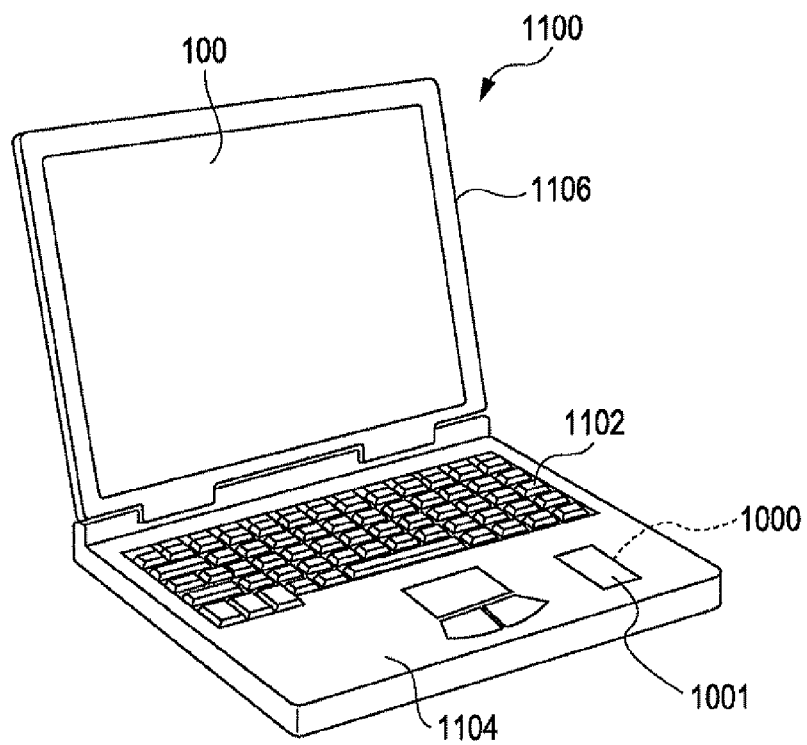
FIG. 10 is a perspective view which shows a configuration of a mobile type (or a lap-top type) personal computer to which an electronic device according to an embodiment of the invention is applied.

FIG. 10 is a perspective view which shows a configuration of a mobile type (or a lap-top type) personal computer to which an electronic device according to an embodiment of the invention is applied.

In this drawing, a personal computer 1100 consists of a main unit 1104 equipped with a keyboard 1102, a display unit 1106 equipped with a display section and the display unit 1106 is supported so that it is rotatable with regard to the main unit 1104 through a hinge structure unit.

In this personal computer 1100, the main unit 1104 is equipped with the authentication device 1000 described above.

The personal computer 1100 such as this is excellent in reliability since it is equipped with the light emitting elements 1 with high efficiency and long life.

Also, the electronic device according to an embodiment of the invention, in addition to a personal computer (a mobile personal computer) in FIG. 10, may be applied to, for example, a mobile phone, a digital still camera, a television or a video camera, a viewfinder type or direct-view monitor type videotape recorder, a laptop personal computer, a car navigation device, a pager, an electronic organizer (including a communication function unit), an electronic dictionary, a calculator, an electronic games device, a word processor, a workstation, a video phone, a television monitor for security, electronic binoculars, a POS terminal, a device equipped with a touch panel (for example, a cash dispenser of a financial institution, or a vending machine), a medical device (for example, an electronic thermometer, a blood pressure meter, a blood glucose meter, a pulse measuring device, a pulse wave measuring device, an electrocardiograph display device, an ultrasonic diagnostic device, or an endoscope display device), a fishfinder, a variety of measuring devices, gauges (for example, gauges of a vehicle, an aircraft, or a ship), a flight simulator, a projection-type display device such as a variety of monitors or a projector, or the like.

Hereinbefore, the light emitting element, the light emitting device, and the electronic device according to the aspect of the invention have been described with reference to the preferred embodiments shown in the accompanying drawings, however, the invention is not limited to these embodiments.

For example, the light emitting element and the light emitting device and the electronic device according to the aspect of the invention may be substituted with arbitrary objects which exhibit the same functions or objects of arbitrary configuration may be added.

EXAMPLES

Hereinafter, the invention will be described with reference to specific examples.

1. Production of the Thiadiazole-Based Compound

Synthesis Example A1

Synthesis of Compound Expressed by Formula D-2

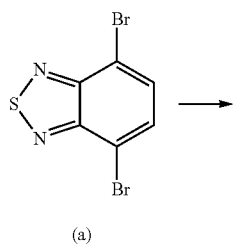

(a)

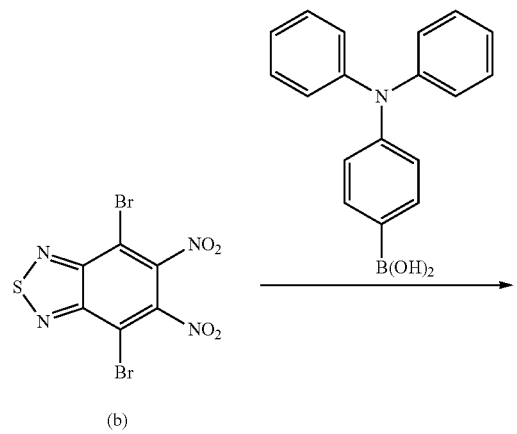

(b)

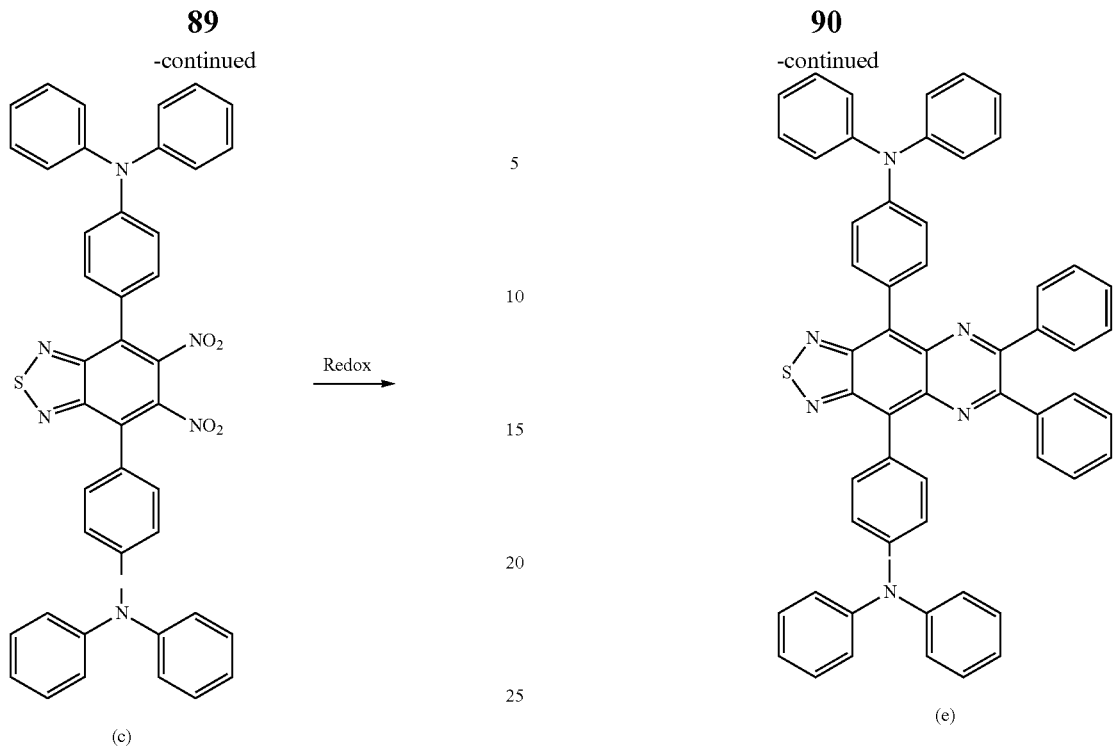

Synthesis (A1-1)

1500 ml of fuming nitric acid was placed in a 5 liter flask and was cooled. 1500 ml of sulfuric acid was added in portions to the nitric acid while the temperature was maintained at 10 to 50° C. 150 g of dibromobenzothiadiazole compound (a) as a raw material was added thereto in small portions over 1 hour while the temperature of the solution was kept at 5° C. or less. After the whole amount was added, the solution was allowed to react for 20 hours at room temperature (25° C.). After the reaction, the reaction mixture was poured into 3 kg of ice and was stirred overnight. After that, it was filtered and washed with methanol and heptane.

After the residue from the filtration was dissolved by heating in 200 ml of toluene, it was slowly cooled to room temperature and was filtered. After the residue was washed with a small amount of toluene, it was dried under reduced pressure.

As a result, 60 g of a compound (b) (4,7-dibromo-5,6-dinitrobenzo[1,2,5]thiadiazole) with a 95% purity by HPLC was obtained.

Synthesis (A1-2)

Under an argon (Ar) atmosphere, 30 g of the dibromo product compound (b), 54.2 g of triphenylamine boronic acid product, 2500 ml of toluene, 2M cesium carbonate aqueous solution (152 g/(distilled water) 234 ml) were placed in a 5 liter flask and were allowed to react overnight at 90° C. After the reaction, filtration, separation and concentration were performed, and the resulting 52 g of crude product was separated using a silica-gel column (SiO$_2$ 5 kg) and a purple-red solid was obtained.

As a result, 8.9 g of a compound (c) with a 96% purity by HPLC was obtained.

Also, triphenylamine boronic acid product was synthesized as follows. Under an argon (Ar) atmosphere, 246 g of 4-bromotriphenylamine (commercially available product), and 1500 ml of anhydrous tetrahydrofuran were placed in a 5 liter flask, and 570 ml of 1.6M n-BuLi/hexane solution was added dropwise over 3 hours at −60° C. After 30 minutes, 429 g of triisopropyl borate was added dropwise over 1 hour. Then, reaction overnight at ambient temperature was allowed. After the reaction, 2 liters of water was added dropwise, and after that, the mixture was extracted and the liquid was separated using 2 liters of toluene. The organic layer was concentrated, recrystallized, filtered, dried and 160 g of white boronic acid product, a target compound, was obtained.

The purity of the boronic acid product obtained by HPLC was 99%.

Synthesis (A1-3)

Under an argon (Ar) atmosphere, 8 g of the dinitro product compound (c), 7 g of reduced iron, and 600 ml of acetic acid were placed in a 1 liter flask, were allowed to react for 4 hours at 80° C., and were cooled to room temperature. After the reaction, the reaction solution was poured into 1.5 liters of ion-exchanged water and 1.5 liters of ethyl acetate was additionally added. After the addition, a solid was precipitated, therefore, by adding 1 liter of tetrahydrofuran and 300 g of table salt, the liquid was separated. The aqueous layer was re-extracted with 1 liter of tetrahydrofuran. By being concentrated, dried and washed again with small amount of water and methanol, an orange solid was obtained.

As a result, 7 g of a compound (d) with an 80% purity by HPLC was obtained.

Synthesis (A1-4)

Under an argon (Ar) atmosphere, 4.5 g of the diamine product compound (d), 3.7 g of benzil, and 300 ml of acetic acid as a solvent were placed in a 1 liter flask, and were allowed to react for 2 hours at 80° C. After the reaction, the reaction mixture was cooled to room temperature, was poured into 1 liter of ion-exchanged water, crystals were filtered, washed with water and 7 g of a black-green solid was obtained. Then, the black-green solid was purified using a silica-gel column (SiO$_2$ 1 kg).

As a result, 4 g of a compound (e) (a compound expressed by the Formula D-2) with a 99% purity by HPLC was obtained. The result of mass analysis of this compound (e) was, M+: 826.

Also, the compound (e) obtained was purified by sublimation at the set temperature of 340° C. The purity of the compound (e) by HPLC was 99% after the purification by sublimation.

Synthesis Example A2

Synthesis of Compound Expressed by Formula D-8

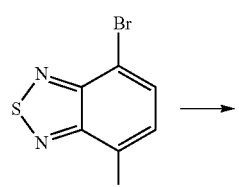

(a)

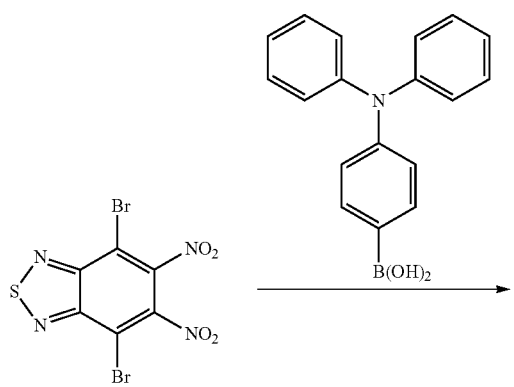

(b)

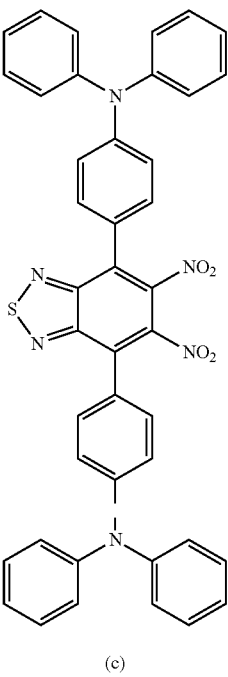

(c)

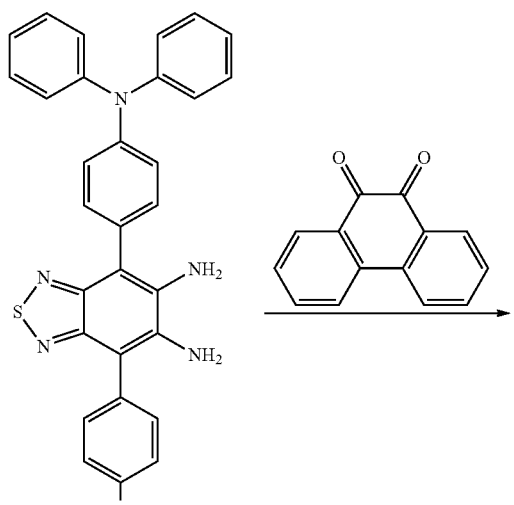

93

-continued

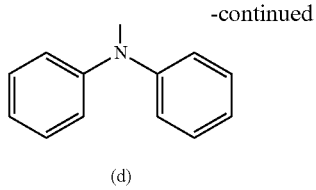

(d)

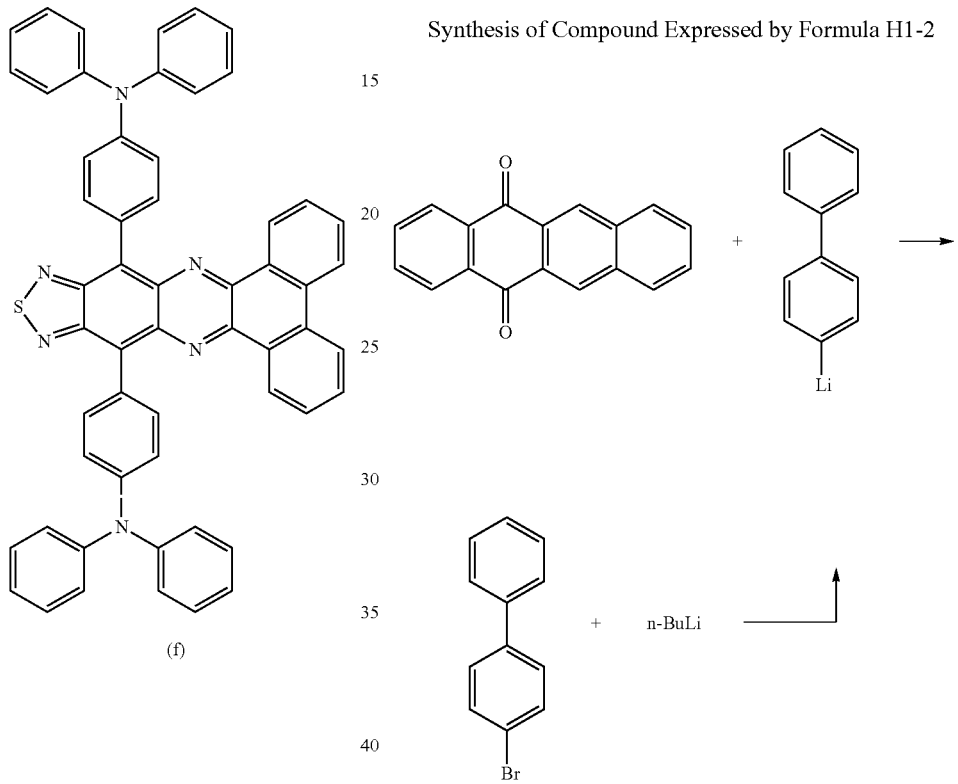

(f)

Syntheses (A2-1) to (A2-3)

Diamine product compound (d) was obtained in the same manner as those of synthesis (A1-1) to (A1-3) described in synthesis example A1.

Synthesis (A2-4)

Under an argon (Ar) atmosphere, 1.5 g of the diamine product compound (d), 0.6 g of 9,10-phenanthraquinone, and 300 ml of acetic acid as a solvent were placed in a 1 liter flask, and were allowed to react for 2 hours at 80° C. After the reaction, the reaction mixture was cooled to room temperature, was poured into 1 liter of ion-exchanged water, crystals were filtered, washed with water and 2 g of a black-green solid was obtained. Then, the black-green solid was purified using a silica-gel column ($SiO_2$ 1 kg).

As a result, 1.5 g of a compound (f) (a compound expressed by the Formula D-8) with a 99% purity by HPLC was obtained. The result of mass analysis of this compound (f) was, M+: 824.

94

Also, the compound (f) obtained was purified by sublimation at the set temperature of 340° C. The purity of the compound (f) by HPLC was 99% after the purification by sublimation.

2. Production of Host Material (Tetracene-Based Material)

Synthesis Example B1

Synthesis of Compound Expressed by Formula H1-2

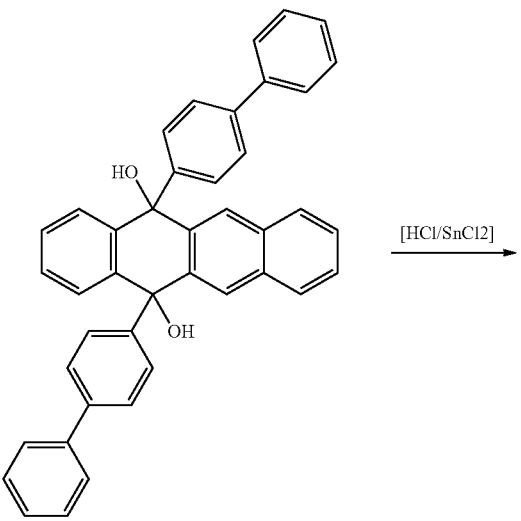

[HCl/SnCl2]

-continued

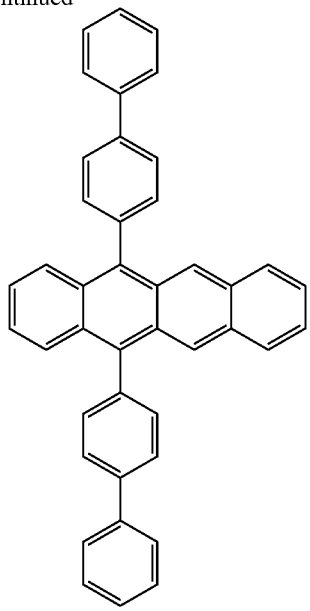

Synthesis (B1-1)

Under an argon (Ar) atmosphere, 6 g of 4-bromobiphenyl and 50 ml of dry diethyl ether were placed in a 300 ml flask. At room temperature, 14.5 ml of 1.6M n-BuLi/hexane solution was added dropwise and the reaction mixture was allowed to react for 30 minutes.

Meanwhile, separately, under an argon (Ar) atmosphere, 2.7 g of 5,12-naphthacenequinone and 100 ml of dry toluene were placed in a 500 ml flask. The already adjusted biphenyl-lithium was added dropwise thereto and the reaction mixture was allowed to react for 3 hours. After the reaction, 20 ml of distilled water was added, was stirred for 30 minutes, and after the reaction mixture was placed in methanol, the solid was filtered and separated. The solid obtained was purified with silica-gel ($SiO_2$ 500 g).

As a result, 4.5 g of a white solid (5,12-bisbiphenyl-4-yl-5,12-dihydronaphthacene-5,12-diol) was obtained.

Synthesis (B1-2)

4.5 g of the diol product obtained from the synthesis (B1-1) and 300 ml of acetic acid were weighed and placed in a 1000 ml of flask. 5 g of tin chloride (II) (anhydrous) dissolved in 5 g of hydrochloric acid (35%) was added thereto and the mixture was stirred for 30 minutes. After that, the mixture was transferred to a separatory funnel, separated and washed in distilled water by adding toluene, and was dried. The solid obtained was purified with silica-gel ($SiO_2$ 500 g) resulting in 4 g of a yellow solid (a compound expressed by the Formula H1-2). 3. Production of light emitting element (Example 1)

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 W of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for an infrared light emitting layer was deposited using a vacuum deposition method, and the infrared light emitting layer with an average thickness of 10 nm was formed. As the component material for the infrared light emitting layer, the compound expressed by the Formula D-2 was used as a light emitting material (guest material) and the compound expressed by the Formula H1-2 (tetracene-based material) was used as a host material. Also, the content of the light emitting material (dopant) in the infrared light emitting layer (doping concentration) was 4.0 wt %.

<4> Next, on the infrared light emitting layer, a component material for a red light emitting layer was deposited using a vacuum deposition method, and the red light emitting layer with an average thickness of 5 nm was formed. As the component material for the red light emitting layer, the compound expressed by the Chemical Formula (17) (a diindenoperylene derivative) was used as a light emitting material (guest material) and the compound expressed by the Formula H1-2 (tetracene-based material) was used as a host material. Also, the content of the light emitting material (dopant) in the red light emitting layer (doping concentration) was 2.0 wt %.

<5> Next, on the red light emitting layer, a first intermediate layer of an average thickness of 5 nm made of a component material for the first intermediate layer was formed using a vacuum deposition method.

Here, as the component material for the first intermediate layer, the compound expressed by the Formula H1-2 (tetracene-based material) was used as a host material and the compound expressed by the Chemical Formula (22) described above was used as an amine-based material. Also, the content of the host material in the first intermediate layer was 50 wt %.

<6> Next, on the first intermediate layer, a component material for a blue light emitting layer was deposited using a vacuum deposition method, and the blue light emitting layer with an average thickness of 15 nm was formed. As the component material for the blue light emitting layer, the compound expressed by the Chemical Formula (24B) (a styrylamine-based compound) was used as a light emitting material (guest material) and the compound expressed by the Formula H2-34 (anthracene-based material) was used as a host material. Also, the content of the light emitting material (dopant) in the blue light emitting layer (doping concentration) was 7.0 wt %.

<7> Next, on the blue light emitting layer, a component material for a green light emitting layer was deposited using a vacuum deposition method, and the green light emitting layer with an average thickness of 25 nm was formed. As the component material for the green light emitting layer, the compound expressed by the Chemical Formula (25) (a quinacridone derivative) was used as a light emitting material (guest material) and the compound expressed by the Formula H2-34 (anthracene-based material) was used as a host material. Also, the content of the light emitting material (dopant) in the green light emitting layer (doping concentration) was 7.0 wt %.

<8> Next, on the green light emitting layer, 2,9-dimethyl-4,7-diphenyl-1,10-phenanthroline (BCP) was formed as a film using a vacuum deposition method, and an electron transport layer with an average thickness of 30 nm was formed.

<9> Next, on the electron transport layer, lithium fluoride (LiF) was formed as a film using a vacuum deposition method, and an electron injection layer with an average thickness of 1 nm was formed.

<10> Next, on the electron injection layer, Al was formed as a film using a vacuum deposition method. A cathode consisting of Al with an average thickness of 100 nm was formed from this process.

<11> Next, a protecting cover (sealing member) made of glass was used for covering so as to cover each layer formed, and epoxy resin was used for fixing and sealing. From these processes, a light emitting element was prepared.

Example 2

The light emitting element was prepared in the same manner as that of Example 1 described above, except that the compound expressed by the Formula D-8 was used instead of the compound expressed by the Formula D-2 as the light emitting material of the infrared light material emitting layer in the process <3> of the Example 1.

Example 3

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 w of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for a red light emitting layer was deposited using a vacuum deposition method, and the red light emitting layer with an average thickness of 5 nm was formed. As the component material for the red light emitting layer, the compound expressed by the Chemical Formula (17) (a diindenoperylene derivative) was used as a light emitting material (guest material) and the compound expressed by the Formula H1-2 (tetracene-based material) was used as a host material. Also, the content of the red light emitting material (dopant) in the red light emitting layer (doping concentration) was 2.0 wt %.

<4> Next, on the red light emitting layer, a first intermediate layer of an average thickness of 5 nm made of a component material for the first intermediate layer was formed using a vacuum deposition method. Here, as the component material for the first intermediate layer, the compound expressed by the Formula H1-2 (tetracene-based material) was used as a host material and the compound expressed by the Chemical Formula (22) was used as an amine-based material. Also, the content of the host material in the first intermediate layer was 50 wt %.

<5> Next, on the first intermediate layer, a component material for a blue light emitting layer was deposited using a vacuum deposition method, and the blue light emitting layer with an average thickness of 15 nm was formed. As the component material for the blue light emitting layer, the compound expressed by the Chemical Formula (24B) (a styrylamine-based compound) was used as a light emitting material (guest material) and the compound expressed by the Formula H2-34 (anthracene-based material) was used as a host material. Also, the content of the light emitting material (dopant) in the blue light emitting layer (doping concentration) was 7.0 wt %.

<6> Next, on the blue light emitting layer, a component material for a green light emitting layer was deposited using a vacuum deposition method, and the green light emitting layer with an average thickness of 25 nm was formed. As the component material for the infrared light emitting layer, the compound expressed by the Chemical Formula (25) (a quinacridone derivative) was used as a light emitting material (guest material) and the compound expressed by the Formula H2-34 (anthracene-based material) was used as a host material. Also, the content of the light emitting material (dopant) in the green light emitting layer (doping concentration) was 7.0 wt %.

<7> Next, on the green light emitting layer, a second intermediate layer of an average thickness of 5 nm made of a component material for the second intermediate layer was formed using a vacuum deposition method. Here, as the component material for the second intermediate layer, the compound expressed by the Formula H1-2 (tetracene-based material) was used as a host material and the compound expressed by the Chemical Formula (22) described above was used as an amine-based material. Also, the content of the host material in the second intermediate layer was 50 wt %.

<8> Next, on the second intermediate layer, a component material for an infrared light emitting layer was deposited using a vacuum deposition method, and the infrared light emitting layer with an average thickness of 10 nm was formed. As the component material for the infrared light emitting layer, the platinum complex-based compound expressed by the Formula 2 was used as a light emitting material (guest material) and tris(8-quinolinolato)aluminum complex ($Alq_3$) was used as a host material. Also, the content of the light emitting material (dopant) in the infrared light emitting layer (doping concentration) was 2.0 wt %.

<9> Next, on the infrared light emitting layer, 2,9-dimethyl-4,7-diphenyl-1,10-phenanthroline (BCP) was formed as a film using a vacuum deposition method, and an electron transport layer with an average thickness of 15 nm was formed.

<10> Next, on the electron transport layer, lithium fluoride (LiF) was formed as a film using a vacuum deposition method, and an electron injection layer with an average thickness of 1 nm was formed.

<11> Next, on the electron injection layer, Al was formed as a film using a vacuum deposition method. A cathode consisting of Al with an average thickness of 100 nm was formed from this process.

<12> Next, a protecting cover (sealing member) made of glass was used for covering so as to cover each layer formed, and epoxy resin was used for fixing and sealing. From these processes, a light emitting element was prepared.

Example 4

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 W of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for an infrared light emitting layer was deposited using a vacuum deposition method, and the infrared light emitting layer with an average thickness of 10 nm was formed. As the component material for the infrared light emitting layer, the compound expressed by the Formula D-2 was used as a light emitting material (guest material) and the compound expressed by the Formula H1-2 (tetracene-based material) was used as a host material. Also, the content of the light emitting material (dopant) in the infrared light emitting layer (doping concentration) was 4.0 wt %.

<4> Next, on the infrared light emitting layer, a first intermediate layer of an average thickness of 5 nm made of a component material for the first intermediate layer was formed using a vacuum deposition method. Here, as the component material for the first intermediate layer, the compound expressed by the Formula H1-2 (tetracene-based material) was used as a host material and the compound expressed by the Chemical Formula (22) described above was used as an amine-based material. Also, the content of the host material in the first intermediate layer was 50 wt %.

<5> Next, on the first intermediate layer, a component material for a yellow light emitting layer was deposited using a vacuum deposition method, and the yellow light emitting layer with an average thickness of 15 nm was formed. As the component material for the yellow light emitting layer, the compound expressed by the Chemical Formula (26A) (a tetracene compound) was used as a light emitting material (guest material) and the compound expressed by the Formula H2-34 (anthracene-based material) was used as a host material. Also, the content of the light emitting material (dopant) in the yellow light emitting layer (doping concentration) was 4.0 wt %.

<6> Next, on the yellow light emitting layer, component material for a cyan light emitting layer was deposited using a vacuum deposition method, and the cyan light emitting layer with an average thickness of 15 nm was formed. As the component material for the cyan light emitting layer, the compound expressed by the Chemical Formula (24A) (a styrylamine-based compound) was used as a light emitting material (guest material) and the compound expressed by the Formula H2-34 (anthracene-based material) was used as a host material. Also, the content of the light emitting material (dopant) in the cyan light emitting layer (doping concentration) was 7.0 wt %.

<7> Next, on the cyan light emitting layer, 2,9-dimethyl-4,7-diphenyl-1,10-phenanthroline (BCP) was formed as a film using a vacuum deposition method, and an electron transport layer with an average thickness of 30 nm was formed.

<8> Next, on the electron transport layer, lithium fluoride (LiF) was formed as a film using a vacuum deposition method, and an electron injection layer with an average thickness of 1 nm was formed.

<9> Next, on the electron injection layer, Al was formed as a film using a vacuum deposition method. A cathode consisting of Al with an average thickness of 100 nm was formed from this process.

<10> Next, a protecting cover (sealing member) made of glass was used for covering so as to cover each layer formed, and epoxy resin was used for fixing and sealing. From these processes, a light emitting element was prepared.

Example 5

The light emitting element was prepared in the same manner as that of Example 4 described above, except that the compound expressed by the Formula D-8 was used instead of the compound expressed by the Formula D-2 as the light emitting material of the infrared light material emitting layer in the process <3> of the Example 4.

Example 6

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 W of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for a yellow light emitting layer was deposited using a vacuum deposition method, and the yellow light emitting layer with an average thickness of 15 nm was formed. As the component material for the yellow light emitting layer, the compound expressed by the Chemical Formula (26A) (a tetracene compound) was used as a light emitting material (guest material) and the compound expressed by the Formula H2-34 (anthracene-based material) was used as a host material. Also, the content of the light emitting material (dopant) in the yellow light emitting layer (doping concentration) was 4.0 wt %.

<4> Next, on the yellow light emitting layer, a component material for a cyan light emitting layer was deposited using a vacuum deposition method, and the cyan light emitting layer with an average thickness of 15 nm was formed. As the component material for the cyan light emitting layer, the compound expressed by the Chemical Formula (24A) (a styrylamine-based compound) was used as a light emitting material (guest material) and the compound expressed by the Formula H2-34 (anthracene-based material) was used as a host material. Also, the content of the light emitting material (dopant) in the cyan light emitting layer (doping concentration) was 7.0 wt %.

<5> Next, on the cyan light emitting layer, a first intermediate layer of an average thickness of 5 nm made of a component material for the first intermediate layer was formed using a vacuum deposition method. Here, as the component material for the first intermediate layer, the compound expressed by the Formula H1-2 (tetracene-based material) was used as a host material and the compound expressed by the Chemical Formula (22) described above was used as an amine-based material. Also, the content of the host material in the first intermediate layer was 50 wt %.

<6> Next, on the first intermediate layer, a component material for an infrared light emitting layer was deposited using a vacuum deposition method, and the infrared light emitting layer with an average thickness of 10 nm was formed. As the component material for the infrared light emitting layer, the platinum complex-based compound expressed by the Formula 2 was used as a light emitting material (guest material) and tris(8-quinolinolato)aluminum complex ($Alq_3$) was used as a host material. Also, the content of the light emitting material (dopant) in the infrared light emitting layer (doping concentration) was 2.0 wt %.

<7> Next, on the infrared light emitting layer, 2,9-dimethyl-4,7-diphenyl-1,10-phenanthroline (BCP) was formed as a film using a vacuum deposition method, and an electron transport layer with an average thickness of 30 nm was formed.

<8> Next, on the electron transport layer, lithium fluoride (LiF) was formed as a film using a vacuum deposition method, and an electron injection layer with an average thickness of 1 nm was formed.

<9> Next, on the electron injection layer, Al was formed as a film using a vacuum deposition method. A cathode consisting of Al with an average thickness of 100 nm was formed from this process.

<10> Next, a protecting cover (sealing member) made of glass was used for covering so as to cover each layer formed, and epoxy resin was used for fixing and sealing. From these processes, a light emitting element was prepared.

Example 7

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 W of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for an infrared light emitting layer was deposited using a vacuum deposition method, and the infrared light emitting layer with an average thickness of 25 nm was formed. As the component material for the infrared light emitting layer, the compound expressed by the Formula D-2 was used as a light emitting material (guest material) and the compound expressed by the Formula H1-2 (tetracene-based material) was used as a host material. Also, the content of the light emitting material (dopant) in the infrared light emitting layer (doping concentration) was 4.0 wt %.

<4> Next, on the infrared light emitting layer, a first intermediate layer of an average thickness of 5 nm made of a component material for the first intermediate layer was formed using a vacuum deposition method. Here, as the component material for the first intermediate layer, the compound expressed by the Formula H1-2 (tetracene-based material) was used as a host material and the compound expressed by the Chemical Formula (22) described above was used as an amine-based material. Also, the content of the host material in the first intermediate layer was 50 wt %.

<5> Next, on the first intermediate layer, a component material for a green light emitting layer was deposited using a vacuum deposition method, and the green light emitting layer with an average thickness of 10 nm was formed. As the component material for the cyan light emitting layer, fac-tris (2-phenylpyridine)iridium (Ir(ppy)3) was used as a light emitting material (guest material) and 3-phenyl-4-(1'-naphthyl)-5-phenylcarbozole and 4,4'-N,N'-dicarbazolebiphenyl (CBP) were used as host materials. Also, the content of the light emitting material (dopant) in the green light emitting layer (doping concentration) was 15 wt %.

<6> Next, on the green light emitting layer, bis(2-methyl-8-quinolinolato) (p-phenylphenolate)aluminum (BAlq) was formed as a film using a vacuum deposition method and a second intermediate layer with an average thickness of 20 nm was formed.

<7> Next, on the second intermediate layer, 2,9-dimethyl-4,7-diphenyl-1,10-phenanthroline (BCP) was formed as a film using a vacuum deposition method, and an electron transport layer with an average thickness of 40 nm was formed.

<8> Next, on the electron transport layer, lithium fluoride (LiF) was formed as a film using a vacuum deposition method, and an electron injection layer with an average thickness of 1 nm was formed.

<9> Next, on the electron injection layer, Al was formed as a film using a vacuum deposition method. A cathode consisting of Al with an average thickness of 100 nm was formed from this process.

<10> Next, a protecting cover (sealing member) made of glass was used for covering so as to cover each layer formed, and epoxy resin was used for fixing and sealing. From these processes, a light emitting element was prepared.

Example 8

The light emitting element was prepared in the same manner as that of Example 7 described above, except that the compound expressed by the Formula D-8 was used instead of the compound expressed by the Formula D-2 as the light emitting material of the infrared light material emitting layer in the process <3> of the Example 7.

Reference Example 1

<1> First, a transparent glass substrate with an average thickness of 0.5 mm was prepared. Next, on the substrate, an ITO electrode (anode) with an average thickness of 100 nm was formed by a sputtering method.

Next, the substrate was immersed in acetone and 2-propanol in that order, was cleaned by ultrasonic waves, and was subjected to an oxygen plasma treatment and an argon plasma treatment. These plasma treatments were performed with 100 W of plasma power, gas flow of 20 sccm, and 5 seconds of treatment time while the substrate was kept warm at 70 to 90° C.

<2> Next, on the ITO electrode, the amine-based hole transporting material (tetrakis-p-biphenylylbenzidine) was deposited using a vacuum deposition method and a hole transport layer with an average thickness of 50 nm was formed.

<3> Next, on the hole transport layer, a component material for an infrared light emitting layer was deposited using a vacuum deposition method, and the infrared light emitting layer with an average thickness of 25 nm was formed. As the component material for the infrared light emitting layer, the compound expressed by the Formula D-2 was used as a light emitting material (guest material) and the compound expressed by the Formula H1-2 (tetracene-based material) was used as a host material. Also, the content of the light emitting material (dopant) in the infrared light emitting layer (doping concentration) was 4.0 wt %.

<4> Next, on the infrared light emitting layer, 2,9-dimethyl-4,7-diphenyl-1,10-phenanthroline (BCP) was formed as a film using a vacuum deposition method, and an electron transport layer with an average thickness of 80 nm was formed.

<5> Next, on the electron transport layer, lithium fluoride (LiF) was formed as a film using a vacuum deposition method, and an electron injection layer with an average thickness of 1 nm was formed.

<6> Next, on the electron injection layer, Al was formed as a film using a vacuum deposition method. A cathode consisting of Al with an average thickness of 100 nm was formed from this process.

<7> Next, a protecting cover (sealing member) made of glass was used for covering so as to cover each layer formed, and epoxy resin was used for fixing and sealing. From these processes, a light emitting element was prepared.

Reference Example 2

The light emitting element was prepared in the same manner as that of Reference Example 1 described above, except that the compound expressed by the Formula D-8 was used instead of the compound expressed by the Formula D-2 as the light emitting material of the infrared light material emitting layer in the process <3> of the Reference Example 1.

4. Evaluation

For each of the examples and the reference examples, a constant current of 100 mA/cm$^2$ was flowing to the light emitting element using a constant current power (KEITHLEY 2400, manufactured by TOYO Technica Co., Ltd.) and the light emitting waveform at the time was measured using a waveform monitor ("S-2440" manufactured by Soma Optics, Ltd.)

Also, chromaticity of emission light (x, y) was measured using a colorimeter (CS-2000, manufactured by Konica Minolta Sensing Co., Ltd.) and light emitting power was measured using an optical power measuring device (optical power meter 8230, manufactured by ADC Corporation). Also, the voltage value (driving voltage) at the time was measured.

Figure 11:
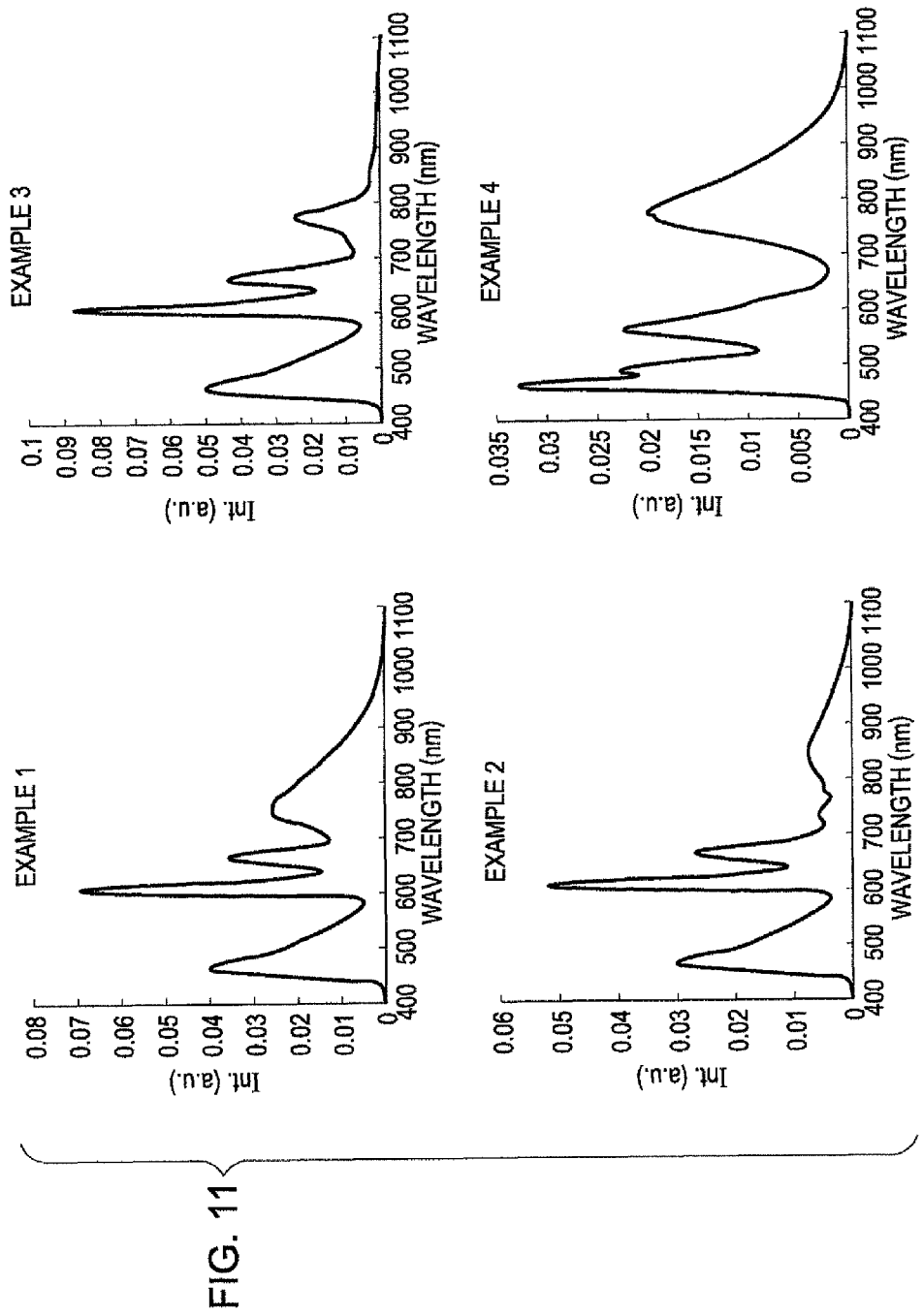
FIG. 11 are diagrams which show light emission spectra of a light emitting element in Examples 1 to 4.
Figure 12:
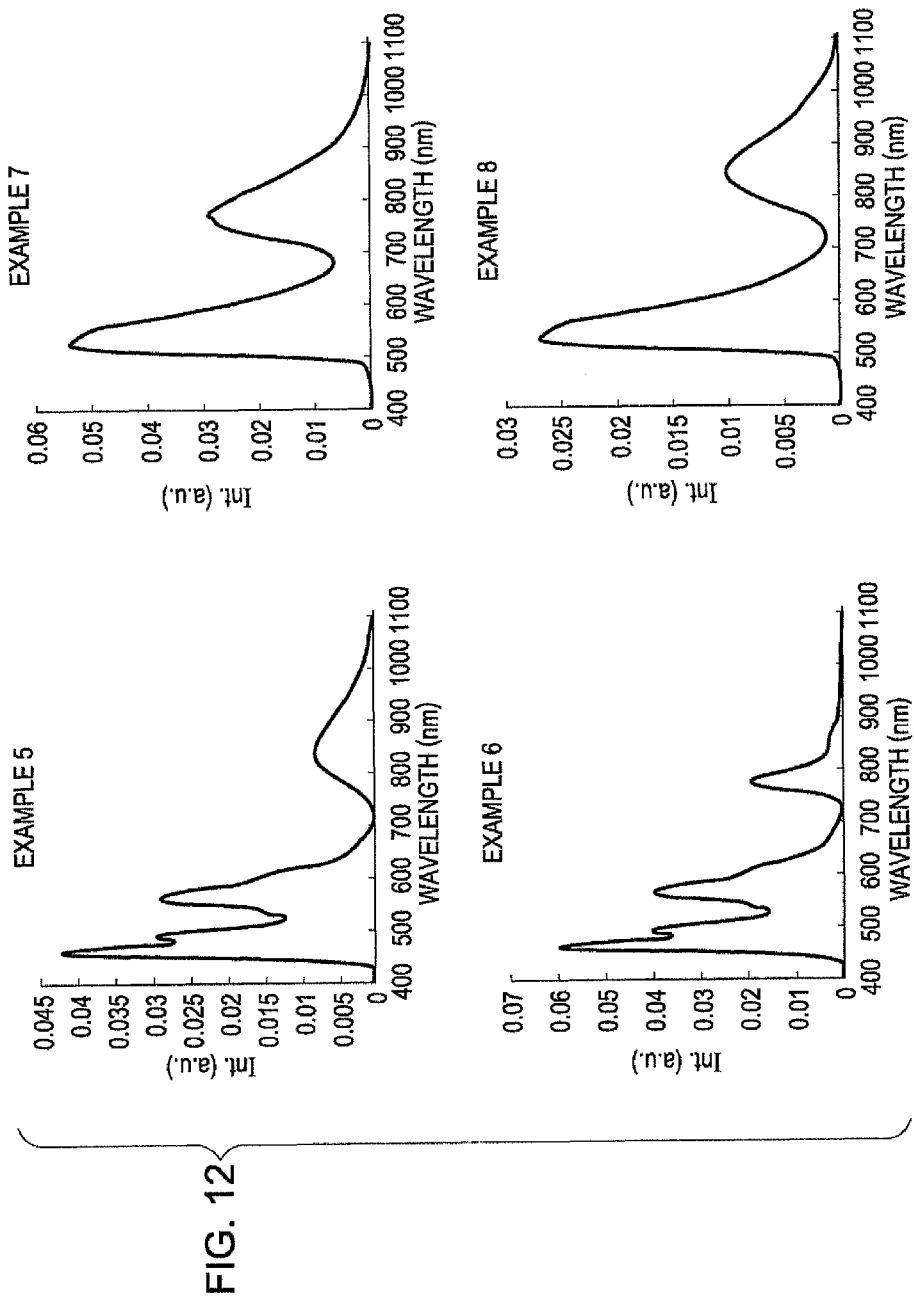
FIG. 12 are diagrams which show light emission spectra of a light emitting element in Examples 5 to 8.

These measurement results are shown in Table 1 and FIGS. 11 to 13.

TABLE 1

| | Chromaticity (CIE 1931) | | Light Emitting Power | Voltage |
|---|---|---|---|---|
| | x | y | [mW/cm$^2$] | [V] |
| Example 1 | 0.37 | 0.30 | 8.8 | 7.5 |
| Example 2 | 0.37 | 0.30 | 5.4 | 7.7 |
| Example 3 | 0.37 | 0.30 | 8.2 | 8.3 |
| Example 4 | 0.29 | 0.35 | 5.4 | 7.3 |
| Example 5 | 0.29 | 0.35 | 4.7 | 7.4 |
| Example 6 | 0.29 | 0.35 | 5.9 | 8.3 |
| Example 7 | 0.38 | 0.59 | 8.4 | 6.1 |
| Example 8 | 0.38 | 0.59 | 3.9 | 6.2 |
| Reference Example 1 | 0.30 | 0.25 | 5.2 | 4.8 |
| Reference Example 2 | 0.29 | 0.38 | 1.7 | 5.0 |

As is apparent from FIG. 11 to FIG. 13, it is possible for infrared light to be emitted in a near-infrared region along with visible light of a target color (wavelength) to be emitted in the light emitting elements of each example.

As is apparent from Table 1, the results in which the light emitting elements in Examples 1 to 6 emit white light as visible light and the light emitting elements in Examples 7 and 8 emit green light as visible light were obtained. Also, as is apparent from Table 1, it is possible for the light emitting elements in each example to gain high light emitting power. Also, the light emitting element in each example is confirmed to have an excellent light emitting efficiency from the fact that the light emitting element in each example may suppress the driving voltage.

The entire disclosure of Japanese Patent Application No. 2011-173659, filed Aug. 9, 2011 is expressly incorporated by reference herein.

What is claimed is:

1. A light emitting element comprising:
   an anode;
   a cathode; and
   a visible light emitting layer which emits visible light and an infrared light emitting layer which emits infrared light installed between the anode and the cathode,
   wherein the visible light emitting layer and the infrared light emitting layer are separate and distinct layers, and
   the infrared light emitting layer contains a thiadiazole-based compound as a light emitting material.

2. The light emitting element according to claim 1, wherein the thiadiazole-based compound is expressed by following Formula (1A);

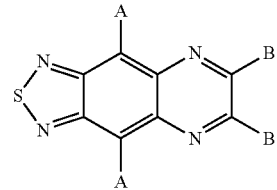

(1A)

wherein, in Formula (1A), A and B, each independently, represent a hydrogen atom, an alkyl group, an aryl group which may have a substituent, an arylamino group, or triarylamine.

3. The light emitting element according to claim 1, wherein the thiadiazole-based compound is expressed by following Formula (1B);

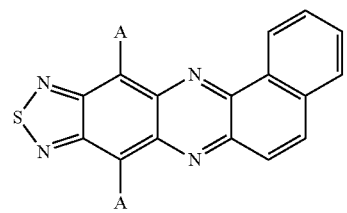

(1B)

wherein, in Formula (1B), As independently represent a hydrogen atom, an alkyl group, an aryl group which may have a substituent, an arylamino group, or triarylamine.

4. The light emitting element according to claim 1, wherein the thiadiazole-based compound is expressed by following Formula (1C);

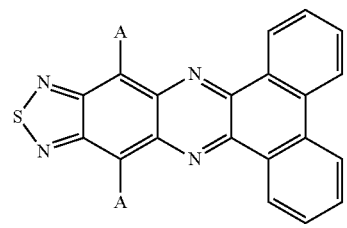

(1C)

wherein, in Formula (1C), As independently represent a hydrogen atom, an alkyl group, an aryl group which may have a substituent, an arylamino group, or triarylamine.

5. A light emitting element comprising:
   an anode;
   a cathode; and
   a visible light emitting layer which emits visible light and an infrared light emitting layer which emits infrared light installed between the anode and the cathode,
   wherein the visible light emitting layer and the infrared light emitting layer are separate and distinct layers, and
   the infrared light emitting layer contains platinum complex-based compound represented by following Formula (2) as the light emitting material;

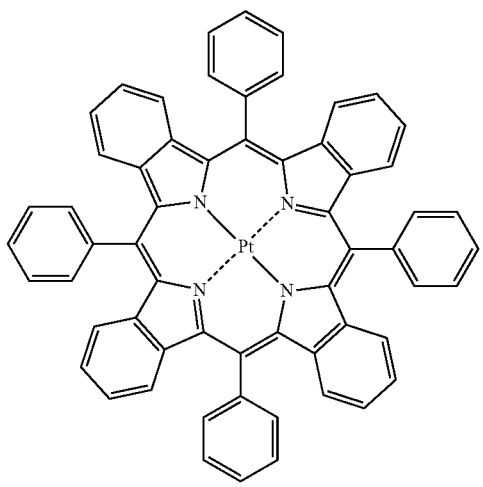

(2)

6. The light emitting element according to claim 1, wherein the infrared light emitting layer further contains a host material which supports the light emitting material.

7. The light emitting element according to claim 1, wherein white light is emitted as the visible light.
8. The light emitting element according to claim 1, wherein green light is emitted as the visible light.
9. A light emitting device comprising:
the light emitting element according to claim 1.
10. A light emitting device comprising:
the light emitting element according to claim 2.
11. A light emitting device comprising:
the light emitting element according to claim 3.
12. A light emitting device comprising:
the light emitting element according to claim 4.
13. A light emitting device comprising:
the light emitting element according to claim 5.
14. A light emitting device comprising:
the light emitting element according to claim 6.
15. A light emitting device comprising:
the light emitting element according to claim 7.
16. A light emitting device comprising:
the light emitting element according to claim 8.
17. An electronic device comprising:
the light emitting device according to claim 9.
18. An electronic device comprising:
the light emitting device according to claim 13.

* * * * *